(12) United States Patent
Hsia et al.

(10) Patent No.: US 12,701,720 B2
(45) Date of Patent: Aug. 4, 2026

(54) OPTICAL DEVICE AND METHOD OF MANUFACTURE

(71) Applicant: Taiwan Semiconductor Manufacturing Co., Ltd., Hsinchu (TW)

(72) Inventors: Hsing-Kuo Hsia, Jhubei City (TW); Chen-Hua Yu, Hsinchu (TW); Jui Lin Chao, New Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 428 days.

(21) Appl. No.: 18/191,213

(22) Filed: Mar. 28, 2023

(65) Prior Publication Data

US 2024/0107781 A1 Mar. 28, 2024

Related U.S. Application Data

(60) Provisional application No. 63/377,235, filed on Sep. 27, 2022.

(51) Int. Cl.
| | |
|---|---|
| *H01L 23/48* | (2006.01) |
| *H01S 5/02315* | (2021.01) |
| *H01S 5/0232* | (2021.01) |
| *H01S 5/02345* | (2021.01) |
| *H01S 5/028* | (2006.01) |
| *H10B 80/00* | (2023.01) |
| *H10W 20/20* | (2026.01) |
| *H10W 90/00* | (2026.01) |

(52) U.S. Cl.
CPC ......... *H10B 80/00* (2023.02); *H01S 5/02315* (2021.01); *H01S 5/0232* (2021.01); *H01S 5/02345* (2021.01); *H01S 5/028* (2013.01); *H10W 20/20* (2026.01); *H10W 90/754* (2026.01)

(58) Field of Classification Search
CPC ... H10B 80/00; H01S 5/0232; H01S 5/02315; H01S 5/02345; H01S 5/028; H01L 23/481; H01L 24/48
See application file for complete search history.

(56) References Cited

U.S. PATENT DOCUMENTS

| | | | |
|---|---|---|---|
| 11,215,753 B2 | 1/2022 | Islam et al. | |
| 2018/0143374 A1 | 5/2018 | Coolbaugh et al. | |
| 2019/0378871 A1 | 12/2019 | Takahashi et al. | |
| 2020/0166720 A1 | 5/2020 | Charles et al. | |
| 2021/0116637 A1 | 4/2021 | Li et al. | |
| 2021/0364694 A1* | 11/2021 | Hickey | G02B 6/12 |
| 2022/0085571 A1* | 3/2022 | Chen | H01S 5/02208 |
| 2022/0187536 A1 | 6/2022 | Sharma et al. | |

FOREIGN PATENT DOCUMENTS

| | | |
|---|---|---|
| DE | 102020107271 A1 | 9/2021 |
| KR | 20210110132 A | 9/2021 |

\* cited by examiner

*Primary Examiner* — Walter H Swanson
(74) *Attorney, Agent, or Firm* — Slater Matsil, LLP

(57) ABSTRACT

Optical devices and methods of manufacture are presented in which an opening is formed within a first semiconductor device and then bonded to other optical devices. A laser die or other fill material may be used to refill the opening. The first semiconductor device is then electrically connected to an optical interposer.

20 Claims, 48 Drawing Sheets

OPTICAL DEVICE AND METHOD OF MANUFACTURE

PRIORITY CLAIM AND CROSS-REFERENCE

This application claims the benefit of U.S. Provisional Application No. 63/377,235, filed on Sep. 27, 2022, which application is hereby incorporated herein by reference.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating long-range optical components and short-range electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
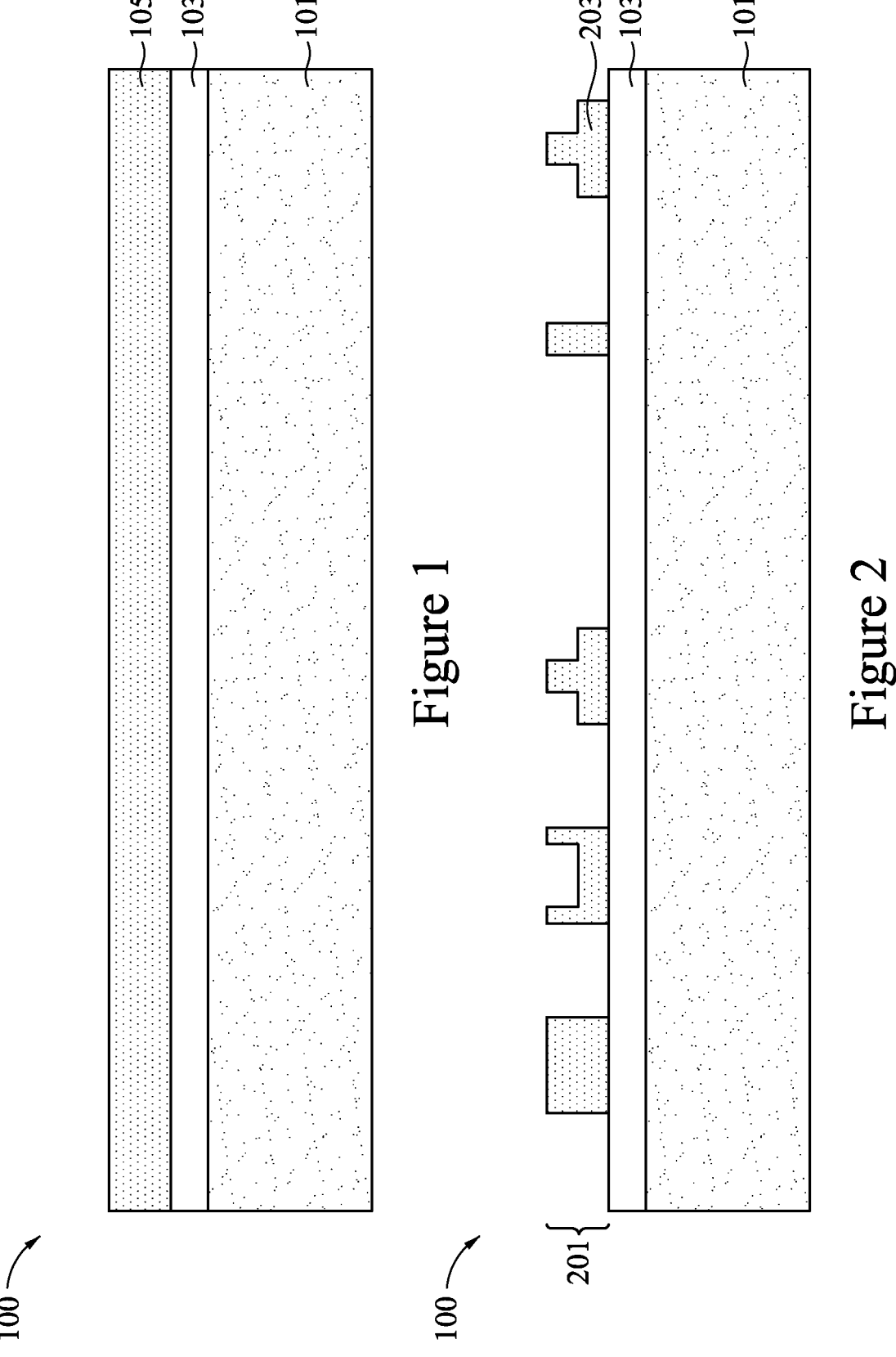
FIGS. 1-5 illustrate formation of an optical interposer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be discussed with respect to certain embodiments in which one or more laser dies are embedded within a first semiconductor device to form a compact universal photonic engine (COUPE) and the first semiconductor device is bonded to an optical interposer while still in wafer form. However, the embodiments presented herein are intended to be illustrative and are not intended to limit the embodiments to the precise descriptions as discussed. Rather, the embodiments discussed may be incorporated into a wide variety of implementations, and all such implementations are fully intended to be included within the scope of the embodiments.

With reference now to FIG. 1, there is illustrated an initial structure of an optical interposer 100 (seen in FIG. 5), in accordance with some embodiments. In the particular embodiment illustrated in FIG. 1, the optical interposer 100 is a photonic integrated circuit (PIC) and comprises at this stage a first substrate 101, a first insulator layer 103, and a layer of material 105 for the first optical components 203 of the first active layer 201 (not separately illustrated in FIG. 1 but illustrated and discussed further below with respect to FIG. 2). In an embodiment, at a beginning of the manufacturing process of the optical interposer 100, the first substrate 101, the first insulator layer 103, and the layer of material 105 for the first optical components 203 of the first active layer 201 may collectively be part of a silicon-on-insulator (SOI) substrate. Looking first at the first substrate 101, the first substrate 101 may be a semiconductor material such as silicon or germanium, a dielectric material such as glass, or any other suitable material that allows for structural support of overlying devices.

The first insulator layer 103 may be a dielectric layer that separates the first substrate 101 from the overlying first active layer 201 and can additionally, in some embodiments, serve as a portion of cladding material that surrounds the subsequently manufactured first optical components 203 (discussed further below). In an embodiment the first insulator layer 103 may be silicon oxide, silicon nitride, germanium oxide, germanium nitride, combinations of these, or the like, formed using a method such as implantation (e.g., to form a buried oxide (BOX) layer) or else may be deposited onto the first substrate 101 using a deposition method such as chemical vapor deposition, atomic layer deposition, physical vapor deposition, combinations of these, or the like. However, any suitable material and method of manufacture may be used.

The material 105 for the first active layer 201 is initially (prior to patterning) a conformal layer of material that will be used to begin manufacturing the first optical components 203 of the first active layer 201. In an embodiment the material 105 for the first active layer 201 may be a translucent material that can be used as a core material for the desired first optical components 203, such as a semiconductor material such as silicon, germanium, silicon germanium, combinations of these, or the like, while in other embodiments the material 105 for the first active layer 201 may be a dielectric material such as silicon nitride or the like, although in other embodiments the material 105 for the first active layer 201 may be III-V materials, lithium niobate materials, or polymers. In embodiments in which the material 105 of the first active layer 201 is deposited, the material 105 for the first active layer 201 may be deposited using a method such as epitaxial growth, chemical vapor deposition, atomic layer deposition, physical vapor deposition, combinations of these, or the like. In other embodiments in which the first insulator layer 103 is formed using an implantation method, the material 105 of the first active layer 201 may initially be part of the first substrate 101 prior to the implantation process to form the first insulator layer 103. However, any suitable materials and methods of manufacture may be utilized to form the material 105 of the first active layer 201.

FIG. 2 illustrates that, once the material 105 for the first active layer 201 is ready, the first optical components 203 for the first active layer 201 are manufactured using the material 105 for the first active layer 201. In embodiments the first optical components 203 of the first active layer 201 may include such components as optical waveguides (e.g., ridge waveguides, rib waveguides, buried channel waveguides, diffused waveguides, etc.), couplers (e.g., grating couplers, edge couplers, etc.), directional couplers, optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable first optical components 203 may be used.

To begin forming the first optical components 203 of the first active layer 201 from the initial material 105, the material 105 for the first active layer 201 may be patterned into the desired shapes for the first optical components 203 of the first active layer 201. In an embodiment the material 105 for the first active layer 201 may be patterned using, e.g., one or more photolithographic masking and etching processes. However, any suitable method of patterning the material 105 for the first active layer 201 may be utilized. For some of the first optical components 203, such as waveguides or edge couplers, the patterning process may be all or at least most of the manufacturing that is used to form these first optical components 203.

Figures 3, 4:
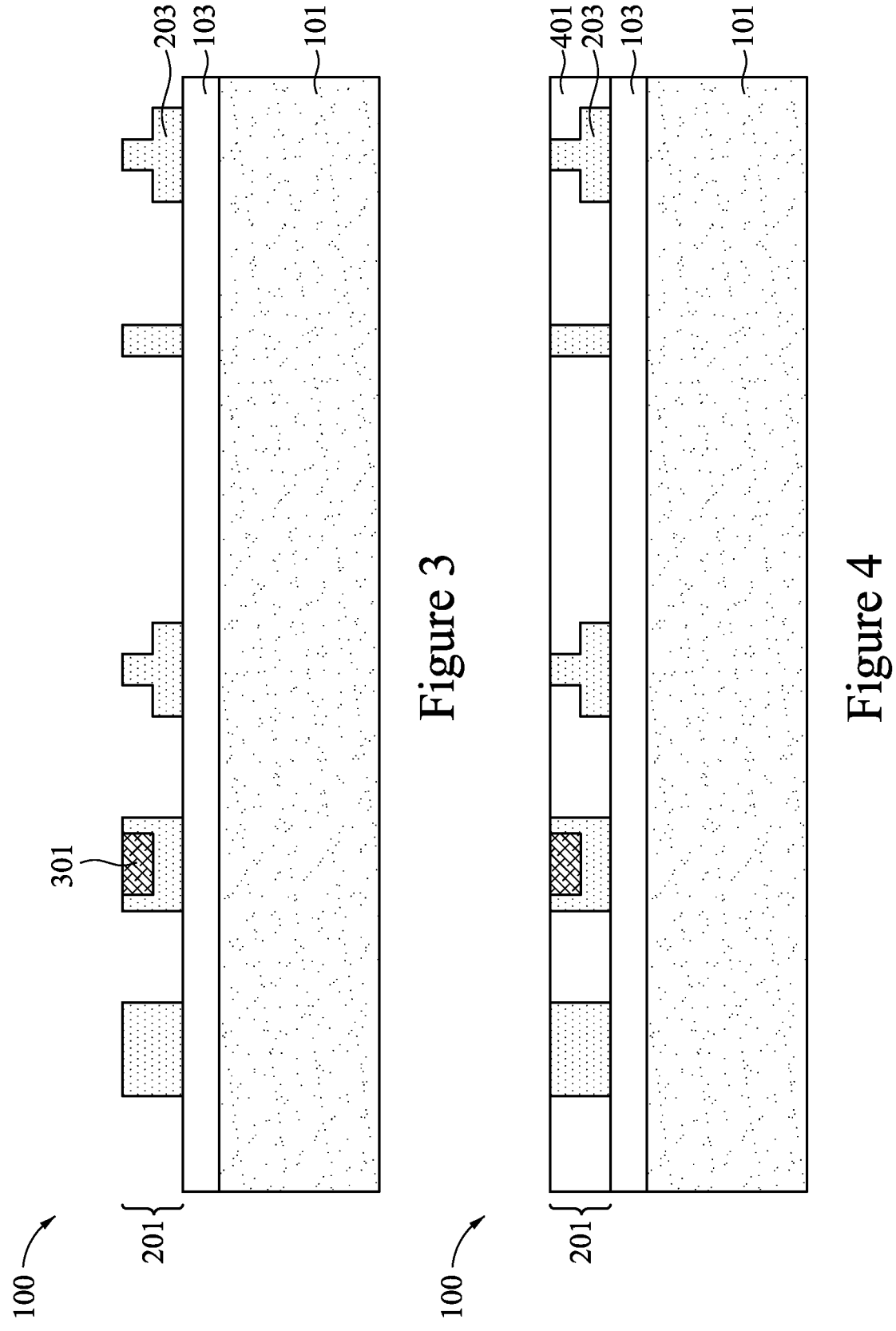

FIG. 3 illustrates that, for those components that utilize further manufacturing processes, such as Mach-Zehnder silicon-photonic switches that utilize resistive heating elements, additional processing may be performed either before or after the patterning of the material for the first active layer 201. For example, implantation processes, additional deposition and patterning processes for different materials (e.g., resistive heating elements, III-V materials for converters), combinations of all of these processes, or the like, can be utilized to help further the manufacturing of the various desired first optical components 203. In a particular embodiment, and as specifically illustrated in FIG. 3, in some embodiments an epitaxial deposition of a semiconductor material 301 such as germanium (used, e.g., for electricity/optics signal modulation and transversion) may be performed on a patterned portion of the material 105 of the first active layer 201. In such an embodiment the semiconductor material 301 may be epitaxially grown in order to help manufacture, e.g., a photodiode for an optical-to-electrical converter. All such manufacturing processes and all suitable first optical components 203 may be manufactured, and all such combinations are fully intended to be included within the scope of the embodiments.

FIG. 4 illustrates that, once the individual first optical components 203 of the first active layer 201 have been formed, a second insulator layer 401 may be deposited to cover the first optical components 203 and provide additional cladding material. In an embodiment the second insulator layer 401 may be a dielectric layer that separates the individual components of the first active layer 201 from each other and from the overlying structures and can additionally serve as another portion of cladding material that surrounds the first optical components 203. In an embodiment the second insulator layer 401 may be silicon oxide, silicon nitride, germanium oxide, germanium nitride, combinations of these, or the like, formed using a deposition method such as chemical vapor deposition, atomic layer deposition, physical vapor deposition, combinations of these, or the like. Once the material of the second insulator layer 401 has been deposited, the material may be planarized using, e.g., a chemical mechanical polishing process in order to either planarize a top surface of the second insulating layer 401 (in embodiments in which the second insulator layer 401 is intended to fully cover the first optical components 203) or else planarize the second insulating layer 401 with top surfaces of the first optical components 203. However, any suitable material and method of manufacture may be used.

Figure 5:
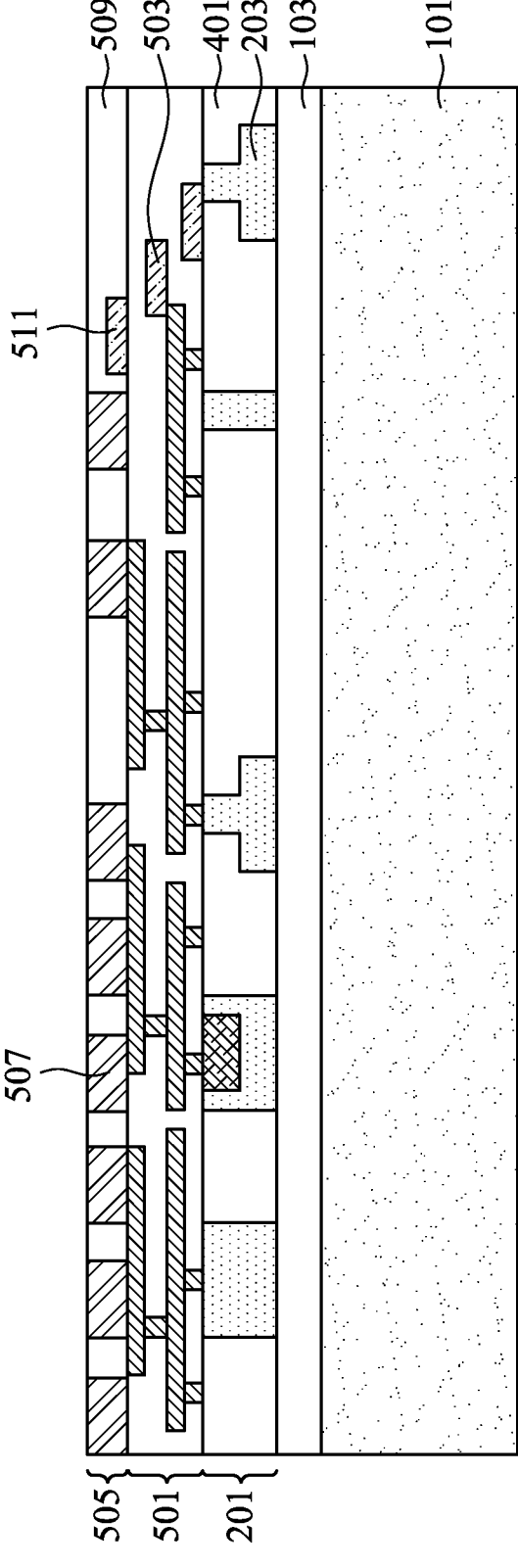

FIG. 5 illustrates that, once the first optical components 203 of the first active layer 201 have been manufactured and the second insulator layer 401 has been formed, first metallization layers 501 are formed in order to electrically connect the first optical components 203 of the first active layer 201 to control circuitry, to each other, and to subsequently attached devices (not illustrated in FIG. 5 but illustrated and described further below with respect to FIG. 8). In an embodiment the first metallization layers 501 are formed of alternating layers of dielectric and conductive material and may be formed through any suitable processes (such as deposition, damascene, dual damascene, etc.). In particular embodiments there may be multiple layers of metallization used to interconnect the various first optical components 203, but the precise number of first metallization layers 501 is dependent upon the design of the optical interposer 100.

Additionally, during the manufacture of the first metallization layers 501, one or more second optical components 503 may be formed as part of the first metallization layers 501. In some embodiments the second optical components 503 of the first metallization layers 501 may include such components as couplers (e.g., edge couplers, grating couplers, etc.) for connection to outside signals, optical waveguides (e.g., ridge waveguides, rib waveguides, buried channel waveguides, diffused waveguides, etc.), optical modulators (e.g., Mach-Zehnder silicon-photonic switches, microelectromechanical switches, micro-ring resonators, etc.), amplifiers, multiplexors, demultiplexors, optical-to-electrical converters (e.g., P-N junctions), electrical-to-optical converters, lasers, combinations of these, or the like. However, any suitable optical components may be used for the one or more second optical components 503.

In an embodiment the one or more second optical components 503 may be formed by initially depositing a material for the one or more second optical components 503. In an embodiment the material for the one or more second optical components 503 may be a dielectric material such as silicon nitride, silicon oxide, combinations of these, or the like, or a semiconductor material such as silicon, deposited using a deposition method such as chemical vapor deposition, atomic layer deposition, physical vapor deposition, combinations of these, or the like. However, any suitable material and any suitable method of deposition may be utilized.

Once the material for the one or more second optical components 503 has been deposited or otherwise formed, the material may be patterned into the desired shapes for the one or more second optical components 503. In an embodiment the material of the one or more second optical components 503 may be patterned using, e.g., one or more photolithographic masking and etching processes. However, any suitable method of patterning the material for the one or more second optical components 503 may be utilized.

For some of the one or more second optical components 503, such as waveguides or edge couplers, the patterning process may be all or at least most manufacturing that is used to form these components. Additionally, for those components that utilize further manufacturing processes, such as Mach-Zehnder silicon-photonic switches that utilize resistive heating elements, additional processing may be performed either before or after the patterning of the material for the one or more second optical components 503. For example, implantation processes, additional deposition and patterning processes for different materials, combinations of all of these processes, or the like, and can be utilized to help further the manufacturing of the various desired one or more second optical components 503. All such manufacturing processes and all suitable second optical components 503 may be manufactured, and all such combinations are fully intended to be included within the scope of the embodiments.

Once the one or more second optical components 503 of the first metallization layers 501 have been manufactured, a first bonding layer 505 is formed over the first metallization layers 501. In an embodiment, the first bonding layer 505 may be used for a dielectric-to-dielectric and metal-to-metal bond. In accordance with some embodiments, the first bonding layer 505 is formed of a first dielectric material 509 such as silicon oxide, silicon nitride, or the like. The first dielectric material 509 may be deposited using any suitable method, such as CVD, high-density plasma chemical vapor deposition (HDPCVD), PVD, atomic layer deposition (ALD), or the like. However, any suitable materials and deposition processes may be utilized.

Once the first dielectric material 509 has been formed, first openings in the first dielectric material 509 are formed to expose conductive portions of the underlying layers in preparation to form first bond pads 507 within the first bonding layer 505. Once the first openings have been formed within the first dielectric material 509, the first openings may be filled with a seed layer and a plated metal to form the first bond pads 507 within the first dielectric material 509. The seed layer may be blanket deposited over top surfaces of the first dielectric material 509 and the exposed conductive portions of the underlying layers and sidewalls of the first openings. The seed layer may comprise a copper layer. The seed layer may be deposited using processes such as sputtering, evaporation, or plasma-enhanced chemical vapor deposition (PECVD), or the like, depending upon the desired materials. The plated metal may be deposited over the seed layer through a plating process such as electrical or electro-less plating. The plated metal may comprise copper, a copper alloy, or the like. The plated metal may be a fill material. A barrier layer (not separately illustrated) may be blanket deposited over top surfaces of the first dielectric material 509 and sidewalls of the openings and the second openings before the seed layer. The barrier layer may comprise titanium, titanium nitride, tantalum, tantalum nitride, or the like.

Following the filling of the first openings, a planarization process, such as a CMP, is performed to remove excess portions of the seed layer and the plated metal, forming the first bond pads 507 within the first bonding layer 505. In some embodiments a bond pad via (not separately illustrated) may also be utilized to connect the first bond pads 507 with underlying conductive portions and, through the underlying conductive portions, connect the first bond pads 507 with the first metallization layers 501.

Additionally, the first bonding layer 505 may also include one or more third optical components 511 incorporated within the first bonding layer 505 in order to bridge incoming light (e.g., from the laser die 600, described further below). In such an embodiment, prior to the deposition of the first dielectric material 509, the one or more third optical components 511 may be manufactured using similar methods and similar materials as the one or more second optical components 503 (described above), such as by being waveguides and other structures formed at least in part through a deposition and patterning process. However, any suitable structures, materials and any suitable methods of manufacture may be utilized.

Figure 6A:
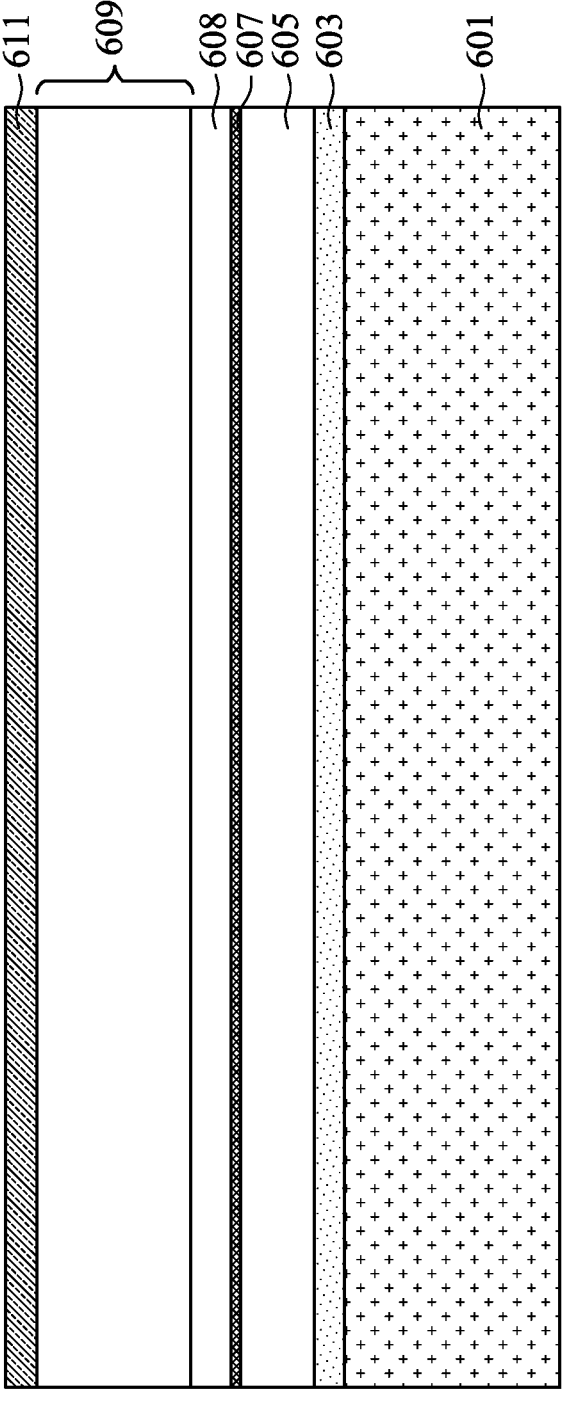
FIGS. 6A-6P illustrate formation of a laser die, in accordance with some embodiments.
Figure 6B:
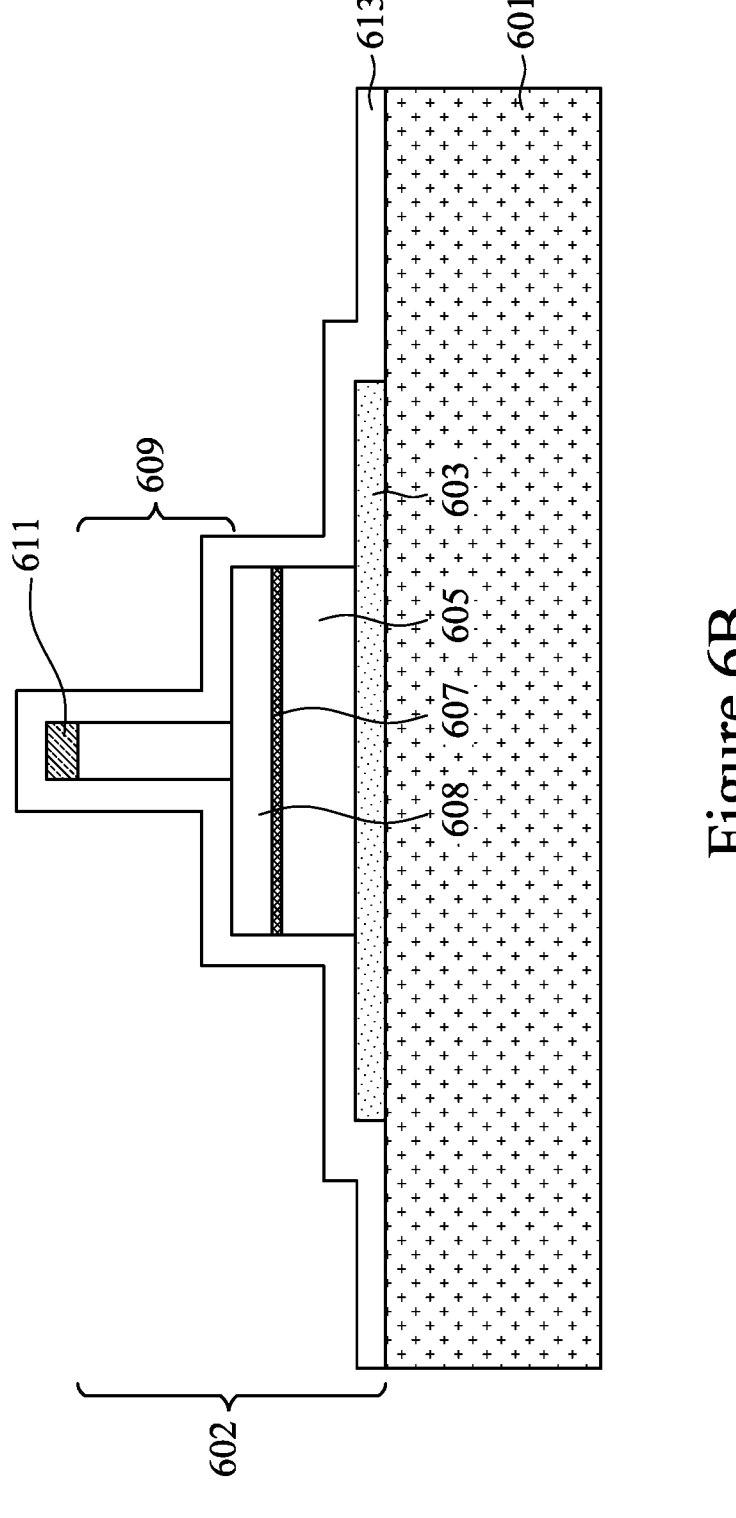
Figure 6C:
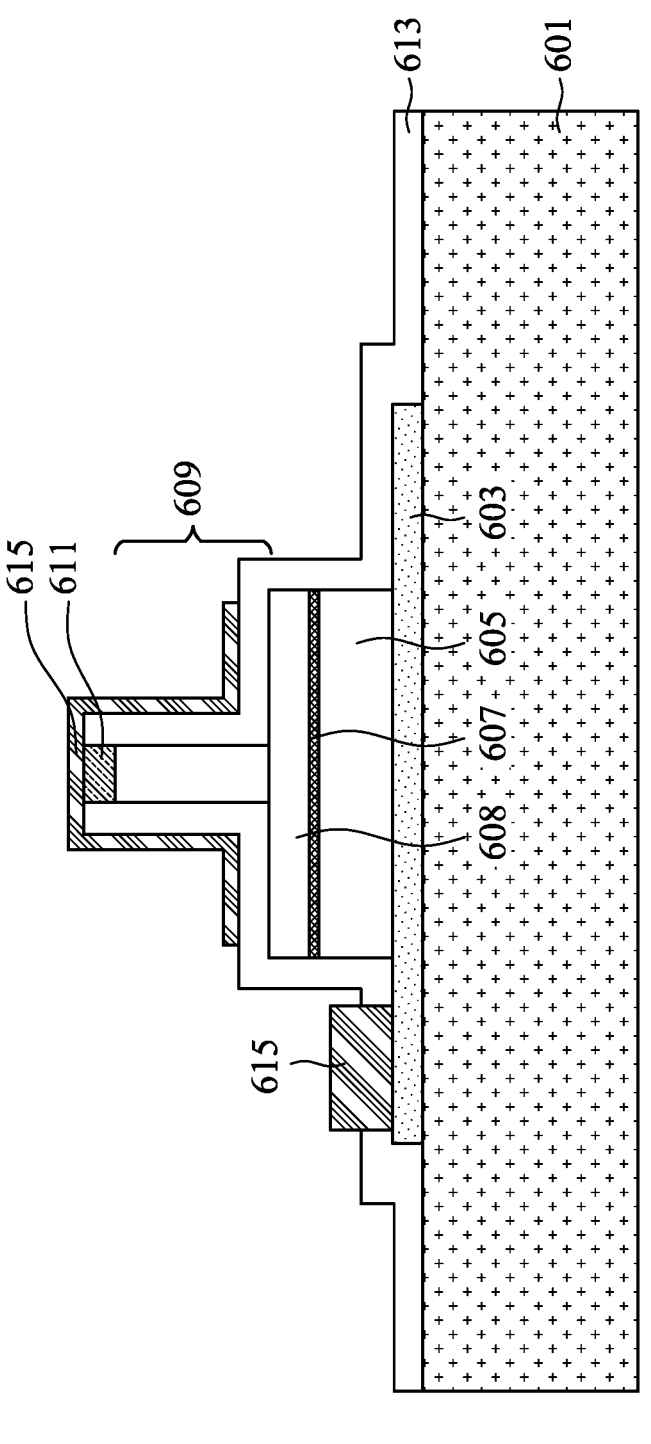
Figure 6D:
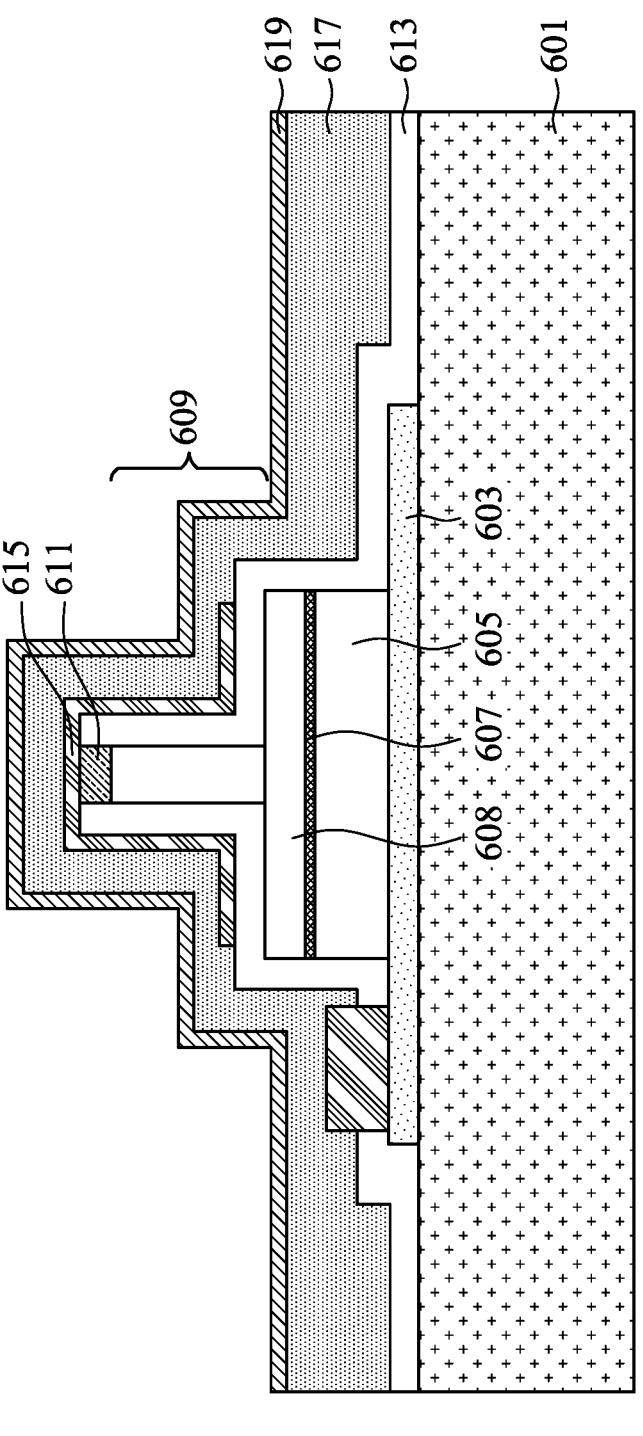
Figure 6E:
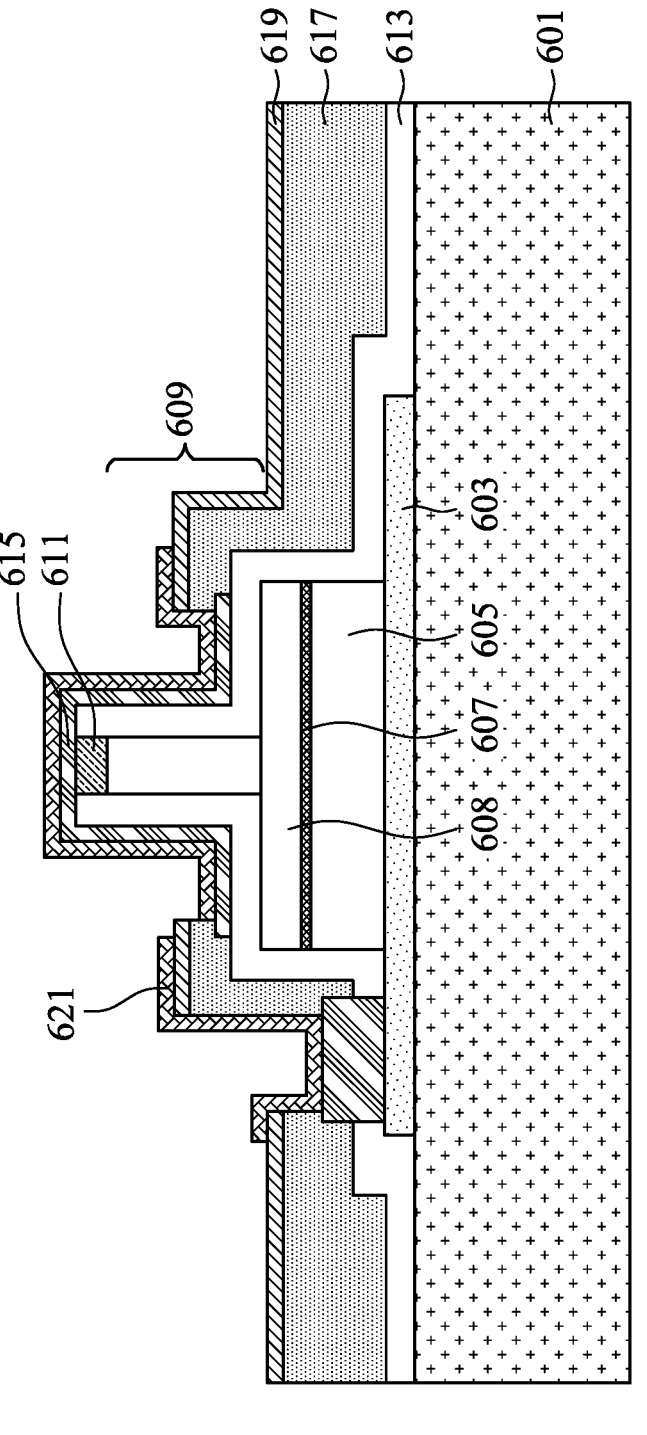
Figure 6F:
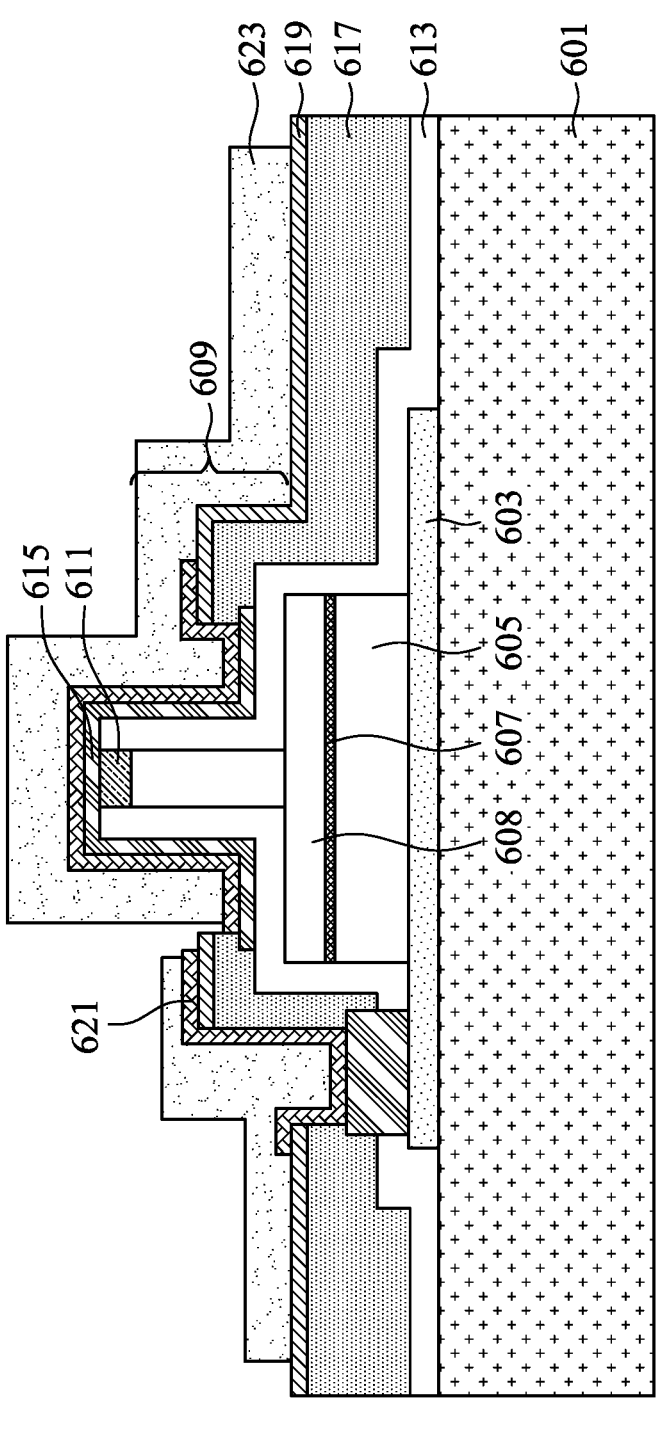
Figure 6G:
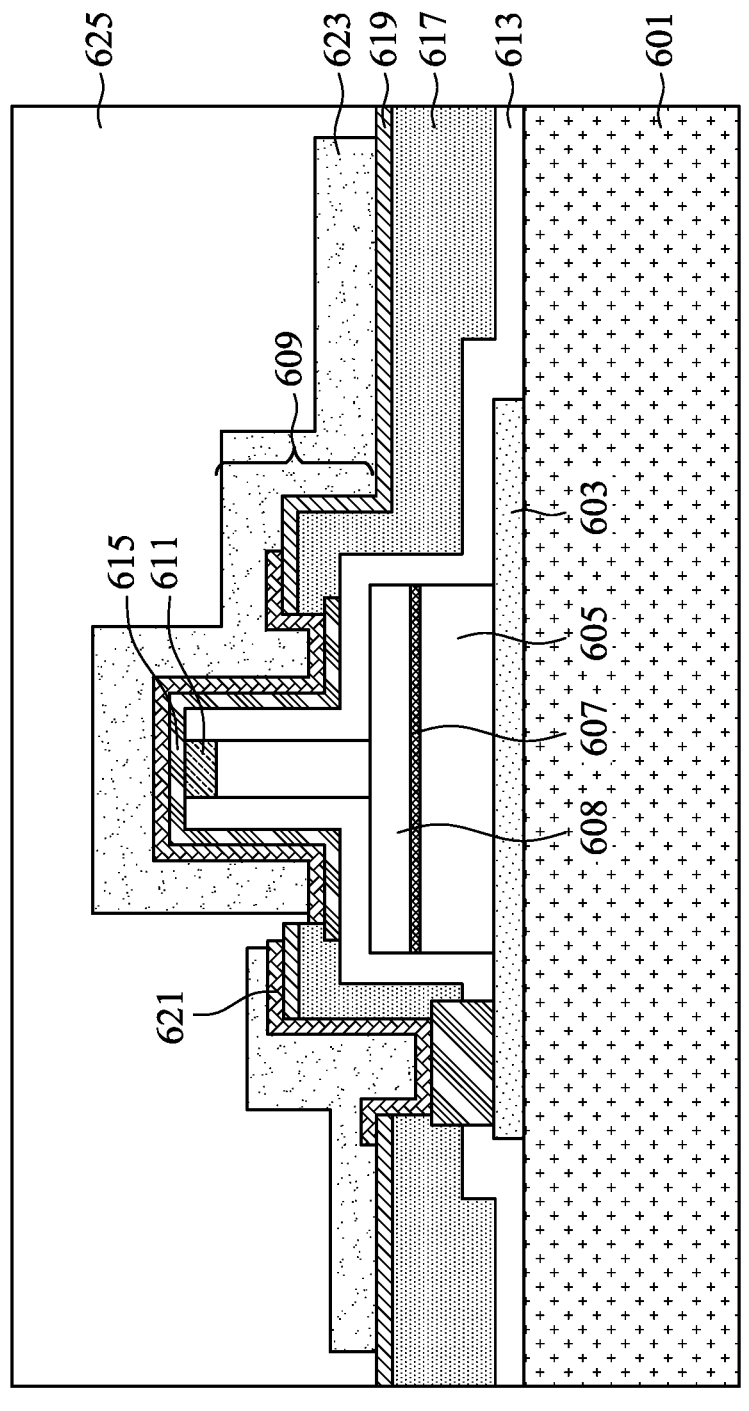
Figures 6H, 6I:
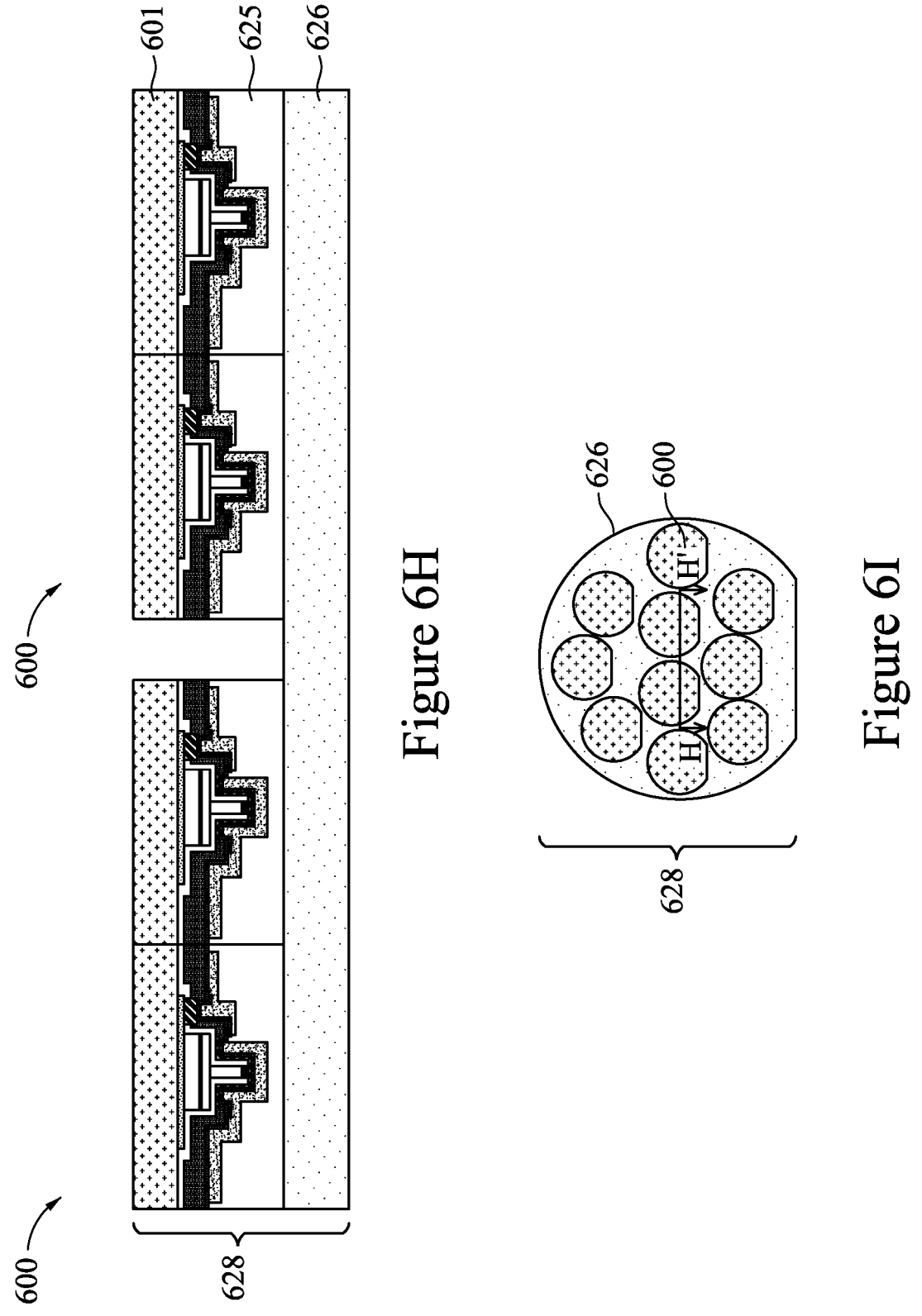
Figures 6J, 6K:
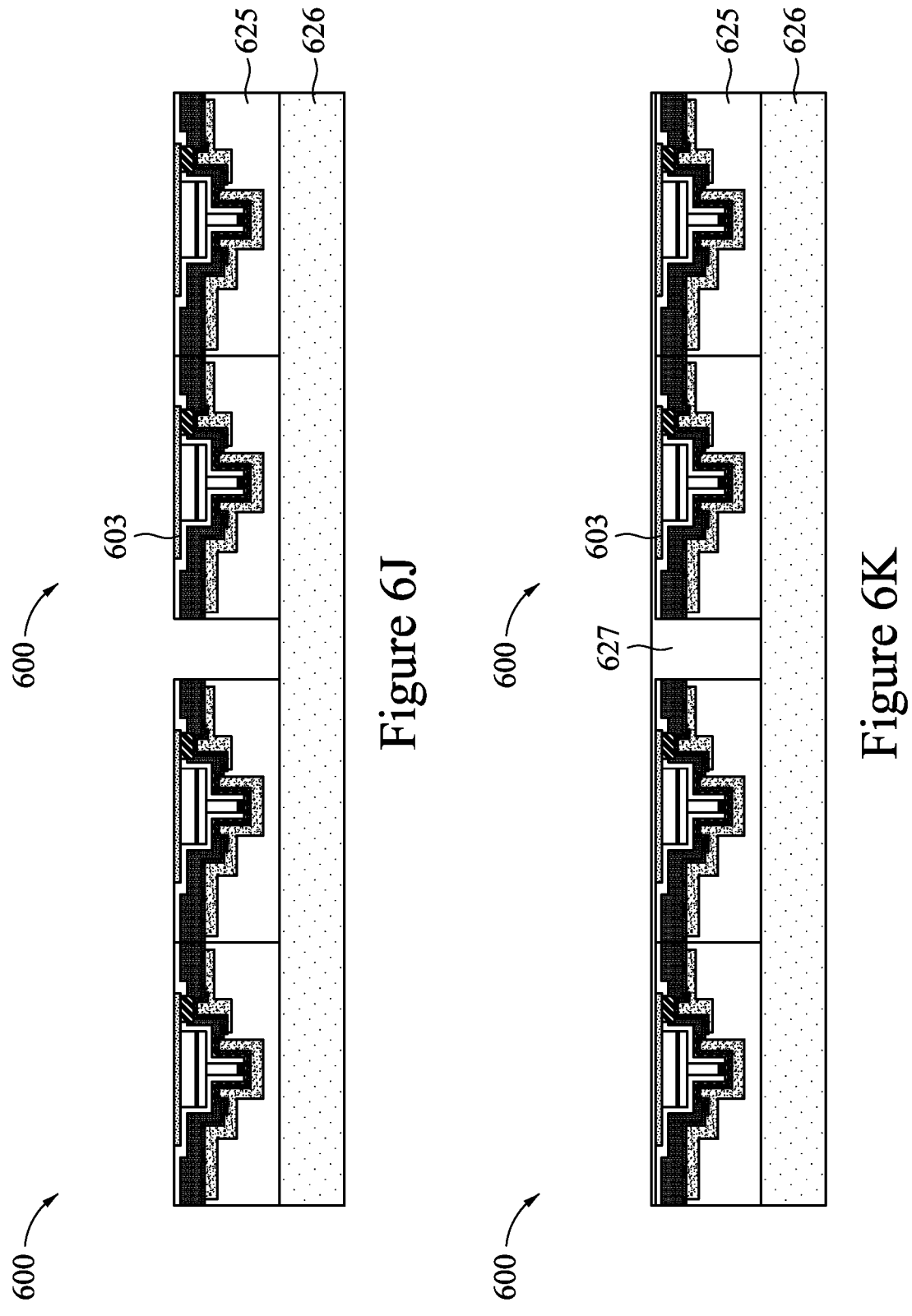
Figures 6L, 6M:
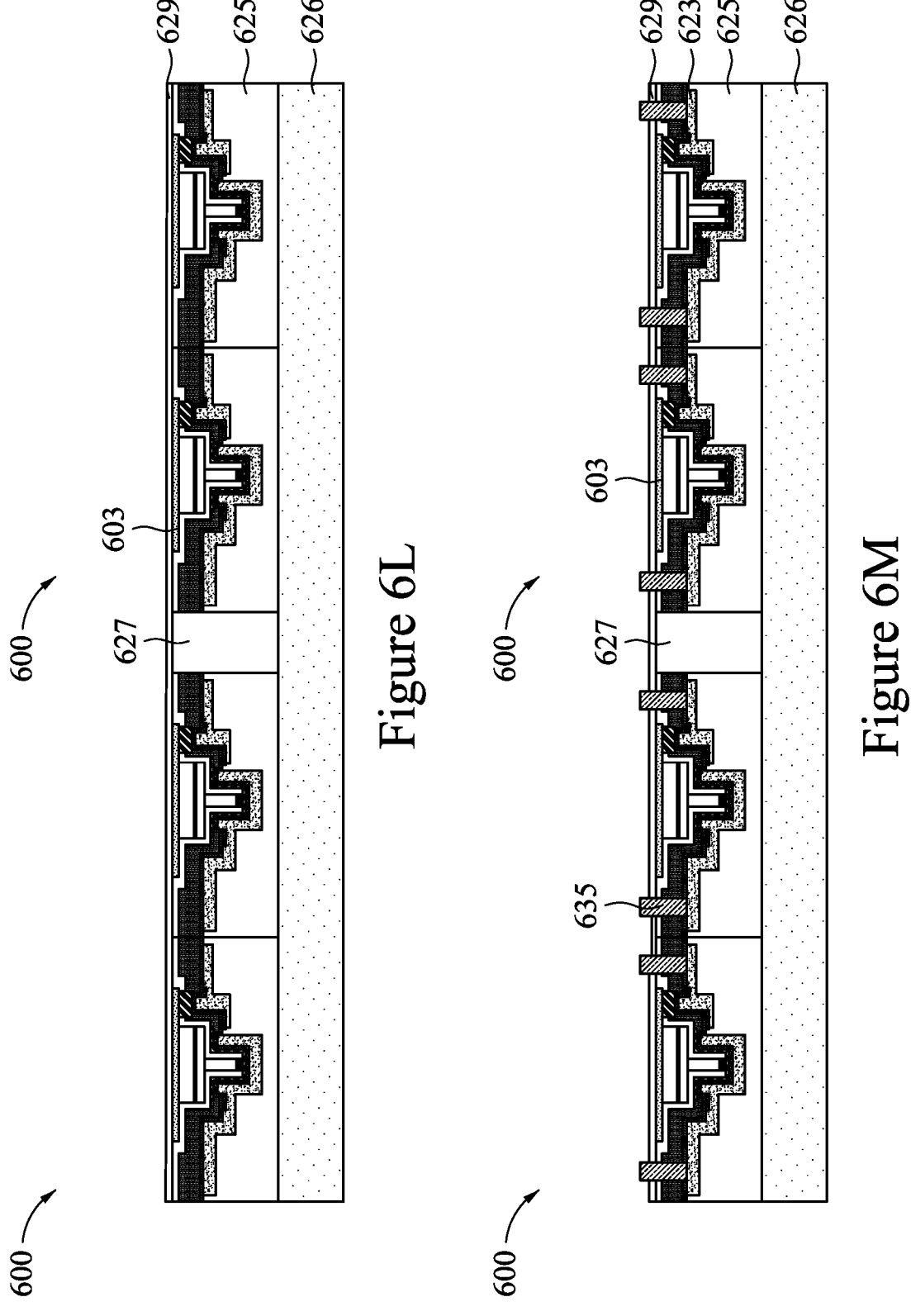
Figures 6N, 6O:
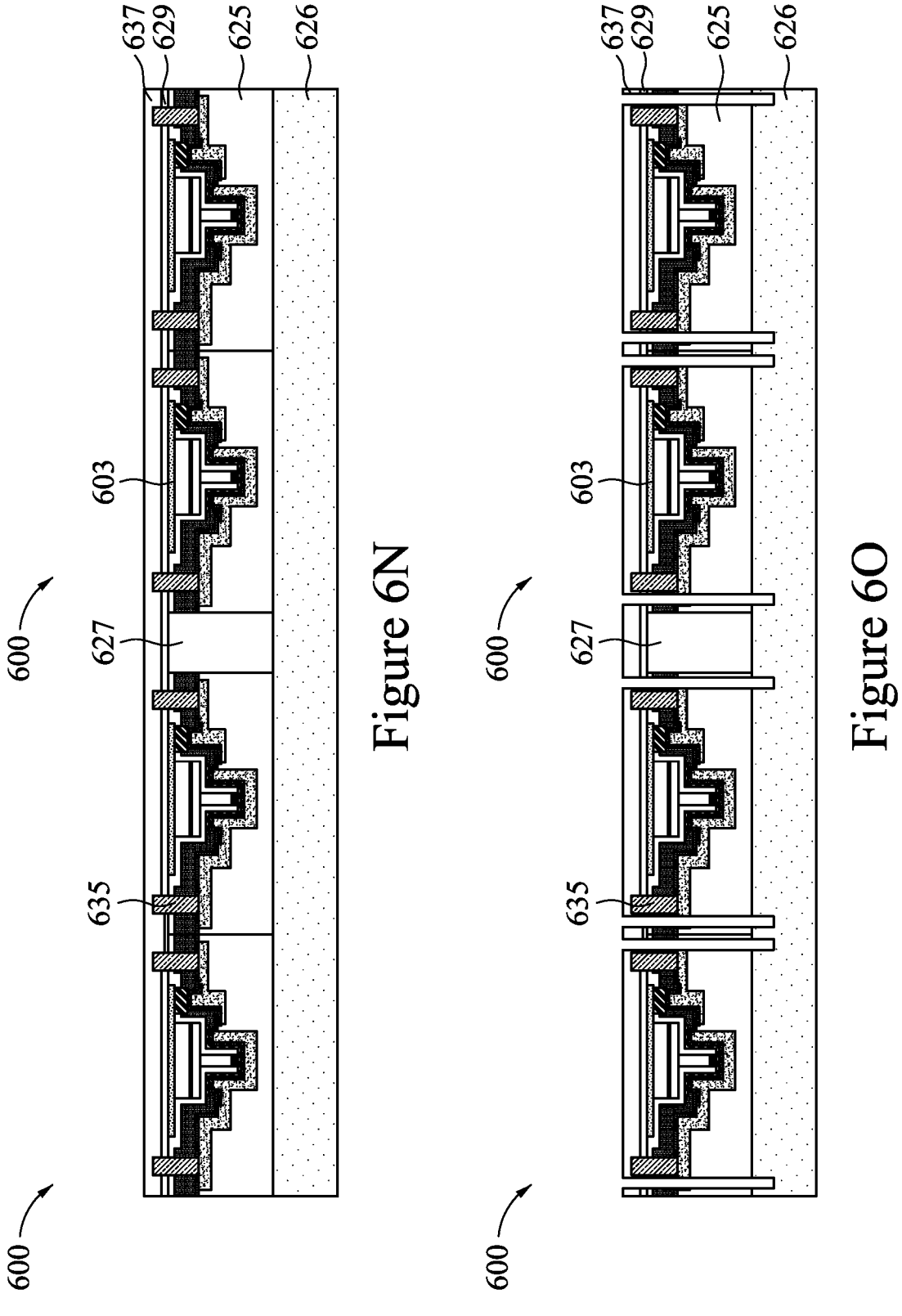
Figure 6P:
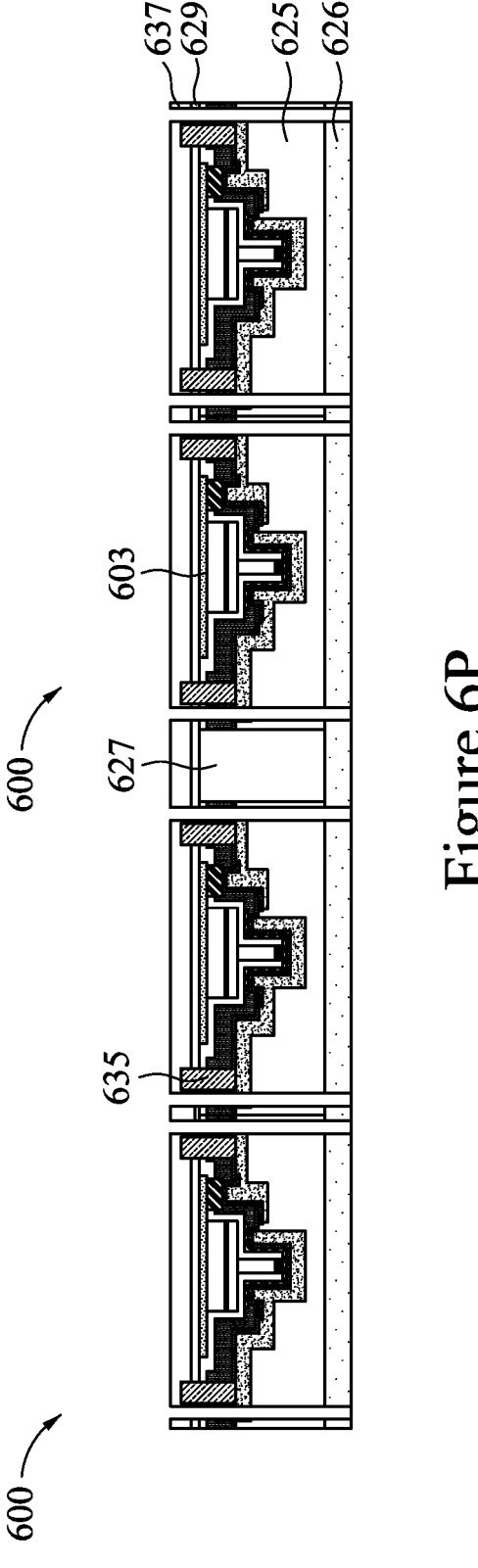

FIGS. 6A-6P illustrate a manufacturing process for formation of a laser die 600 that will be connected to the optical interposer 100. The laser die 600 is utilized to generate light in order to power the other optical components (e.g., the first optical components 203, the second optical components 503, the third optical components 511, etc.), and may comprise light generating structures such as a laser diode 602 (not separately illustrated in FIG. 6A, but illustrated and discussed further below with respect to FIG. 6B). In particular embodiments the laser diode 602 may be a Fabry-Perot Diode, and may be based on III-V materials, II-VI materials, or any other suitable set of materials.

In an embodiment the formation of the laser die 600 may be initiated by forming a first contact 603, a first buffer layer 605, a first active diode layer 607 comprising multiple quantum wells (MQWs), a second buffer layer 608, a ridge material 609, and a second contact 611 over a second substrate 601. In an embodiment the second substrate 601 may be a material that can be used not only for structural support but also may be used as a seed material for epitaxially growing overlying materials and may be, for example, a 2-inch or 4-inch wafer of material. In particular embodiments in which the laser die 600 utilizes III-V materials to form the desired lasers, the second substrate 601 may be a material such as InP, GaAs, or GaSb, while in embodiments in which the laser die 600 utilizes II-VI materials to form the desired lasers, the second substrate 601 may be a material such as GaAs, CdTe, ZnSe. In still further embodiments, the second substrate 601 may be a sapphire or a semiconductor material. All suitable materials may be utilized.

The first contact 603 is formed over the second substrate 601. The first contact 603 forms one part of the laser diode 602 used to emit the desired laser. In an embodiment in which the laser die 600 utilizes III-V compounds, the first contact 603 is a compound such as InP, GaN, InN, AlN, AlxGa(1-x)N, AlxIn(1-x)N, AlxInyGa(1-x-y)N, combinations thereof, or the like. Additionally, in embodiments in which the laser die 600 utilizes II-VI compounds, the first contact 603 may still use a III-V material such as GaAs, InP, GaSb, combinations of these, or the like.

Additionally, in order to help form the laser diode 602 (e.g., the n-p diode) to generate the desired laser, the first contact 603 may be doped with a dopant. In embodiments in which the first contact 603 is desired to have an n-type conductivity, the first contact 603 may be doped with an n-type dopant such as phosphorus, arsenic, antimony, bismuth, lithium, combinations of these, or the like. In other embodiments in which the first contact 603 is desired to have a p-type conductivity, the first contact 603 may be doped with p-type dopants such as boron, aluminum, gallium, indium, combinations of these, or the like. However, any suitable dopants may be utilized.

In some embodiments the first contact 603 is formed, for example, through an epitaxial growth process such as molecular beam epitaxy (MBE), although other processes, such as hydride vapor phase epitaxy (HVPE), liquid phase epitaxy (LPE), or the like, may also be utilized. The first contact 603 is preferably doped in situ during formation, although other processes, such as ion implantation or diffusion may be utilized.

The first buffer layer 605 is formed over the first contact 603 and is utilized in order to help the epitaxial growth of overlying layers (e.g., the first active diode layer 607) transition from the material of the first contact 603 to the material of the overlying layer. In an embodiment in which the laser die 600 utilizes III-V compounds, the first buffer layer 605 is a compound such as InGaAsP, InGaAlAs, InGaAs, combinations thereof, or the like. Additionally, in embodiments in which the laser die 600 utilizes II-VI compounds, the first buffer layer 605 may be a II-VI material such as BeMgZnSe, BeZnCdSe, BeTe, combinations of these, or the like. Additionally, the first buffer layer 605 may be deposited using an epitaxial growth process such as molecular beam epitaxy (MBE), although other processes, such as hydride vapor phase epitaxy (HVPE), liquid phase epitaxy (LPE), or the like, may also be utilized, and may be doped in a similar fashion as the first contact 603. However, any suitable material and any suitable method of deposition may be utilized.

The first active diode layer 607 is formed over the first buffer layer 605. The first active diode layer 607 is designed, among other things, to control the generation of light to desired wavelengths. For example, by adjusting and controlling the proportional composition of the elements in the first active diode layer 607, the bandgap of the materials in the first active diode layer 607 may be adjusted, thereby adjusting the wavelength of light that will eventually be emitted.

The first active diode layer 607 comprises multiple quantum wells (MQW). MQW structures in the first active diode layer 607 in embodiments which utilized III-V materials may comprise, for example, layers of InAlGaAs, InGaN, GaN, AlxInyGa$_{(1-x-y)}$N (where 0<=x<=1), or the like, while in embodiments which utilize II-VI based materials, the first active diode layer 607 may comprise materials such as BeZnCdSe. The first active diode layer 607 may comprise any number of quantum wells, such as 5 to 20 quantum wells, for example. The MQWs are preferably epitaxially grown using the first buffer layer 605 as a nucleation layer using metal organic chemical vapor deposition (MOCVD), although other processes, such as MBE, HVPE, LPE, or the like, may also be utilized.

The second buffer layer 608 is optionally formed over the first active diode layer 607 and is utilized in order to help the epitaxial growth of overlying layers (e.g., the ridge material 609) transition from the material of the first active diode layer 607 to the material of the overlying layer. In an embodiment in which the laser die 600 utilizes III-V compounds, the second buffer layer 608 is a compound such as InGaAsP, InGaAlAs, InGaAs, combinations thereof, or the like. Additionally, in embodiments in which the laser die 600 utilizes II-VI compounds, the second buffer layer 608 may be a II-VI material such as BeMgZnSe, BeZnCdSe, BeTe, combinations of these, or the like. Additionally, the second buffer layer 608 may be deposited using an epitaxial growth process such as molecular beam epitaxy (MBE), although other processes, such as hydride vapor phase epitaxy (HVPE), liquid phase epitaxy (LPE), or the like, may also be utilized, and may be doped in an opposite fashion from the first contact 603, such as by being doped to a p-type conductivity when the first contact 603 is doped to an n-type conductivity. However, any suitable material and any suitable method of deposition may be utilized.

The ridge material 609 is formed to help assist in the epitaxial growth of an overlying layer (e.g., the second contact 611) transition from the material of the second buffer layer 608 to the material of the overlying layer. In an embodiment in which the laser die 600 utilizes III-V compounds, the ridge material 609 is a compound such as InP or the like. Additionally, in embodiments in which the laser die 600 utilizes II-VI compounds, the ridge material 609 may be a II-VI material such as BeMgZnSe, BeZnCdSe, BeTe, combinations of these, or the like. Additionally, the ridge material 609 may be doped using dopants of an opposite conductivity than the first contact 603, such as by being doped to a p-type conductivity when the first contact 603 is doped to an n-type conductivity. The ridge material 609 may be one or more layers and may be deposited using an epitaxial growth process such as molecular beam epitaxy (MBE), although other processes, such as hydride vapor phase epitaxy (HVPE), liquid phase epitaxy (LPE), or the like, may also be utilized. However, any suitable material and any suitable method of deposition may be utilized.

The second contact 611 is formed over the ridge material 609. The second contact 611 forms the second part of the laser diode 602 used to emit light in conjunction with the first contact 603. In an embodiment in which the laser die 600 is based on III-V materials, the second contact 611 comprises a group III-V compound such as InAlAs, GaN, InN, AlN, AlxGa(1-x)N, AlxIn(1-x)N, AlxInyGa(1-x-y)N, combinations thereof, or the like, doped with a dopant of a second conductivity type (e.g., p-GaN) opposite the first conductivity type in the first contact 603. In another embodiment in which the laser die 600 is based on II-VI materials, the second contact 611 may be a II-VI material such as BeTe, BeMgZnSe, BeZnCdSe, combinations of these, or the like. The second contact 611 may be formed, for example, through an epitaxial growth process such as MOCVD. However, any suitable materials and any other suitable processes, such as HVPE, LPE, MBE, or the like, may also be utilized.

FIG. 6B illustrates a patterning of the second contact 611, the ridge material 609, the second buffer layer 608, the first active diode layer 607, the first buffer layer 605, and the first contact 603 to form the layered structure of the desired laser diode 602. In an embodiment the second contact 611 and the ridge material 609 may be patterned using, e.g., a first photolithographic masking and etching process. Once the second contact 611 and the portion of the ridge material 609 have been patterned, the second buffer layer 608, the first active diode layer 607, and the first buffer layer 605 may be patterned using, e.g., a second photolithographic masking and etching process. Finally, the first contact 603 may be patterned using, e.g., a third photolithographic masking and etching process, to have an adiabatic taper to assist in evanescent coupling to underlying layers. However, any suitable patterning process, and any suitable number of patterning process may be utilized in order to obtain a desired pattern for the laser.

FIG. 6B additionally illustrates deposition of a first passivation layer 613 over the structure. In an embodiment the first passivation layer 613 is formed of a material used to electrically isolate and protect the structure from overlying structures, and may be a material such as silicon oxide, silicon nitride, silicon oxynitride, combinations of these, or the like, and may be deposited using a chemical vapor deposition process, an atomic layer deposition process, a physical vapor deposition process, combinations of these, or the like. However, any suitable materials and any suitable methods of deposition may be utilized.

FIG. 6C illustrates a patterning of the first passivation layer 613 in order to form via openings through the first passivation layer 613 and expose the first contact 603 and the second contact 611. In an embodiment the patterning may be performed using, e.g., a photolithographic masking and etching process. However, any suitable patterning process may be utilized.

FIG. 6C additionally illustrates a deposition of contacts 615 through the via openings and in electrical connection with the first contact 603 and the second contact 611. In an embodiment the contacts 615 may be a conductive material such as copper, aluminum, gold, tungsten, combinations of these, or the like, deposited using a method such as chemical vapor deposition, atomic layer deposition, physical vapor deposition, plating, combinations of these, or the like. However, any suitable material or method of manufacture may be utilized.

FIG. 6D illustrates a deposition of a second passivation layer 617 and a third passivation layer 619 over the contacts 615. In an embodiment the second passivation layer 617 may be an insulative and protecting material such as silicon oxide (SiO$_2$), silicon nitride, silicon oxynitride, combinations of these, or the like, deposited using a deposition process such as chemical vapor deposition, atomic layer deposition, physical vapor deposition combinations of these, or the like. However, any suitable material and method of manufacture may be utilized.

The third passivation layer 619 is deposited over the second passivation layer 617 in order to help protect portions of the second passivation layer 617 during subsequent patterning processes. In an embodiment the third passivation layer 619 may be an insulative and protecting material that is different from the second passivation layer 617, such as by being silicon nitride, silicon oxide, silicon oxynitride, combinations of these, or the like, deposited using a deposition process such as chemical vapor deposition, atomic layer deposition, physical vapor deposition combinations of these, or the like. However, any suitable material and method of manufacture may be utilized.

FIG. 6E illustrates a patterning of the second passivation layer 617 and the third passivation layer 619 in order to form contact via openings through the second passivation layer 617 and the third passivation layer 619 and expose the contacts 615. In an embodiment the patterning may be performed using, e.g., a photolithographic masking and etching process. However, any suitable patterning process may be utilized.

FIG. 6E additionally illustrates a deposition of conductive protective layers 621 through the contact via openings and in electrical connection with the contacts 615. In an embodiment the conductive protective layers 621 may be one or more layers of conductive materials that can help with etching selectivity and also help seal (from, e.g., moisture) subsequently formed conductive extensions 623 (not illustrated in FIG. 6E but illustrated and discussed further below with respect to FIG. 6F) to help prevent process damage from occurring to the conductive extensions 623. In particular embodiments the conductive protective layers 621 may be materials such as tantalum, titanium, tantalum nitride, titanium nitride, combinations of these, or the like, deposited using a method such as chemical vapor deposition, atomic layer deposition, physical vapor deposition, plating, combinations of these, or the like. However, any suitable material or method of manufacture may be utilized.

FIG. 6F illustrates a formation of the conductive extensions 623 that make contact with the conductive protective layers 621. In an embodiment the conductive extensions 623 may be a conductive material such as a metal like aluminum, copper, germanium, combinations of these, or the like, deposited using a deposition method such as plating, chemical vapor deposition, atomic layer deposition, physical vapor deposition, combinations of these, or the like. However, any suitable material and method of manufacture may be utilized.

FIG. 6F additionally illustrates that the conductive extensions 623 are patterned. In an embodiment in which the conductive extensions 623 are plated, the conductive extensions 623 may be patterned during the deposition process, while in other processes the conductive extensions 623 may be patterned after deposition using, for example, a photolithographic masking and etching process. However, any suitable process may be utilized.

FIG. 6G illustrates deposition of a fourth passivation layer 625 over the conductive extensions 623. In an embodiment the fourth passivation layer 625 is a protective dielectric material such as silicon oxide, silicon nitride, silicon oxynitride, combinations of these, or the like, deposited using a deposition process such as chemical vapor deposition, atomic layer deposition, physical vapor deposition, combinations of these, or the like. However, any suitable materials and methods may be used to form the fourth passivation layer 625.

FIG. 6H illustrates that, once the fourth passivation layer 625 has been formed, multiple ones of the laser diodes 602 (with multiple structures being illustrated on each second substrate 601 in FIG. 6H) may be bonded to a semiconductor substrate 626 to form a reconstituted wafer 628. In an embodiment the semiconductor substrate 626 may be a semiconductor material used for structural support during subsequent processing and as a heat sink to help with laser overheat issues, and may be, e.g., a silicon wafer, a silicon germanium wafer, a silicon-on-insulator wafer, or the like. In some embodiments the semiconductor substrate 626 is a 12-inch wafer, although any suitable size and material may be utilized.

In an embodiment the multiple ones of the laser diodes 602 may be bonded to the semiconductor substrate 626 using, for example, a fusion bonding process. For example, in some embodiments the fusion bonding process may activate surfaces of the fourth passivation layer 625 and the semiconductor substrate 626, and then the fourth passivation layer 625 and the semiconductor substrate 626 are placed in physical contact to initiate the bonding process, and further strengthening of the bond may be performed. However, any other suitable attachment process, including using an adhesive, may be utilized.

FIG. 6I illustrates a top down view of the reconstituted wafer 628, with FIG. 6H illustrating a cross-sectional view of the reconstituted wafer 628 along line H-H' in FIG. 6I. As can be seen in this top down view, the reconstituted wafer 628 comprises multiple ones of the individual laser diodes 602 attached to the semiconductor substrate 626. However, while FIG. 6I illustrates ten individual laser dies 600, any suitable number of laser dies 600 may be attached to the semiconductor substrate 626.

FIG. 6J illustrates a removal of the second substrate 601 to expose the first contacts 603 of the laser dies 600. In an embodiment the second substrate 601 may be removed using a planarization process, such as a chemical mechanical polishing process, a grinding process, or the like. In other embodiments the second substrate 601 may be removed using one or more etching processes in order to expose the first contacts 603. Any suitable method may be utilized.

FIG. 6K illustrates that, once the first contacts 603 have been exposed, a gap fill material 627 is deposited in order to both fill the regions between the individual laser dies 600 and also to re-cover the now exposed first contacts 603. In an embodiment the gap fill material 627 may be a dielectric material that can also work as a bottom cladding material. In a particular embodiment the gap fill material 627 may be silicon oxide, silicon nitride, spin on glass, combinations of these, or the like, deposited using a method such as chemical vapor deposition, physical vapor deposition, atomic layer deposition, combinations of these, or the like. However, any suitable material and any suitable method of deposition may be utilized.

FIG. 6K additionally illustrates that, once the gap fill material 627 has been deposited, the gap fill material 627 may be planarized and thinned. In an embodiment the gap fill material 627 may be planarized using, e.g., a chemical mechanical planarization process, a grinding process, or the like. In some embodiments the gap fill material 627 may be planarized to have a thickness over the first contacts 603 that is suitable for optical coupling between the first contact 603 and subsequently placed devices. In a particular embodiment the gap fill material 627 may be formed to have a thickness of between about 5 μm and about 8 μm. However, any suitable material, method of deposition, and thickness may be utilized.

FIG. 6L illustrates formation of a dielectric layer 629 over gap fill material 627 once the gap fill material 627 has been deposited and planarized. In an embodiment the dielectric layer 629 may be one or more layers of dielectric materials, such as silicon oxide, silicon nitride, silicon oxynitride, combinations of these, or the like, deposited using a deposition process such as chemical vapor deposition, atomic layer deposition, physical vapor deposition, combinations of these, or the like. In a particular embodiment the dielectric layer 629 may be a tri-layer of materials, such as a first layer of silicon nitride, a second layer of silicon oxide, and a third layer of silicon nitride. However, any suitable number of layers and any suitable materials may be utilized.

FIG. 6M illustrates that, once the gap fill material 627 has been deposited and planarized and the dielectric layer 629 has been deposited, conductive vias 635 may be formed to create electrical contact with the conductive extensions 623. In an embodiment the conductive vias 635 may be formed by initially depositing and patterning a photoresist and forming openings through the dielectric layer 629 and the second passivation layer 617. Once the openings have been formed, the openings are then filled with a conductive material, such as copper using a seed layer and plating process to fill the openings. Once the openings have been filled, the photoresist is removed, leaving the conductive vias 635 extending out of the dielectric layer 629. However, any suitable method of manufacturing may be utilized.

FIG. 6N illustrates a deposition of a second dielectric layer 637 in order to cover and submerge the conductive vias 635 to protect them until further processing. In an embodiment the second dielectric layer 637 is a dielectric material such as silicon oxide, BCB, SiNC, combinations of these, or the like, deposited using a deposition process such as chemical vapor deposition, atomic layer deposition, physical vapor deposition, or the like. However, any suitable material and any suitable deposition process may be utilized.

FIG. 6O illustrates the start of a singulation process that may be used in order to singulate the individual laser dies 600. In an embodiment, and as illustrated in FIG. 6O, the singulation process is initiated by etching openings between the individual laser dies 600 and at least partially, but not fully, into the semiconductor substrate 626. However, any suitable method of partially dicing the laser dies 600, such as by a laser dicing process, may also be used.

FIG. 6P illustrates that, once the laser dies 600 have been partially diced, the semiconductor substrate 626 may be thinned in order to expose the openings and finish the singulation. In an embodiment the thinning may be performed using, e.g., a planarization process such as a grinding process, a chemical mechanical polishing process, combinations of these, or the like. However, any suitable thinning process may be utilized.

Figure 7A:
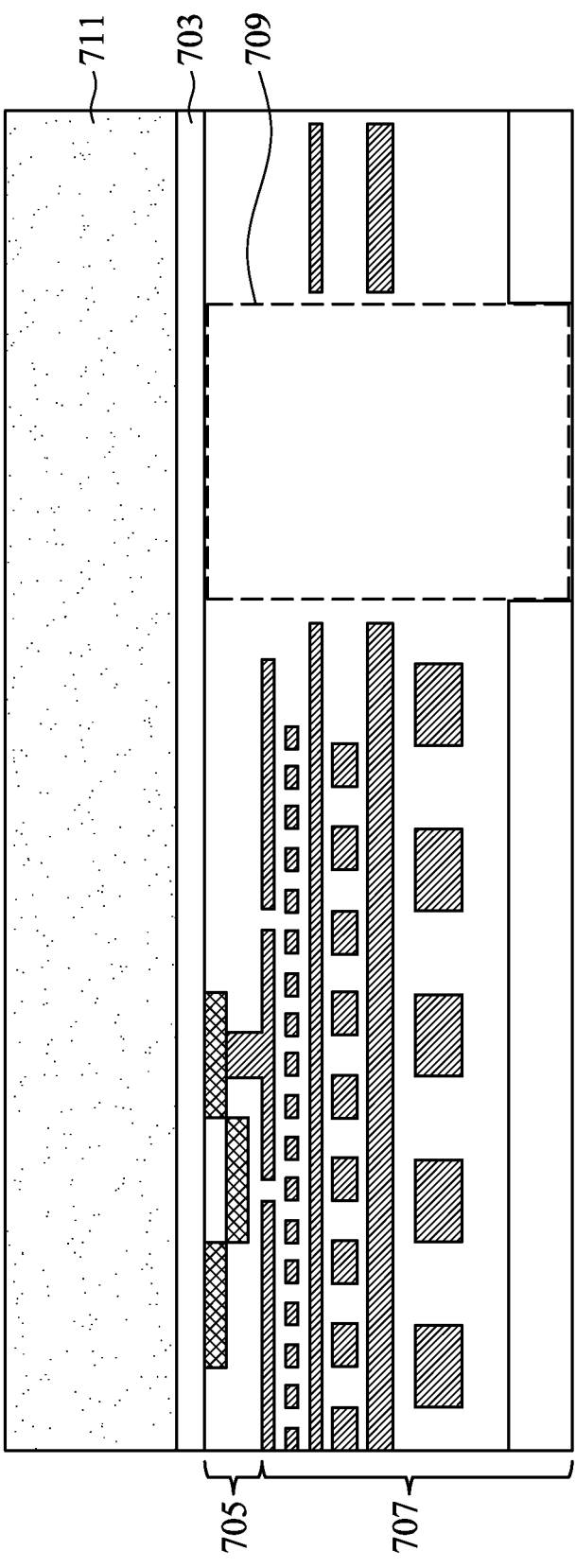
FIGS. 7A-7G illustrate formation of a first semiconductor device, in accordance with some embodiments.

FIG. 7A illustrates a first semiconductor device 700 that will be bonded to the optical interposer 100 along with the laser die 600. In some embodiments, the first semiconductor device 700 is an electronic integrated circuit (EIC—e.g., a device without optical devices) and may have a semiconductor substrate 703, a layer of active devices 705, and an overlying interconnect structure 707. In an embodiment the semiconductor substrate 703 may be similar to the first substrate 101 (e.g., a semiconductor material such as silicon or silicon germanium in a wafer form), the active devices 705 may be transistors, capacitors, resistors, and the like formed over the semiconductor substrate 703, and the interconnect structure 707 may be similar to the first metallization layers 501 (without optical components). However, any suitable devices may be utilized.

In an embodiment the first semiconductor device 700 may be configured to work with the optical interposer 100 for a desired functionality. In some embodiments the first semiconductor device 700 may be a logic die, a high bandwidth memory (HBM) module, an xPU, a 3DIC die, a CPU, a GPU, a SoC die, a MEMS die, combinations of these, or the like. Any suitable device with any suitable functionality may be used, and all such devices are fully intended to be included within the scope of the embodiments.

FIG. 7A additionally illustrates that, as part of the manufacturing of the first semiconductor device 700, a first region 709 (highlighted in FIG. 7A by the dashed box) is formed within the layer of active devices 705 and the overlying interconnect structure 707. In an embodiment the first region 709 is a location into which the laser die 600 will subsequently be embedded within the first semiconductor device 700 to make the first semiconductor device 700 a light emitting wafer module. As such, the first region 709 is formed by not placing functional devices (e.g., transistors or conductive routing) into the first region 709 as the layer of active devices 705 and the interconnect structure 707 are manufactured. However, any suitable method of manufacturing may be utilized.

Figure 7B:
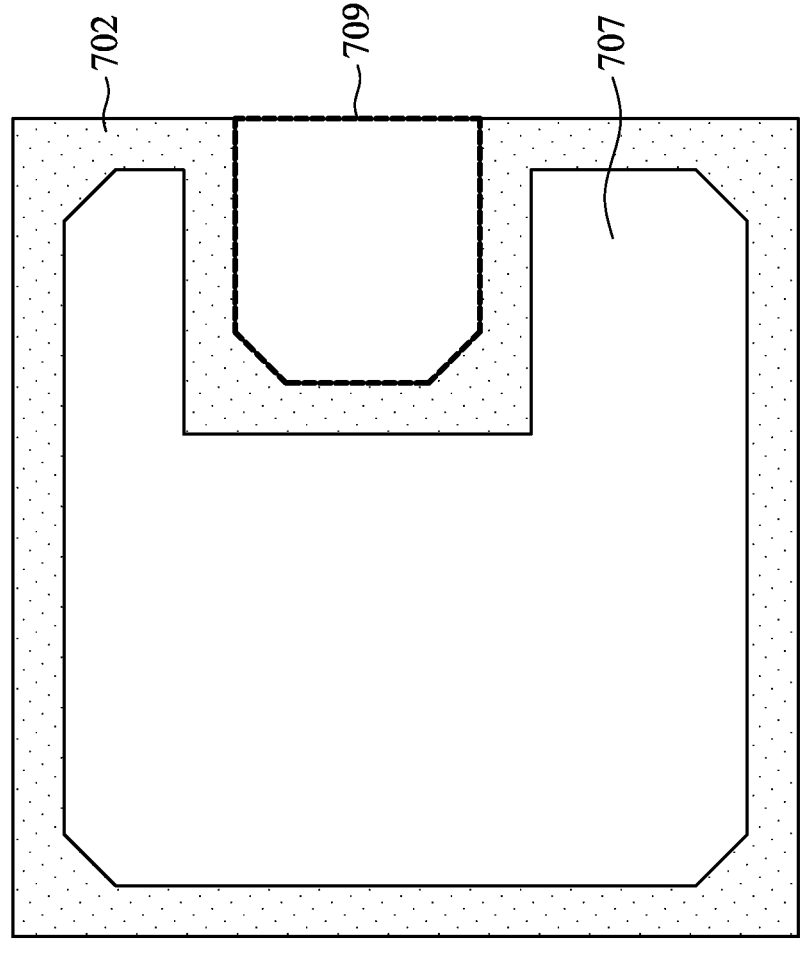

FIG. 7B illustrates a top down view of a seal ring 702 that may encircle the functional structures of the first semiconductor device 700 (e.g., the layer of active devices 705 and the overlying interconnect structure 707) and separate the first region 709 from a remainder of the first semiconductor device 700. In some embodiments, the seal ring 702 includes metal lines and vias in the dielectric layers of the interconnect structure 707. The seal ring 702 may be manufactured simultaneously with the conductive elements of the interconnect structure 707, such as by using damascene and/or dual damascene processes. However, any suitable manufacturing processes may be utilized.

Returning now to FIG. 7A, FIG. 7A also illustrates an attachment of a support substrate 711. In an embodiment the support substrate 711 may be a support material that is transparent to the wavelength of light that is desired to be used, such as silicon, and may be attached using, e.g., adhesive (not separately illustrated in FIG. 7A). However, in other embodiments the support substrate 711 may be bonded using, e.g., a bonding process. Any suitable method of attaching the support substrate 711 may be used.

Figure 7C:
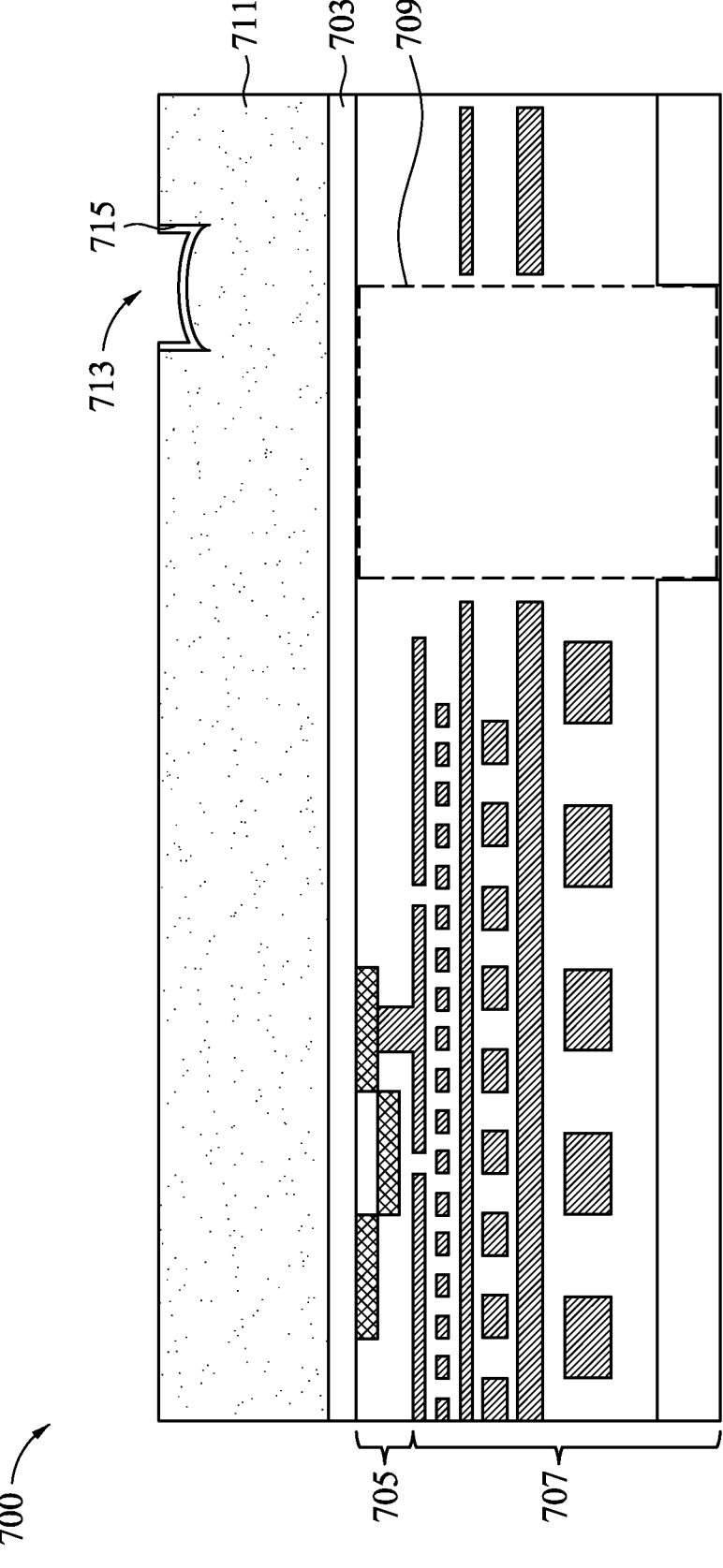

FIG. 7C illustrates formation of a lens 713 within the support substrate 711. In an embodiment a photosensitive material (not separately illustrated in FIG. 7C) may be deposited, exposed, developed, and reflowed in order to form the desired shape for the lens 713 in a mask. Once the mask is present, the formation of the lens 713 may be performed using, for example, an anisotropic etching process, such as a reactive ion etch, that uses the mask as a sacrificial mask. In particular, as the etching process progresses to etch the support substrate 711, the etching process will also etch the material of the mask. As the thinner portions of the mask are removed, additional portions of the support substrate 711 are exposed to the etching process, until some, most, or all of the mask is consumed. In this fashion, the shape of the mask is translated to the support substrate 711, thereby forming the lens 713 within the support substrate 711. However, any suitable process may be utilized.

FIG. 7C additionally illustrates formation of an anti-reflective coating (ARC) 715 over the lens 713. In an embodiment the ARC 715 may be one or more layers of materials which help to prevent undesired reflections as light is focused through the lens 713. In a particular embodiment the one or more layers of materials may be materials such as silicon oxide, silicon nitride, combinations of these, or the like, formed using processes such as chemical vapor deposition, atomic layer deposition, physical vapor deposition, oxidation, nitridation, combinations of these, or the like.

In a particular embodiment the ARC 715 may be formed using a first layer of silicon oxide and a first layer of silicon nitride formed over the first layer of silicon oxide. A second layer of silicon oxide and a second layer of silicon nitride are deposited over the first layer of silicon oxide and the first layer of silicon nitride, forming an alternating stack of silicon oxide and silicon nitride. However, any suitable combinations of materials may be utilized.

Figure 7D:
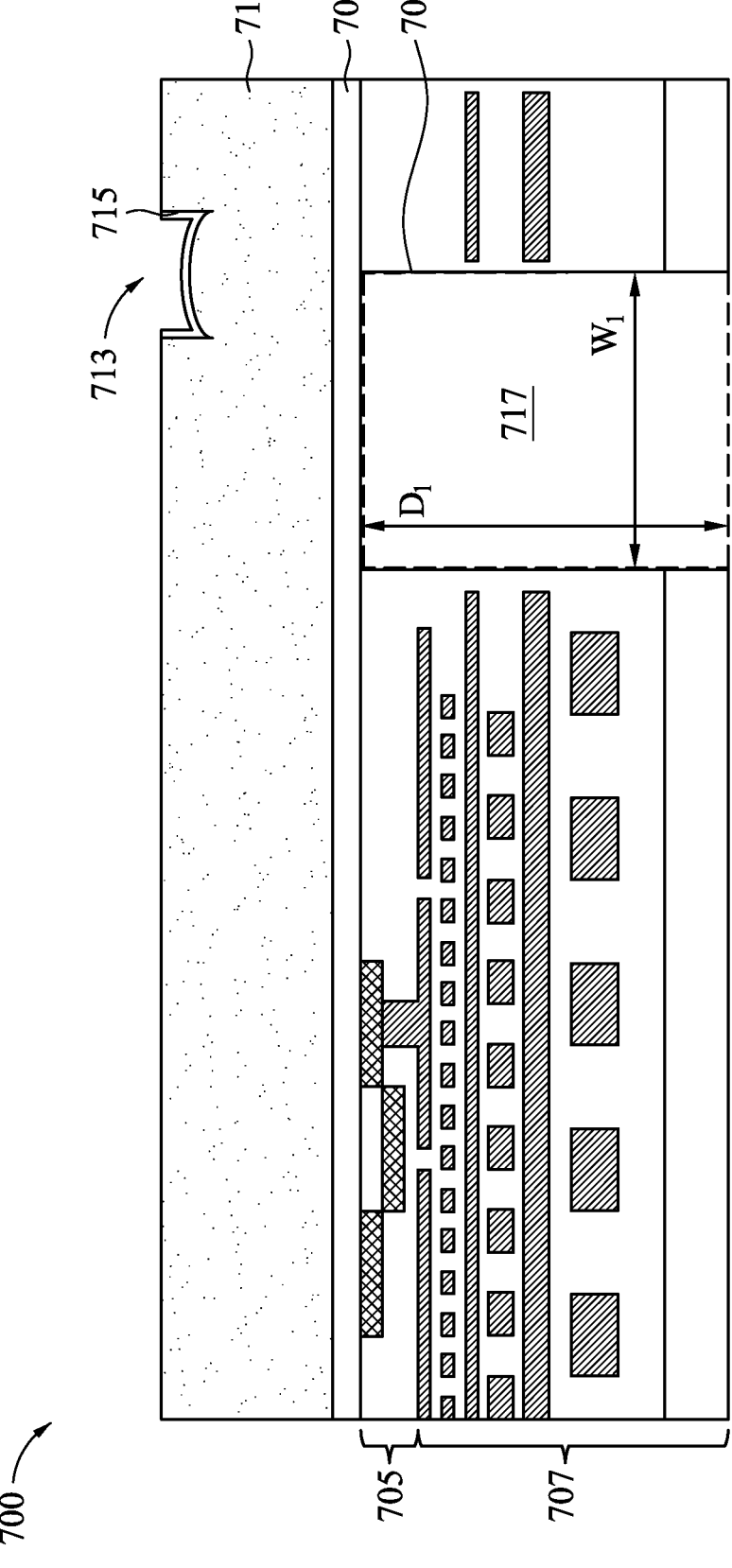

FIG. 7D illustrates a removal of material from the first region 709 in order to form a first opening 717 and make room for placement of the laser die 600. In an embodiment the removal of the material may be performed using, for example, one or more anisotropic etching processes such as one or more reactive ion etching processes. However, any suitable removal process or combination of removal processes, may be utilized.

In an embodiment the first opening 717 may be formed with dimensions to suitably fit the laser die 600 within the first opening 717. As such, the precise dimensions of the first opening 717 will be based at least in part on the dimensions of the laser die 600. However, in some embodiments the first opening 717 may be formed to have a first width $W_1$ of between about 1 mm and about 4 mm, and a first depth $D_1$ of between about 4 $\mu$m and about 8 $\mu$m. However, any suitable dimensions may be utilized.

Additionally, while FIG. 7D illustrates the first opening 717 being formed to extend through the interconnect structure 707 and the layer of active devices 705, this is intended to be illustrative and is not intended to limit the embodiments. Rather, the first opening 717 may be formed to extend through any suitable number of layers, such as also extending through the semiconductor substrate 703 and into the support substrate 711. Any suitable depth may be utilized.

Figure 7E:
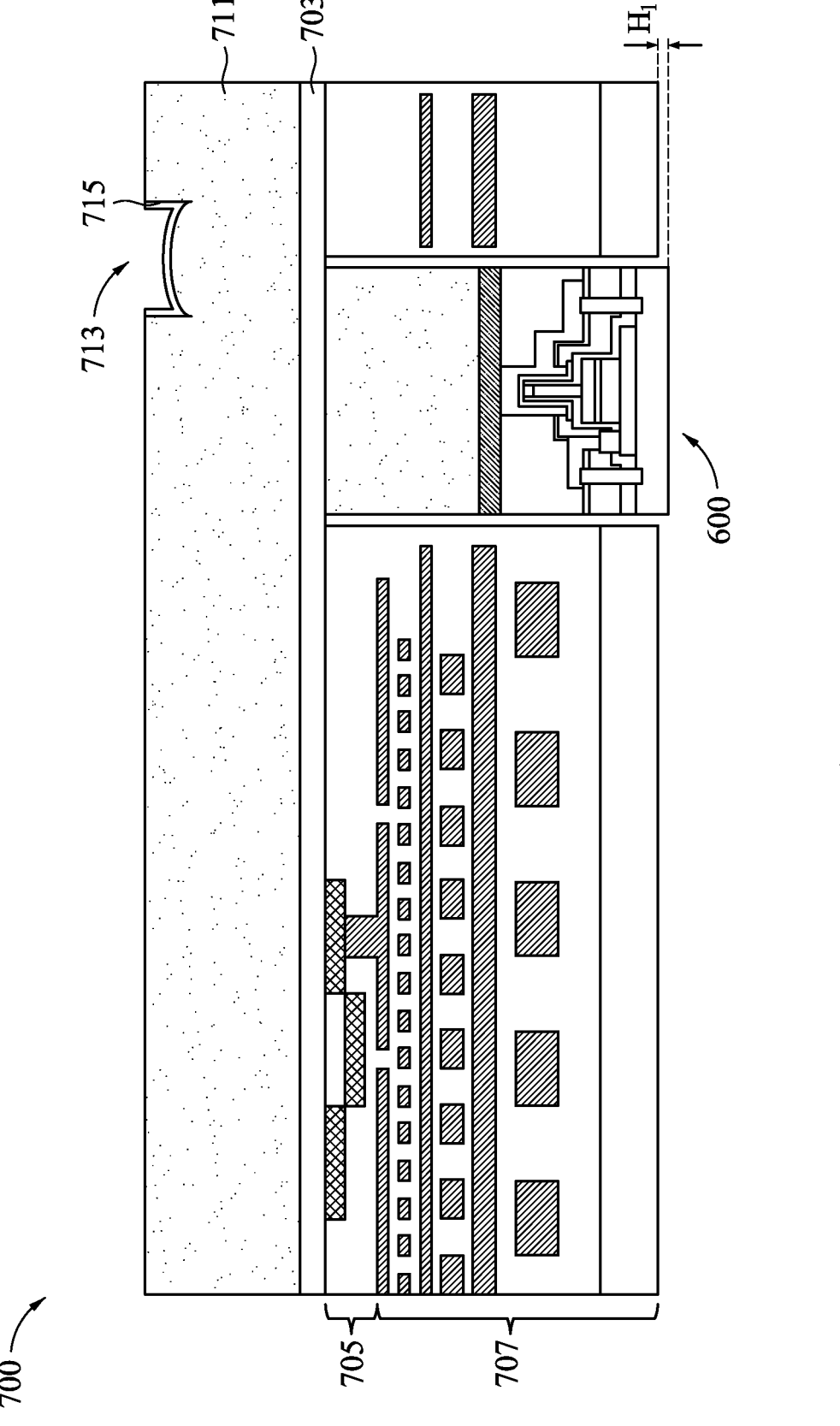

FIG. 7E illustrates an embedding of one or more laser dies 600 (with only one laser die 600 being illustrated) into the first opening 717 of the first semiconductor device 700. In an embodiment the one or more laser dies 600 may be embedded by placing the laser die 600 into the first opening 717, using, e.g., a pick-and-place process. Additionally, if desired, the laser die 600 may be bonded to the exposed surface of the semiconductor substrate 703. However, any suitable process may be utilized.

Once the laser die 600 has been placed within the first opening 717, the laser die 600 may either be planar with the first semiconductor device 700 or else may extend out of the first semiconductor device 700. In such an embodiment the laser die 600 may extend out of the first semiconductor device 700 by a first height $H_1$ of between about 0.1 $\mu$m and about 3 $\mu$m. However, any suitable dimension may be used.

Figure 7F:
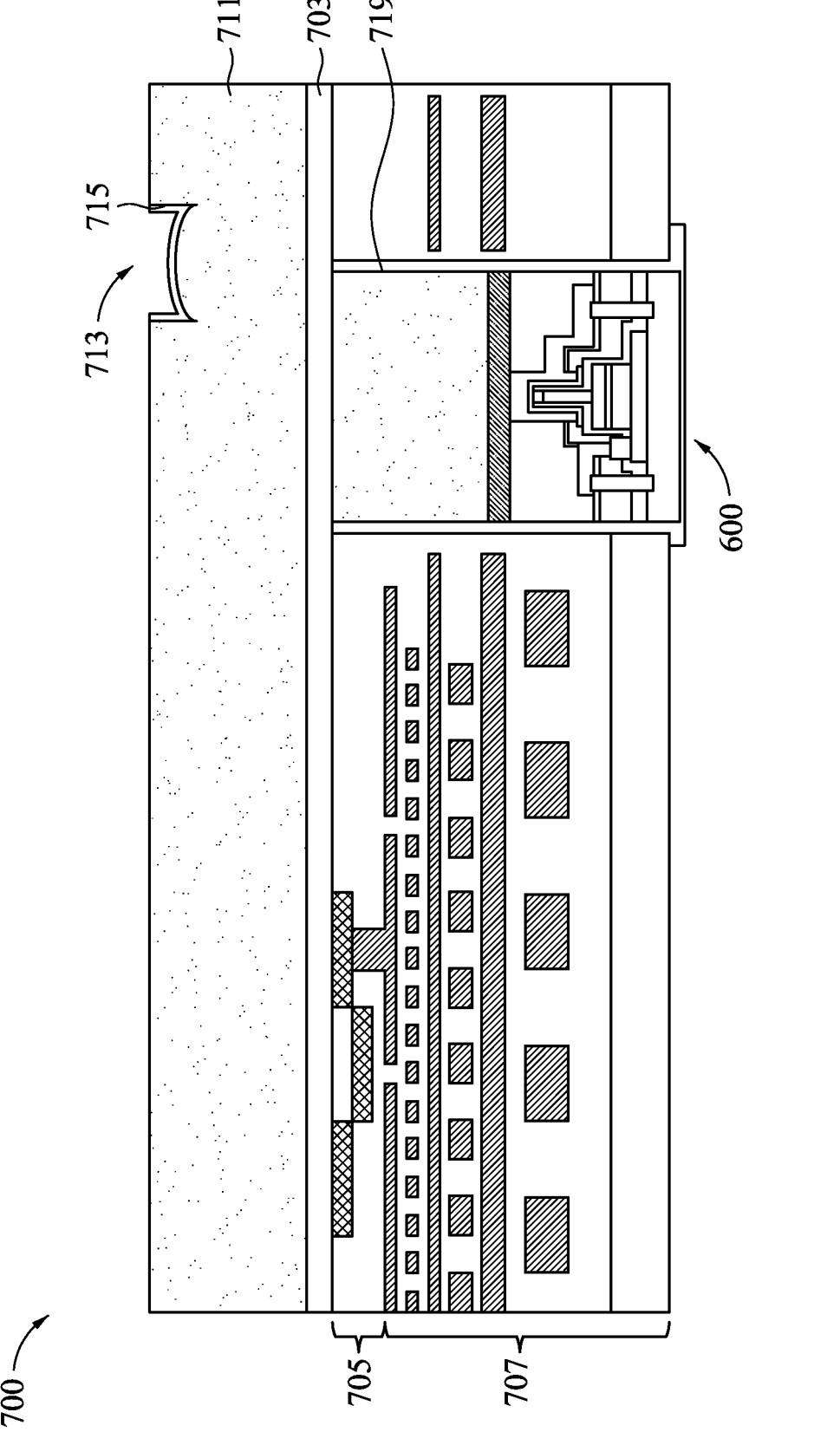

FIG. 7F illustrates that, once the laser die 600 has been placed within the first opening 717, a sealing material 719 may be deposited in order to fill and seal a remainder of the first opening 717 and lock the laser die 600 in place. In an embodiment the sealing material 719 may be an oxide such as silicon oxide or a polymer such as BCB, SiNC, although any suitable material may be used. In an embodiment the sealing material 719 may be deposited using a process such as a chemical vapor deposition process, an atomic layer deposition process, a flowable chemical vapor deposition process, a spin-on process, combinations of these, or the like, followed by a patterning process. However, any suitable deposition process may be utilized.

Figure 7G:
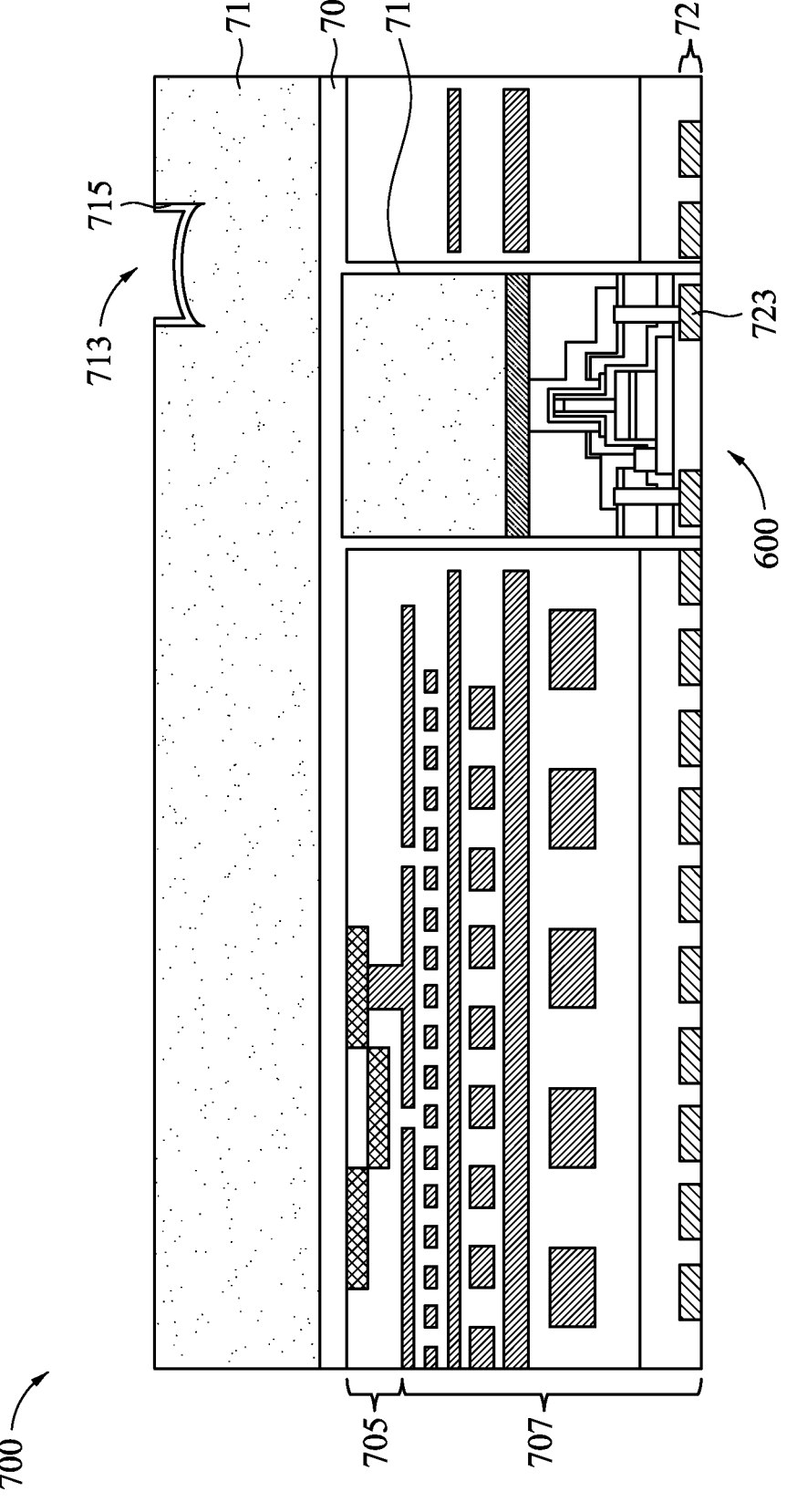

FIG. 7G illustrates a planarization process used to planarize the laser die 600 with the interconnect structure 707. In an embodiment the planarization process may be a chemical mechanical polishing process, whereby etchants and abrasives are utilized to remove exposed materials. However, any suitable planarization process, such as grinding or even one or more etching processes, may be utilized.

FIG. 7G additionally illustrates formation of second bond pads 723 simultaneously in the interconnect structure 707 and the second dielectric layer 637, thereby forming a second bond layer 721 within the interconnect structure 707 to provide points of electrical connection for the interconnect structure 707 and the laser die 600. In an embodiment the second bond pads 723 may be similar to the first bond pads 507. However, any suitable devices may be utilized.

Additionally, while FIG. 7G illustrates the laser die 600 extending through only the interconnect structure 707 and layer of active devices 705, this is intended to be illustrative and is not intended to limit the embodiments presented to only this example. Rather, the laser die 600 may be also embedded in such a way that the laser die 600 extends into or through the semiconductor substrate 703 and the support substrate 711 as well. Any suitable depth may be utilized.

Figure 8:
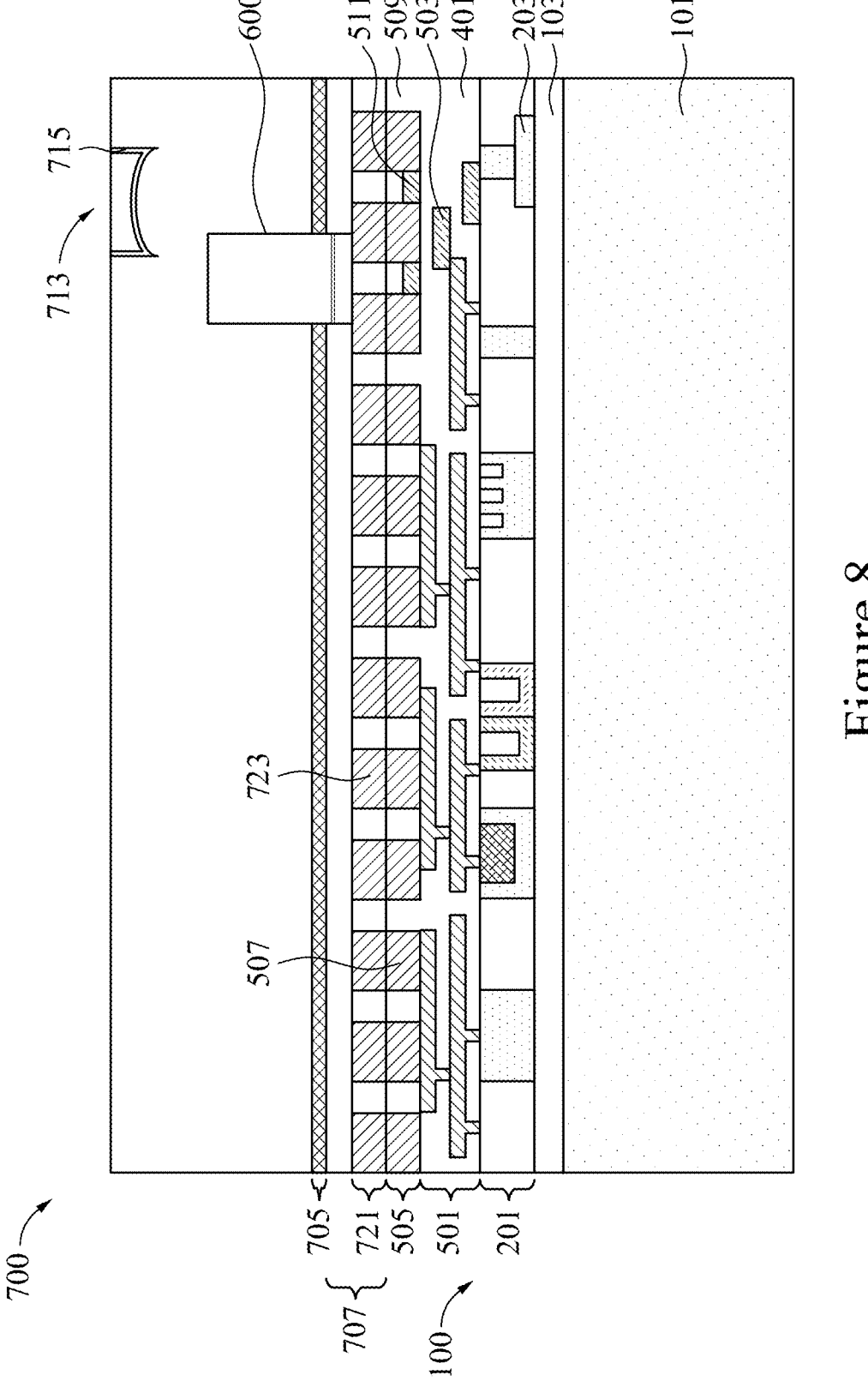
FIGS. 8-12 illustrate formation of a first optical package, in accordance with some embodiments.

FIG. 8 illustrates a bonding of the first semiconductor device 700 (while the first semiconductor device 700 remains part of a wafer) along with the embedded laser die 600 (illustrated in a more simplified form for clarity) to the first bonding layer 505 of the optical interposer 100 (which remains as part of a wafer). In a particular embodiment the first semiconductor device 700, the laser die 600 and the first bonding layer 505 may be bonded using a dielectric-to-dielectric and metal-to-metal bonding process. However, any other suitable bonding process may also be utilized.

In a particular embodiment which utilizes a dielectric-to-dielectric and metal-to-metal bonding process, the process may be initiated by activating the surfaces of the first semiconductor device 700, the laser die 600, and the surfaces of the first bonding layer 505. Activating the top surfaces of the first bonding layer 505, the first semiconductor device 700, and the laser die 600 may comprise a dry treatment, a wet treatment, a plasma treatment, exposure to an inert gas plasma, exposure to $H_2$, exposure to $N_2$, exposure to $O_2$, combinations thereof, or the like, as examples. In embodiments where a wet treatment is used, an RCA cleaning may be used, for example. In another embodiment, the activation process may comprise other types of treatments. The activation process assists in the bonding of the first bonding layer 505, the first semiconductor device 700, and the laser die 600.

After the activation process the optical interposer 100, the first semiconductor device 700, and the laser die 600 may be cleaned using, e.g., a chemical rinse, and then the laser die 600 and the first semiconductor device 700 are aligned and placed into physical contact with the optical interposer 100 in a wafer-to-wafer alignment process. The optical interposer 100, the first semiconductor device 700, and the laser die 600 are then subjected to thermal treatment and contact pressure to bond the optical interposer 100, the first semiconductor device 700, and the laser die 600. For example, the optical interposer 100, the first semiconductor device 700, and the laser die 600 may be subjected to a pressure of about 200 kPa or less, and a temperature between about 25° C. and about 250° C. to fuse the optical interposer 100, the first semiconductor device 700, and the laser die 600. The optical interposer 100, the first semiconductor device 700, and the laser die 600 may then be subjected to a temperature at or above the eutectic point for material of the first bond pads 507 and the second bond pads 723, e.g., between about 150° C. and about 650° C., to fuse the metal. In this manner, the optical interposer 100, the first semiconductor device 700, and the laser die 600 form a dielectric-to-dielectric and metal-to-metal bonded device. In some embodiments, the bonded devices are subsequently baked, annealed, pressed, or otherwise treated to strengthen or finalize the bond.

Additionally, while the above description describes a dielectric-to-dielectric and metal-to-metal bonding process, this is intended to be illustrative and is not intended to be limiting. In yet other embodiments, the optical interposer 100 may be bonded to the first semiconductor device 700 and the laser die 600 by metal-to-metal bonding, or another bonding process. For example, the first semiconductor device 700, the laser die 600 and the optical interposer 100 may be bonded by metal-to-metal bonding that is achieved by fusing conductive elements. Any suitable bonding process may be utilized, and all such methods are fully intended to be included within the scope of the embodiments.

Figure 9:
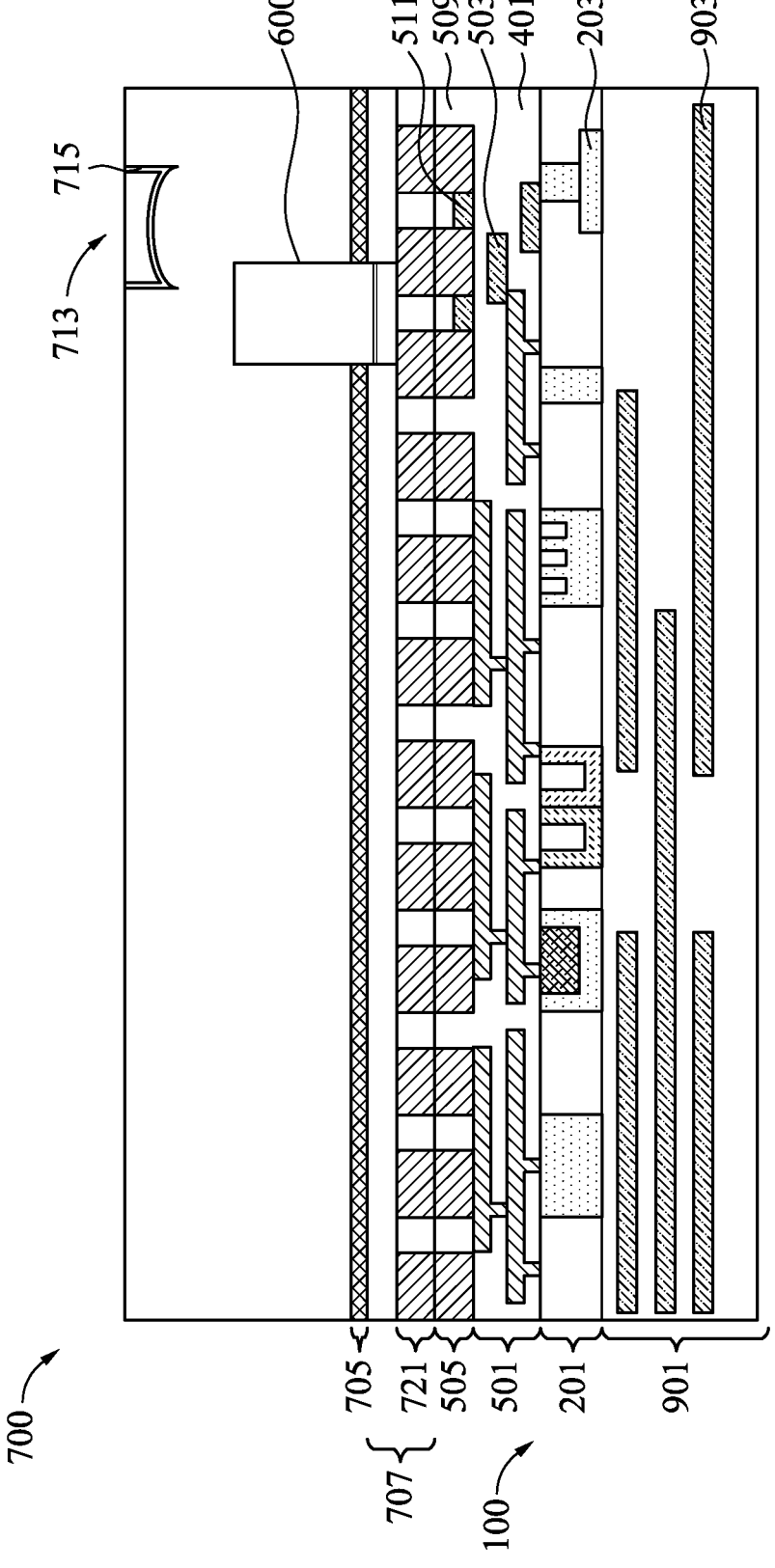

FIG. 9 illustrates a removal of the first substrate 101 and, optionally, the first insulating layer 103, thereby exposing the first active layer 201 of first optical components 203. In an embodiment the first substrate 101 and the first insulator layer 103 may be removed using a planarization process, such as a chemical mechanical polishing process, a grinding process, one or more etching processes, combinations of these, or the like. However, any suitable method may be used in order to remove the first substrate 101 and/or the first insulator layer 103.

Once the first substrate 101 and the first insulator layer 103 have been removed, a fourth optical components 903 of second active layer 901 may be formed on a back side of the first active layer 201. In an embodiment the second active layer 901 of fourth optical components 903 may be formed using similar materials and similar processes as the second optical components 503 of the first metallization layers 501 (described above with respect to FIG. 5). For example, the second active layer 901 of fourth optical components 903 may be formed of alternating layers of a cladding material such as silicon oxide and core material such as silicon nitride formed using deposition and patterning processes in order to form optical components such as waveguides and the like.

Figure 10:
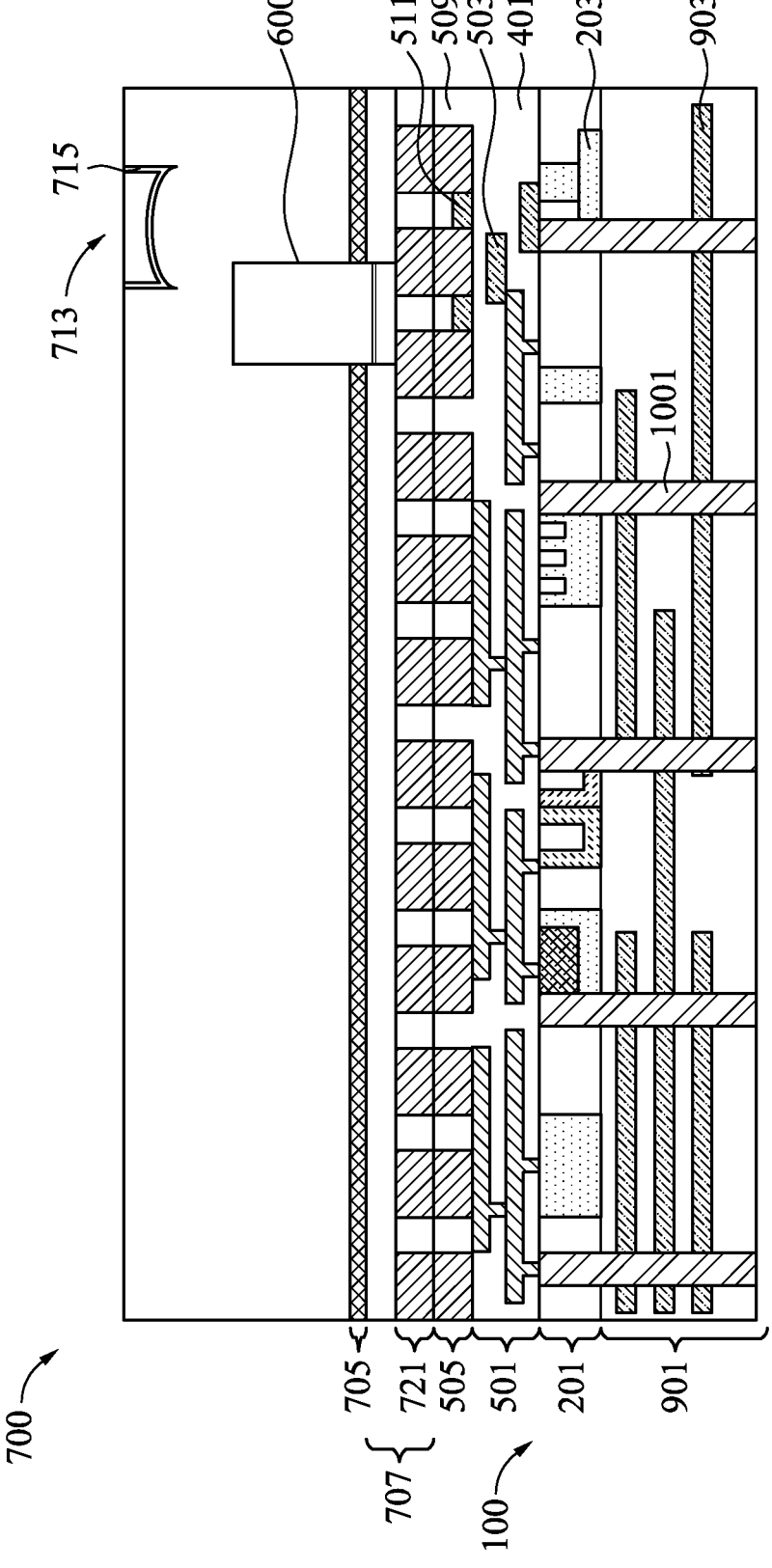

FIG. 10 illustrates formation of first through device vias (TDVs) 1001. In an embodiment the first through device vias 1001 extend through the second active layer 901 and the first active layer 201 so as to provide a quick passage of power, data, and ground through the optical interposer 100. In an embodiment the first through device vias 1001 may be formed by initially forming through device via openings into the second active layer 901 and the optical interposer 100. The through device via openings may be formed by applying and developing a suitable photoresist (not shown), and removing portions of the second active layer 901 and the optical interposer 100 that are exposed.

Once the through device via openings have been formed within the optical interposer 100, the through device via openings may be lined with a liner (not separately illustrated in FIG. 10). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used.

Once the liner has been formed along the sidewalls and bottom of the through device via openings, a barrier layer (also not independently illustrated) may be formed and the remainder of the through device via openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer (not shown), filling and overfilling the through device via openings. Once the through device via openings have been filled, excess liner, barrier layer, seed layer, and first conductive material outside of the through device via openings may be removed through a planarization process such as chemical mechanical polishing (CMP), although any suitable removal process may be used.

Optionally, in some embodiments once the first through device vias 1001 have been formed, second metallization layers (not separately illustrated in FIG. 10) may be formed in electrical connection with the first through device vias 1001. In an embodiment the second metallization layers may be formed as described above with respect to the first metallization layers 501, such as being alternating layers of dielectric and conductive materials using damascene processes, dual damascene process, or the like. In other embodiments, the second metallization layers may be formed using a plating process to form and shape conductive material, and then cover the conductive material with a dielectric material. However, any suitable structures and methods of manufacture may be utilized.

Figure 11:
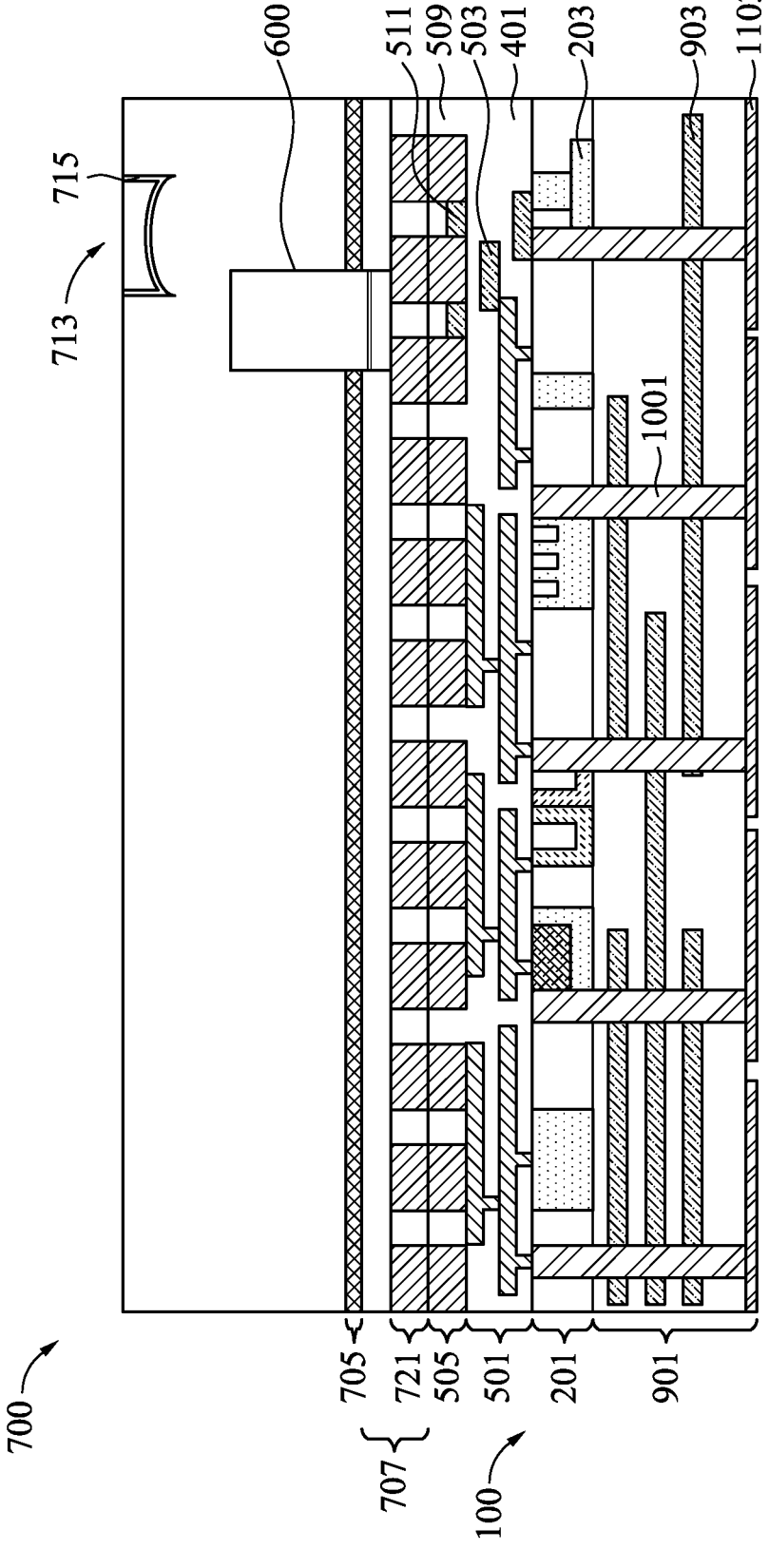

FIG. 11 illustrates formation of third bond pads 1103. The third bond pads 1103 may be formed to provide conductive regions for contact between the first through device vias 1001 to other external devices. In an embodiment the third bond pads 1103 may be formed in a similar fashion and using similar materials as the first bond pads 507, or else may be formed using a deposition and patterning process. However, any suitable material and method of manufacture may be utilized.

Figure 12:
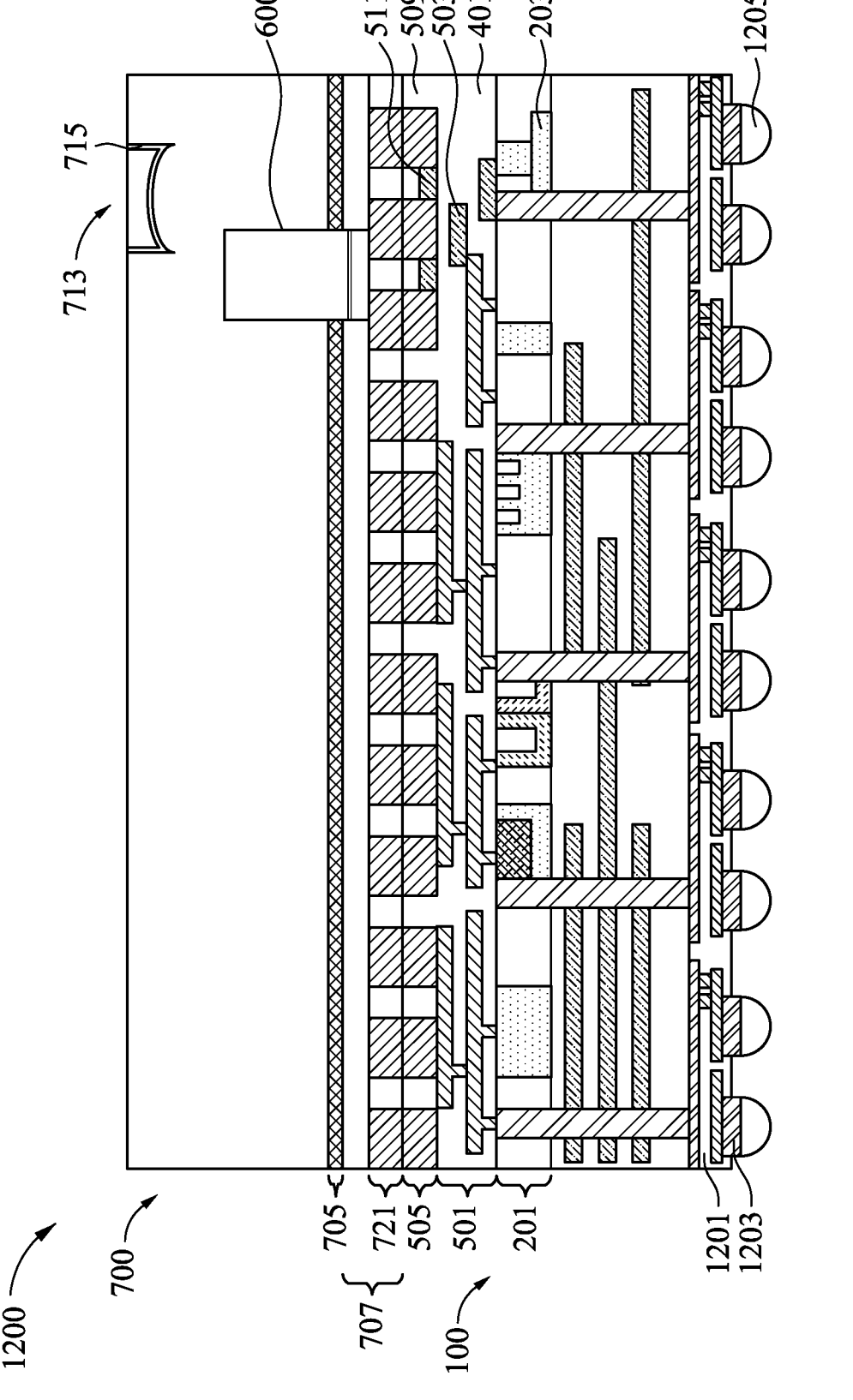

FIG. 12 illustrates that, once the third bond pads 1103 have been formed, a second interconnect structure 1201, underbump metallization layers 1203, and external connections 1205 may be formed to complete one embodiment of a first optical package 1200. In an embodiment the second interconnect structure 1201 may be formed using methods and materials similar to the formation of the first metallization layer 501. However, any suitable methods and materials may be used.

The underbump metallization layers 1203 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers. Any suitable materials or layers of material that may be used for the underbump metallization layers 1203 are fully intended to be included within the scope of the embodiments.

In an embodiment the underbump metallization layers 1203 are created by forming each layer over the second interconnect structure 1201. The forming of each layer may be performed using a plating process, such as electrochemical plating, although other processes of formation, such as sputtering, evaporation, or PECVD process, may alternatively be used depending upon the desired materials. The underbump metallization layers 1203 may be formed to have a thickness of between about 0.7 µm and about 10 µm, such as about 5 µm.

In an embodiment the external connections 1205 may be placed on the underbump metallization layers 1203 and may be, e.g., a ball grid array (BGA) which comprises a eutectic material such as solder, although any suitable materials may be used. In an embodiment in which the external connections 1205 are solder bumps, the external connections 1205 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape. Once the external connections 1205 have been formed, a test may be performed to ensure that the structure is suitable for further processing.

Figure 13:
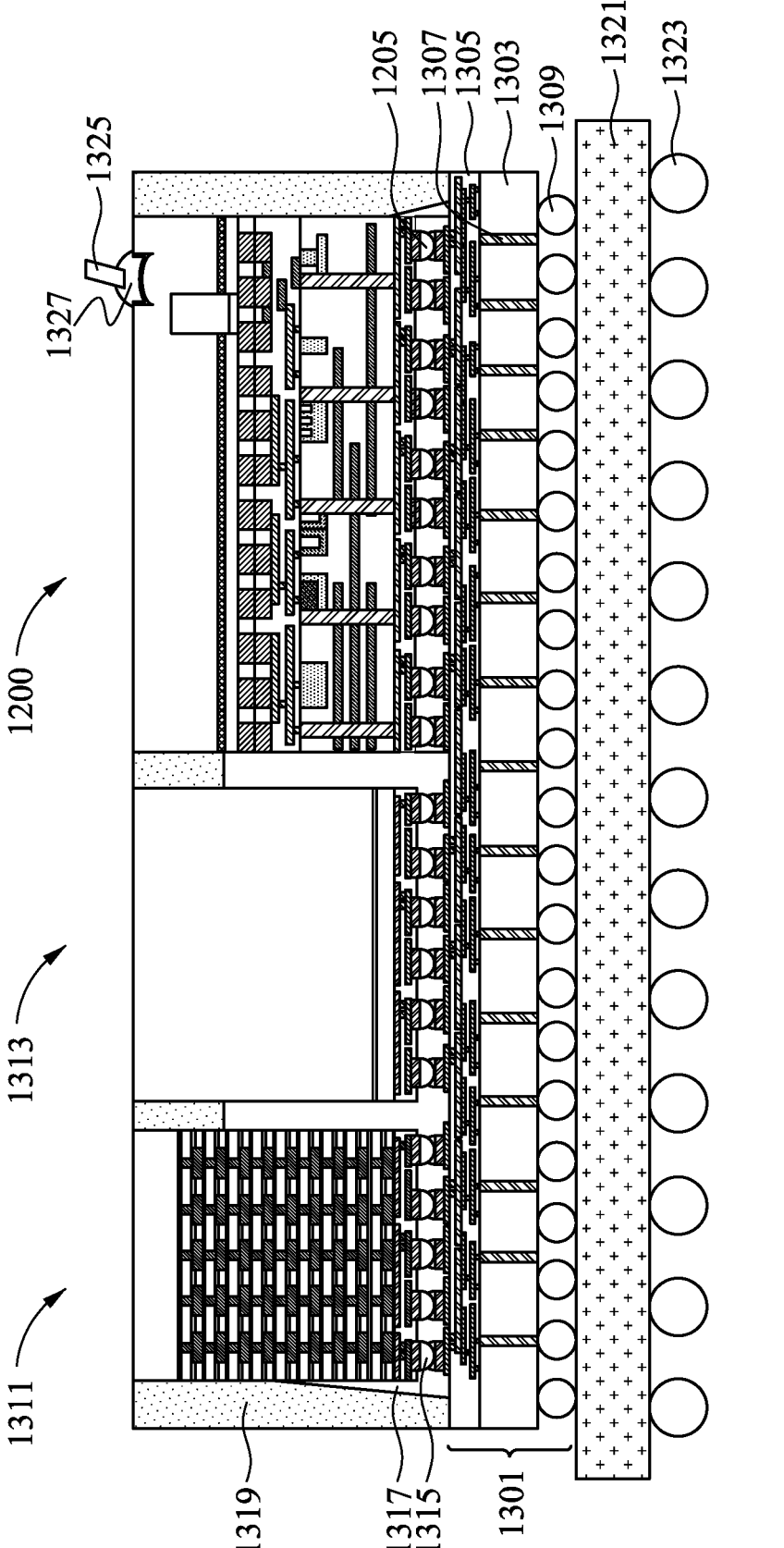
FIGS. 13-14 illustrate bonding of the first optical package to interposers, in accordance with some embodiments.

FIG. 13 illustrates that, once the first optical package 1200 has been formed, the first optical package 1200 may be attached to an interposer substrate 1301 that is used to couple the first optical package 1200 with other devices to form, for example, a chip-on-wafer-on-substrate (CoWoS®). In an embodiment the interposer substrate 1301 comprises a semiconductor substrate 1303, third metallization layers 1305, second through device vias (TDVs) 1307, and second external connectors 1309. The semiconductor substrate 1303 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Optionally, first active devices (not separately illustrated) may be added to the semiconductor substrate 1303. The first active devices comprise a wide variety of active devices and passive devices such as capacitors, resistors, inductors and the like that may be used to generate the desired structural and functional requirements of the design for the semiconductor substrate 1303. The first active devices may be formed using any suitable methods either within or else on the semiconductor substrate 1303.

The third metallization layers 1305 are formed over the semiconductor substrate 1303 and the first active devices and are designed to connect the various active devices to form functional circuitry. In an embodiment the third metallization layers 1305 are formed of alternating layers of dielectric (e.g., low-k dielectric materials, extremely low-k dielectric material, ultra low-k dielectric materials, combinations of these, or the like) and conductive material and may be formed through any suitable process (such as deposition, damascene, dual damascene, etc.). However, any suitable materials and processes may be utilized.

Additionally, at any desired point in the manufacturing process, the second TDVs 1307 may be formed within the semiconductor substrate 1303 and, if desired, one or more layers of the third metallization layers 1305, in order to provide electrical connectivity from a front side of the semiconductor substrate 1303 to a back side of the semiconductor substrate 1303. In an embodiment the second TDVs 1307 may be formed using similar processes and similar materials as the first through device vias 1001 described above with respect to FIG. 10. However, any suitable methods and materials may be utilized.

In an embodiment the second external connectors 1309 may be placed on the semiconductor substrate 1303 in electrical connection with the second TDVs 1307 and may be, e.g., a ball grid array (BGA) which comprises a eutectic material such as solder, although any suitable materials may be used. Optionally, an underbump metallization or additional metallization layers (not separately illustrated in FIG. 13) may be utilized between the semiconductor substrate 1303 and the second external connectors 1309. In an embodiment in which the second external connectors 1309 are solder bumps, the second external connectors 1309 may be formed using a ball drop method, such as a direct ball drop process. In another embodiment, the solder bumps may be formed by initially forming a layer of tin through any suitable method such as evaporation, electroplating, printing, solder transfer, and then performing a reflow in order to shape the material into the desired bump shape. Once the second external connectors 1309 have been formed, a test may be performed to ensure that the structure is suitable for further processing.

Once the interposer substrate 1301 has been formed, the first optical package 1200 may be attached to the interposer substrate 1301. In an embodiment the first optical package 1200 may be attached to the interposer substrate 1301 by aligning the external connections 1205 with conductive portions of the interposer substrate 1301. Once aligned and in physical contact, the external connections 1205 are reflowed by raising the temperature of the external connections 1205 past a eutectic point of the external connections 1205, thereby shifting the material of the external connections 1205 to a liquid phase. Once reflowed, the temperature is reduced in order to shift the material of the external connections 1205 back to a solid phase, thereby bonding the first optical package 1200 to the interposer substrate 1301.

FIG. 13 additionally illustrates a bonding of a second semiconductor device 1311 and a third semiconductor device 1313 onto the semiconductor substrate 1303. In some embodiments, the second semiconductor device 1311 is an electronic integrated circuit (EIC) such as a stacked device that includes multiple, interconnected semiconductor substrates. For example, the second semiconductor device 1311 may be a memory device such as a high bandwidth memory (HBM) module, a hybrid memory cube (HMC) module, or the like that includes multiple stacked memory dies. In such embodiments, the second semiconductor device 1311 includes multiple semiconductor substrates interconnected by through device vias (TDVs). Each of the semiconductor substrates may (or may not) have a layer of active devices and an overlying interconnect structure, a bond layer, and associated bond pads in order to interconnect the multiple devices within the second semiconductor device 1311.

Of course, while the second semiconductor device 1311 is a HBM module in one embodiment, the embodiments are not restricted to the second semiconductor device 1311 being an HBM module. Rather, the second semiconductor device 1311 may be any suitable semiconductor device, such as a processor die or other type of functional die. In particular embodiments the second semiconductor device 1311 may be an xPU, a logic die, a 3DIC die, a CPU, a GPU, a SoC die, a MEMS die, combinations of these, or the like. Any suitable device with any suitable functionality, may be used, and all such devices are fully intended to be included within the scope of the embodiments.

The third semiconductor device 1313 may be another EIC that is intended to work with both the first optical package 1200 and the second semiconductor device 1311. In some embodiments the third semiconductor device 1313 may be any suitable type of device (e.g., an xPU, a logic die, a 3DIC die, a CPU, a GPU, a SoC die, a MEMS die, combinations of these, or the like) and may have a different functionality from the second semiconductor device 1311, such as by being an application specific integrated circuit (ASIC) device, or may have a same functionality as the second semiconductor device 1311, such as by being another high bandwidth memory device. Any suitable device may be utilized.

In an embodiment both the second semiconductor device 1311 and the third semiconductor device 1313 may be bonded to the interposer substrate 1301 using, e.g., third external connections 1315. The third external connections 1315 may be conductive bumps (e.g., ball grid arrays, microbumps, etc.) or conductive pillars utilizing materials such as solder and copper. In an embodiment in which the third external connections 1315 are contact bumps, the third external connections 1315 may comprise a material such as tin, or other suitable materials, such as silver, lead-free tin, or copper. In an embodiment in which the third external connections 1315 are tin solder bumps, the third external connections 1315 may be formed by initially forming a layer of tin through such commonly used methods such as evaporation, electroplating, printing, solder transfer, ball placement, etc. Once a layer of tin has been formed on the structure, a reflow may be performed in order to shape the material into the desired bump shape.

Additionally, once the third external connections 1315 have been placed, the second semiconductor device 1311 and the third semiconductor device 1313 are aligned with the interposer substrate 1301. Once aligned and in physical contact, the third external connections 1315 are reflowed by raising the temperature of the third external connections 1315 past a eutectic point of the third external connections 1315, thereby shifting the material of the third external connections 1315 to a liquid phase. Once reflowed, the temperature is reduced in order to shift the material of the third external connections 1315 back to a solid phase, thereby bonding the second semiconductor device 1311 and the third semiconductor device 1313 to the interposer substrate 1301.

Once the second semiconductor device 1311 and the third semiconductor device 1313 have been bonded, an underfill material 1317 may be placed. The underfill material 1317 may reduce stress and protect the joints resulting from the reflowing of the third external connections 1315 and the external connections 1205. The underfill material 1317 may be formed by a capillary flow process after the first optical package 1200, the second semiconductor device 1311 and the third semiconductor device 1313 are attached.

After the underfill material 1317 has been placed, the second semiconductor device 1311, the third semiconductor device 1313, and the first optical package 1200 are encapsulated with an encapsulant 1319. In an embodiment, the encapsulant 1319 may be a molding compound, epoxy, or the like. The encapsulant 1319 may be applied by compression molding, transfer molding, or the like. The encapsulant 1319 is further placed in gap regions between the second semiconductor device 1311, the third semiconductor device 1313, and the first optical package 1200. The encapsulant 1319 may be applied in liquid or semi-liquid form and then subsequently cured.

A planarization process is performed on the encapsulant 1319 once the encapsulant 1319 has been placed. Once planarized, top surfaces of the encapsulant 1319, the second semiconductor device 1311, the third semiconductor device 1313, and the first optical package 1200 are substantially coplanar after the planarization process within process variations. The planarization process may be, for example, a chemical-mechanical polish (CMP), a grinding process, or the like. In some embodiments, the planarization may be omitted.

Once the second semiconductor device 1311, the third semiconductor device 1313 and the first optical package 1200 have been bonded to the interposer substrate 1301, the interposer substrate 1301 may be bonded to a second substrate 1321 with, e.g., the second external connectors 1309. In an embodiment the second substrate 1321 may be a package substrate, which may be a printed circuit board (PCB) or the like. The second substrate 1321 may include one or more dielectric layers and electrically conductive features, such as conductive lines and vias. In some embodiments, the second substrate 1321 may include through-vias, active devices, passive devices, and the like. The second substrate 1321 may further include conductive pads formed at the upper and lower surfaces of the second substrate 1321.

The second external connectors 1309 may be aligned with corresponding conductive connections on the second substrate 1321. Once aligned the second external connectors 1309 may then be reflowed in order to bond the second substrate 1321 to the interposer substrate 1301. However, any suitable bonding process may be used to connect the interposer substrate 1301 to the second substrate 1321.

Additionally, the second substrate 1321 may be prepared for further processes by forming fourth external connections 1323 on an opposite side of the second substrate 1321 from the first optical package 1200. In an embodiment the fourth external connections 1323 may be formed using similar processes and materials as the second external connectors 1309. However, any suitable materials and processes may be utilized.

FIG. 13 additionally illustrates placement of an optical fiber 1325 which is utilized as an optical input/output port to the optical interposer 100. In an embodiment the optical fiber 1325 is placed so as to optically couple the optical fiber 1325 and an optical input such as a grating coupler (not separately illustrated in FIG. 13) located within the optical interposer 100. By positioning the optical fiber 1325 in optical connection with the grating coupler, optical signals leaving the optical fiber 1325 are directed into the optical components of the optical interposer. Similarly, the optical fiber 1325 is positioned so that optical signals leaving the optical interposer 100 is directed into the optical fiber 1325 for transmission. However, any suitable location may be utilized.

The optical fiber 1325 may be held in place using, e.g., an optical glue 1327. In some embodiments, the optical glue 1327 comprises a polymer material such as epoxy-acrylate oligomers, and may have a refractive index between about 1 and about 3. However, any suitable material may be utilized.

By embedding the laser die 600 into the first semiconductor device 700, space that is usually used for the integration of a bulky and over-packaged external laser can be saved while still allowing the first semiconductor device 700 to be large enough to guarantee large driving power capacity for underlying circuits. Additionally, by integrating the laser die 600 into the first semiconductor device 700 while the first semiconductor device 700 is still part of a wafer, both the first semiconductor device 700 and the laser die 600 can be bonded to the optical interposer 100 while the optical interposer 100 is still in wafer form, saving the efforts for separate die/chip bonding and greatly reducing the costs associated with bonding. As such, laser integration remains a cost effective option instead of being hindered by full wafer coverage.

Figure 14:
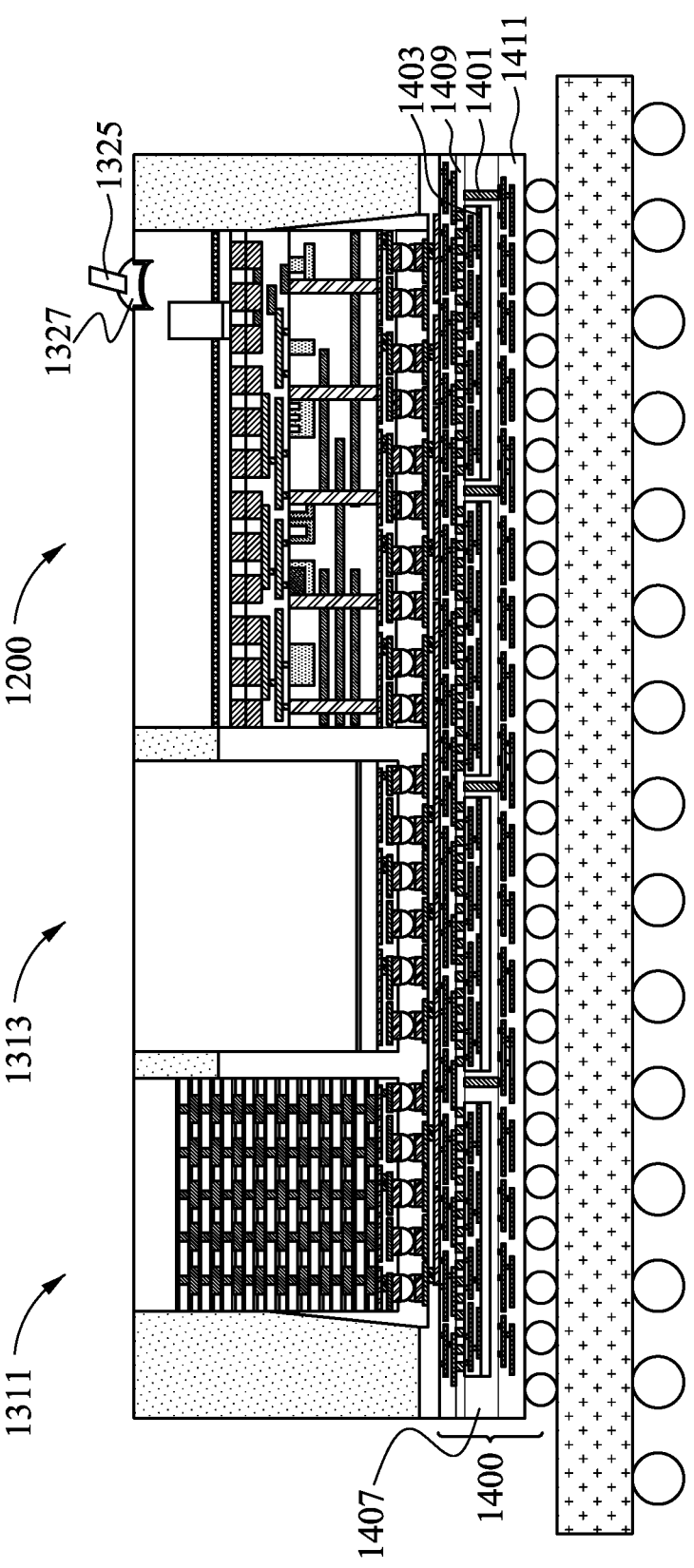

FIG. 14 illustrates a variation where the first optical package 1200, the second semiconductor device 1311, and the third semiconductor device 1313 are bonded to an integrated fan-out substrate 1400 with, e.g., local silicon interposers. In this embodiment InFO TDVs 1401 are initially formed (using, e.g., a photolithographic masking and plating process) on a substrate (not separately illustrated) adjacent to fourth semiconductor devices 1403, which may be local silicon interposers or else may be similar to the second semiconductor device 1311 and/or the third semiconductor device 1313. Once in place, the InFO TDVs 1401 and the fourth semiconductor devices 1403 are encapsulated with a second encapsulant 1407 (e.g., an organic layer similar to the encapsulant 1319), and fourth metallization layers 1409 (similar to the first metallization layers 501)

may be formed. The substrate may then be removed, and fifth metallization layers 1411 may be formed on an opposite side of the InFO TDVs 1401.

Once the InFO package 1400 has been formed, the second semiconductor device 1311 and the third semiconductor device 1313 may be bonded to the InFO package 1400 using the third external connections 1315 and the first optical package 1200 is attached using the external connections 1205. Additionally, the InFO package 1400 may be bonded to the second substrate 1321 using, e.g., the second external connectors 1309, and the fourth external connections 1323 are formed on the second substrate 1321. However, any suitable processes and structures may be utilized.

FIGS. 15A-15E illustrate another use of the first semiconductor device 700 wherein the first opening 717 is formed, but in which the laser die 600 is not subsequently placed within the first opening 717 and is separable from the first semiconductor device 700. Rather, in this embodiment, the first opening 717 is filled with one or more materials to help signals incoming through the lens 713 traverse through the first semiconductor device 700.

Figure 15A:
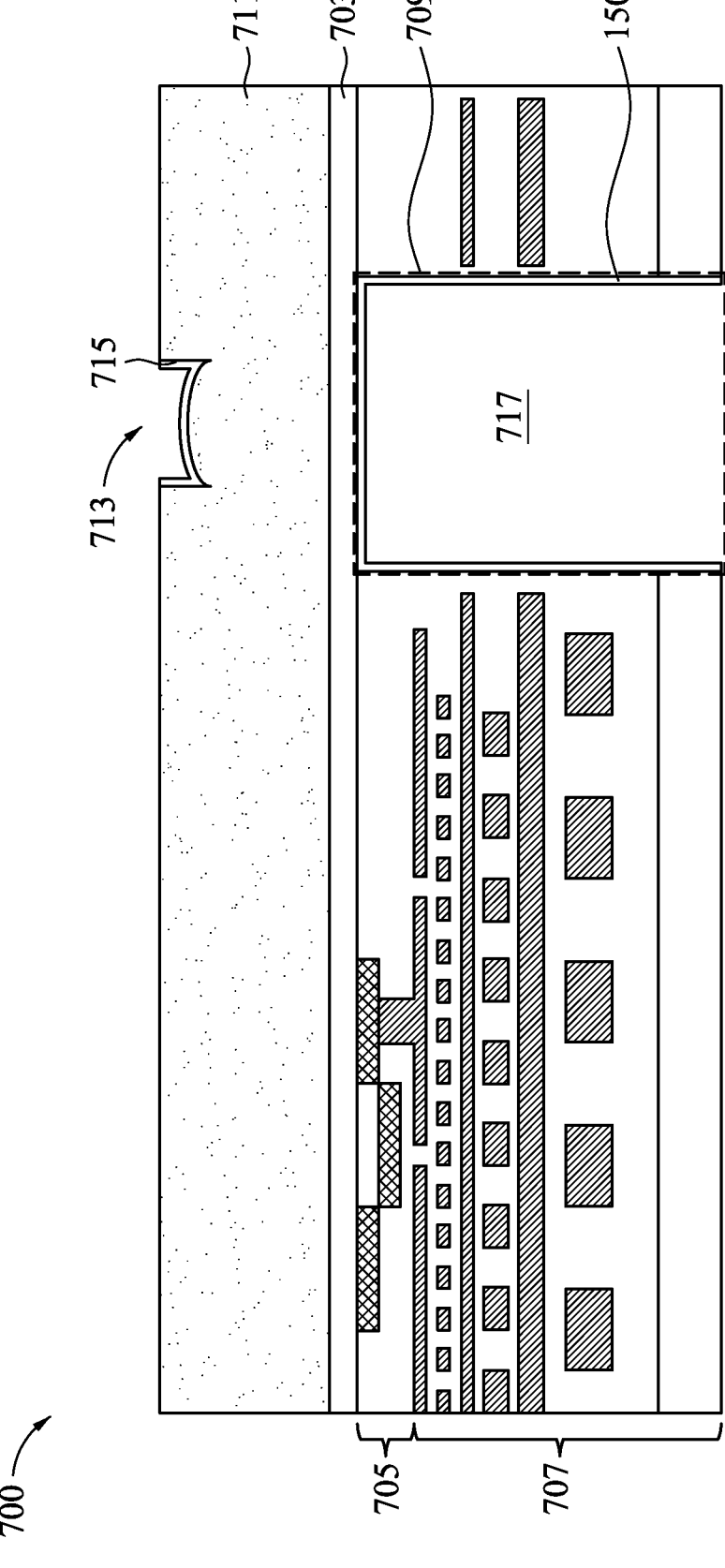
FIGS. 15A-15G illustrate an embodiment in which an opening in the first semiconductor device is filled, in accordance with some embodiments.

Looking first at FIG. 15A, FIG. 15A illustrates the structure of FIG. 7D, wherein the first opening 717 has already been formed within the first semiconductor device 700. In this embodiment, however, instead of placing the laser die 600 in the first opening 717, the process continues by depositing an anti-reflection coating 1501 on the sidewalls and bottom surfaces of the first opening 717. In an embodiment the anti-reflection coating 1501 may be any of one or more materials, or combination of materials that helps to prevent undesired reflection of incoming or outgoing light, such as titanium oxide, aluminum oxide, silicon oxide, silicon nitride, silicon, combinations of these, or the like. Additionally, the anti-reflection coating 1501 may be deposited using a deposition method such as chemical vapor deposition, atomic layer deposition, physical vapor deposition, combinations of these, or the like.

Figure 15B:
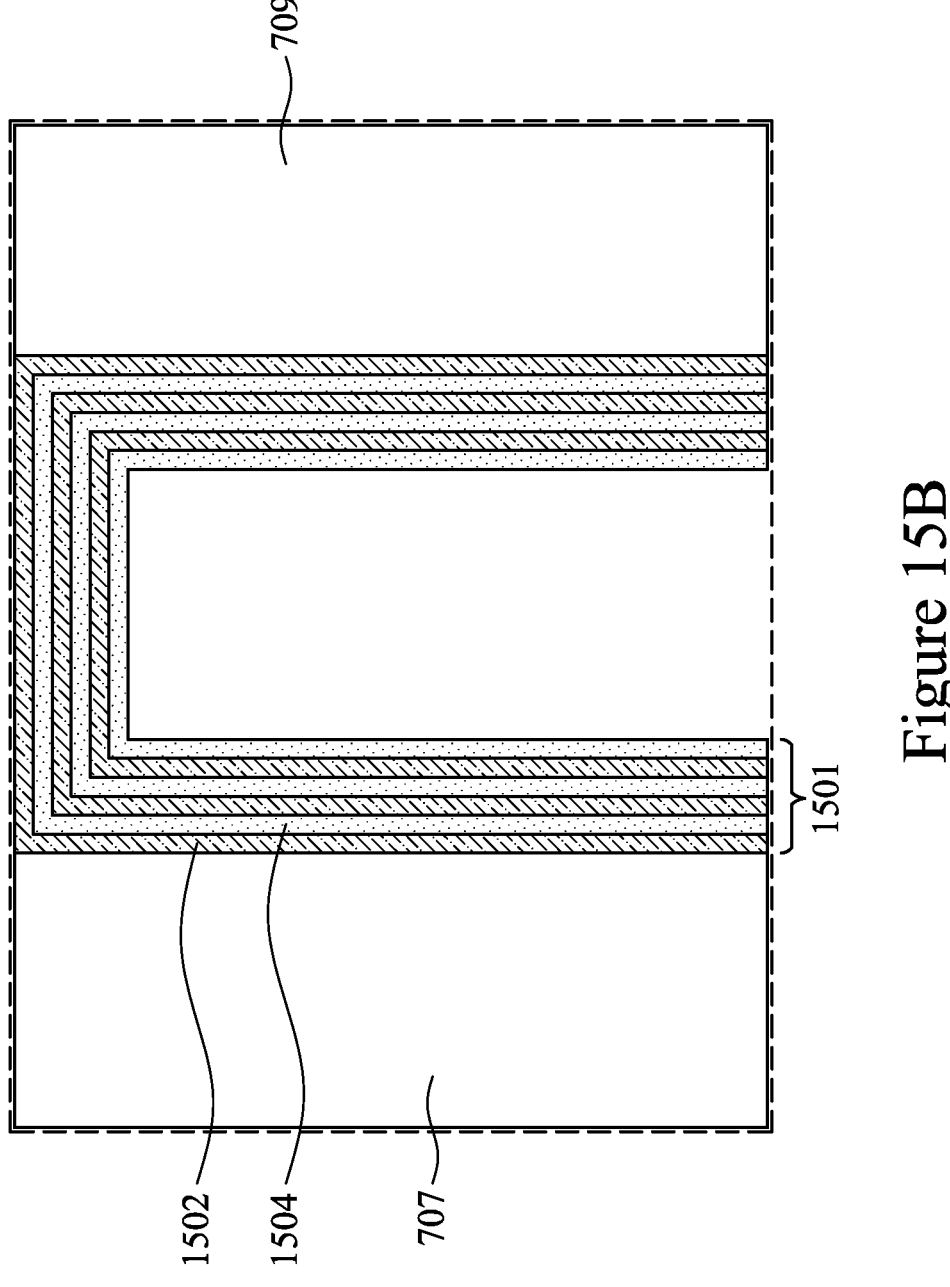

FIG. 15B illustrates a close up view of the first region 709 and the anti-reflection coating 1501 in which the anti-reflection coating 1501 comprises multiple layers of different materials. In this particular embodiment the anti-reflection coating 1501 comprises three sets of alternating material layers, for a total of six layers. In each set of alternating materials, there is a first layer 1502 of a first material such as silicon nitride and a second layer 1504 of a second material such as silicon oxide. However, any suitable materials, and any suitable number of layers of different materials, may be utilized.

Figure 15C:
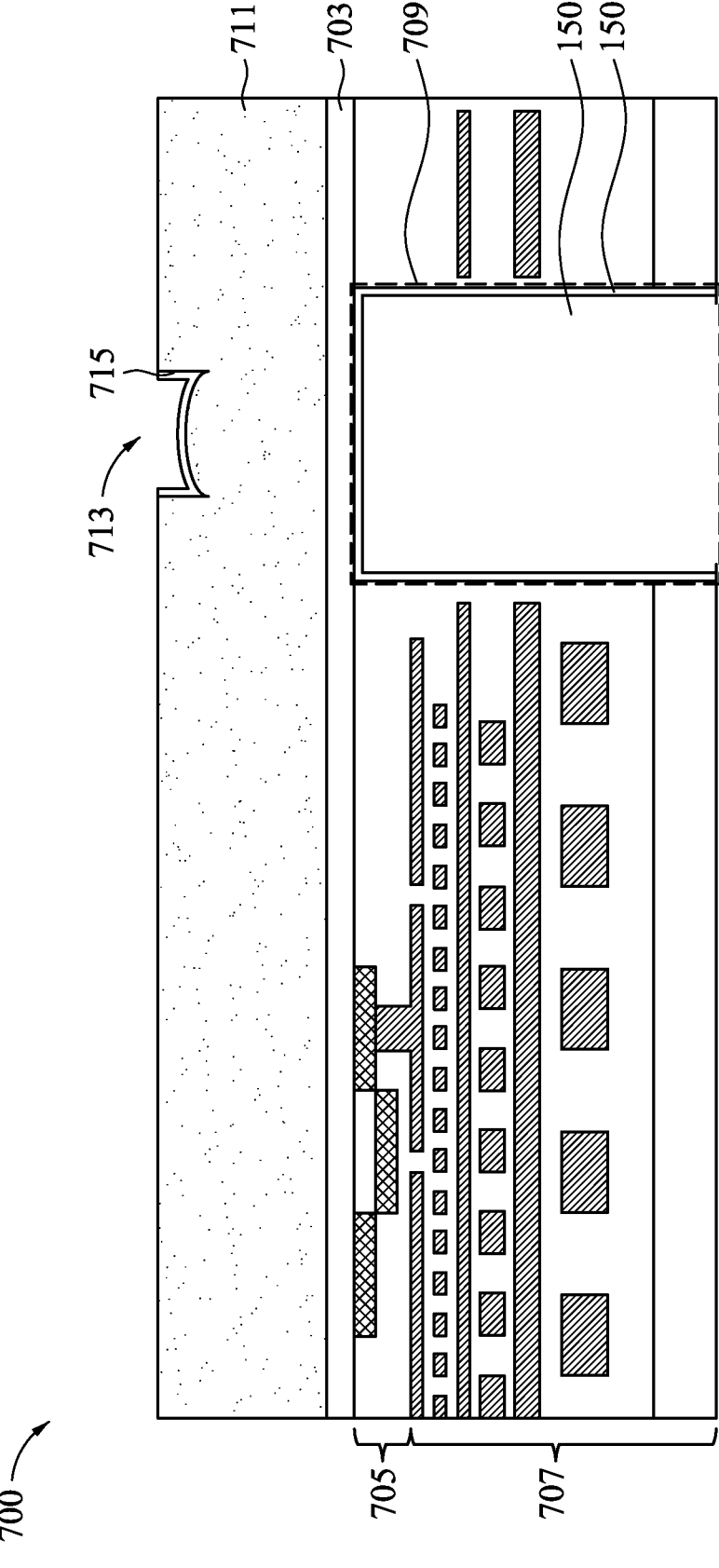

FIG. 15C illustrates a deposition of a first fill material 1503 to fill and/or overfill the first opening 717. In an embodiment the first fill material 1503 is another material which helps incoming and outgoing light to traverse through the first semiconductor device 700, such as silicon oxide, BCB, SiON, combinations of these, or the like, deposited using a method such as chemical vapor deposition, atomic layer deposition, physical vapor deposition, flowable chemical vapor deposition, combinations of these, or the like. However, any suitable material and any suitable deposition method may be utilized.

Once the first fill material 1503 has been deposited to fill and/or overfill the first opening 717, the first fill material 1503 may be planarized in order to remove undesired materials of the anti-reflective coating 1501 and the first fill material 1503 from outside of the first opening 717. In an embodiment the planarization process may be a chemical mechanical polishing process. However, any suitable planarization process, such as a grinding process or even a series of one or more etching processes, may be used.

FIG. 15C also illustrates that, because the planarization process may remove different materials at different rates, the planarization process may cause undesired damages. For example, in some embodiments in which the planarization process removes the first fill material 1503 at a greater rate than the exposed materials of the interconnect structure 707, a recess or dish may occur within the first fill material 1503 during the planarization process.

Figure 15D:
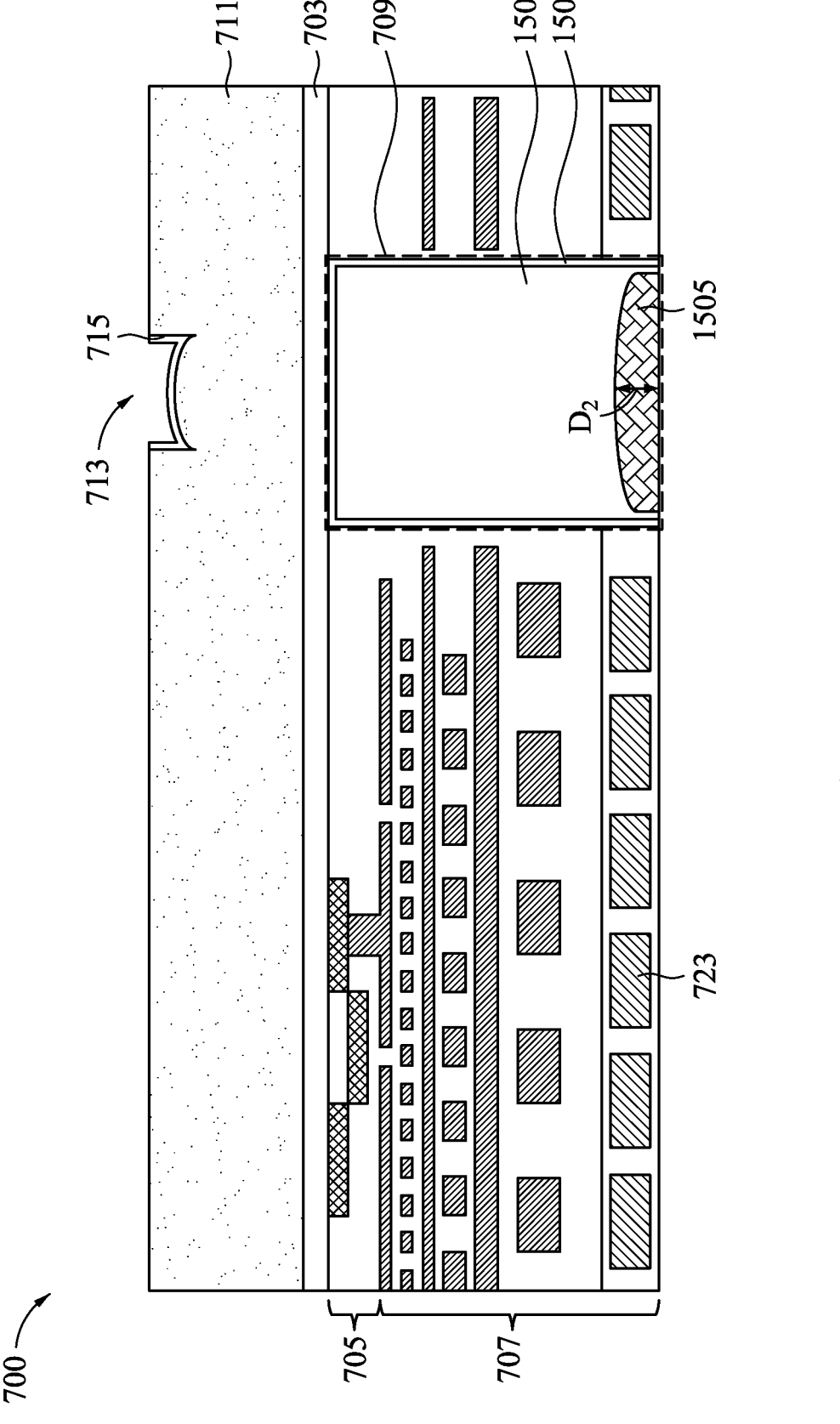

FIG. 15D illustrates a filling of the recess or dish in order to make a planar surface for subsequent manufacturing processes. In an embodiment the recess may be filled with a second fill material 1505 that works to both fill the recess as well as still allow light to traverse through the first semiconductor device 700, such as a dielectric material like SiN, SiON, or BCB. The second fill material 1505 may be deposited using a chemical vapor deposition process, an atomic layer deposition process, a physical vapor deposition process, combinations of these, or the like, and then the material of the second fill material 1505 may be planarized with the interconnect structure 707. However, any suitable methods and materials may be used.

In an embodiment the second fill material 1505, once it has been planarized with the rest of the first semiconductor device 700, has a second depth $D_2$ sufficient to fill the recess formed by the deposition of the first fill material 1503. In an embodiment the second depth $D_2$ may be between about 0.1 μm and about 1 μm. However, any suitable depth may be utilized.

FIG. 15D additionally illustrates that, once the second fill material 1505 has been formed, the second bond pads 723 may be formed. In an embodiment the second bond pads 723 may be formed as described above with respect to FIG. 7G. However, any suitable method of formation may be used.

Figure 15E:
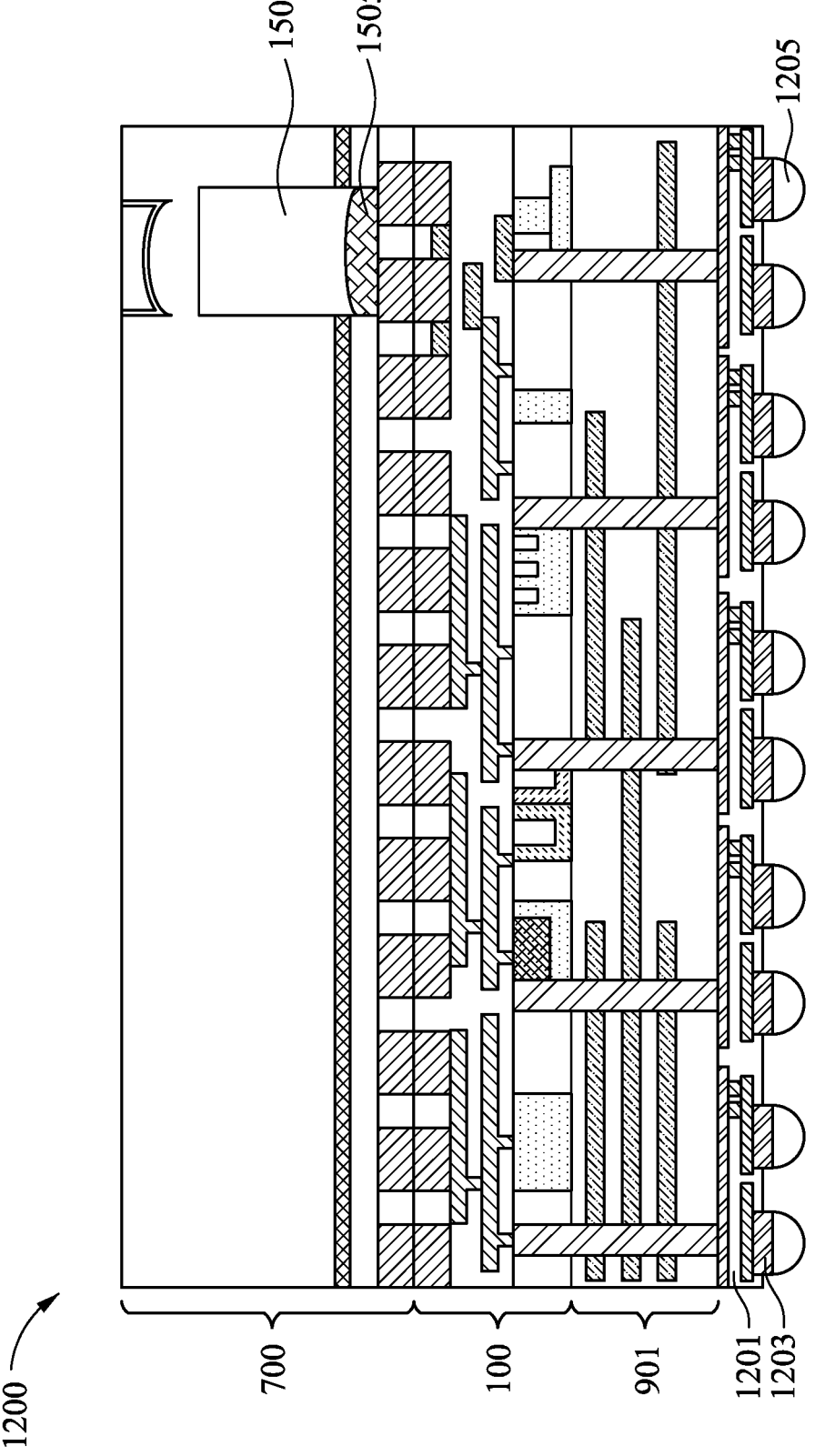

FIG. 15E illustrates a bonding of the first semiconductor device 700 (without the laser die 600 but with the second fill material 1505) to the optical interposer 100 and a formation of the second active layer 901 to form this embodiment of the first optical package 1200. In an embodiment the first semiconductor device 700 may be bonded to the optical interposer 100 as described above with respect to FIG. 8, such as by using a dielectric-to-dielectric and a metal-to-metal bonding process, and further processing may be performed as described above with respect to FIGS. 9-12. However, any suitable methods of manufacturing may be utilized.

Figure 15F:
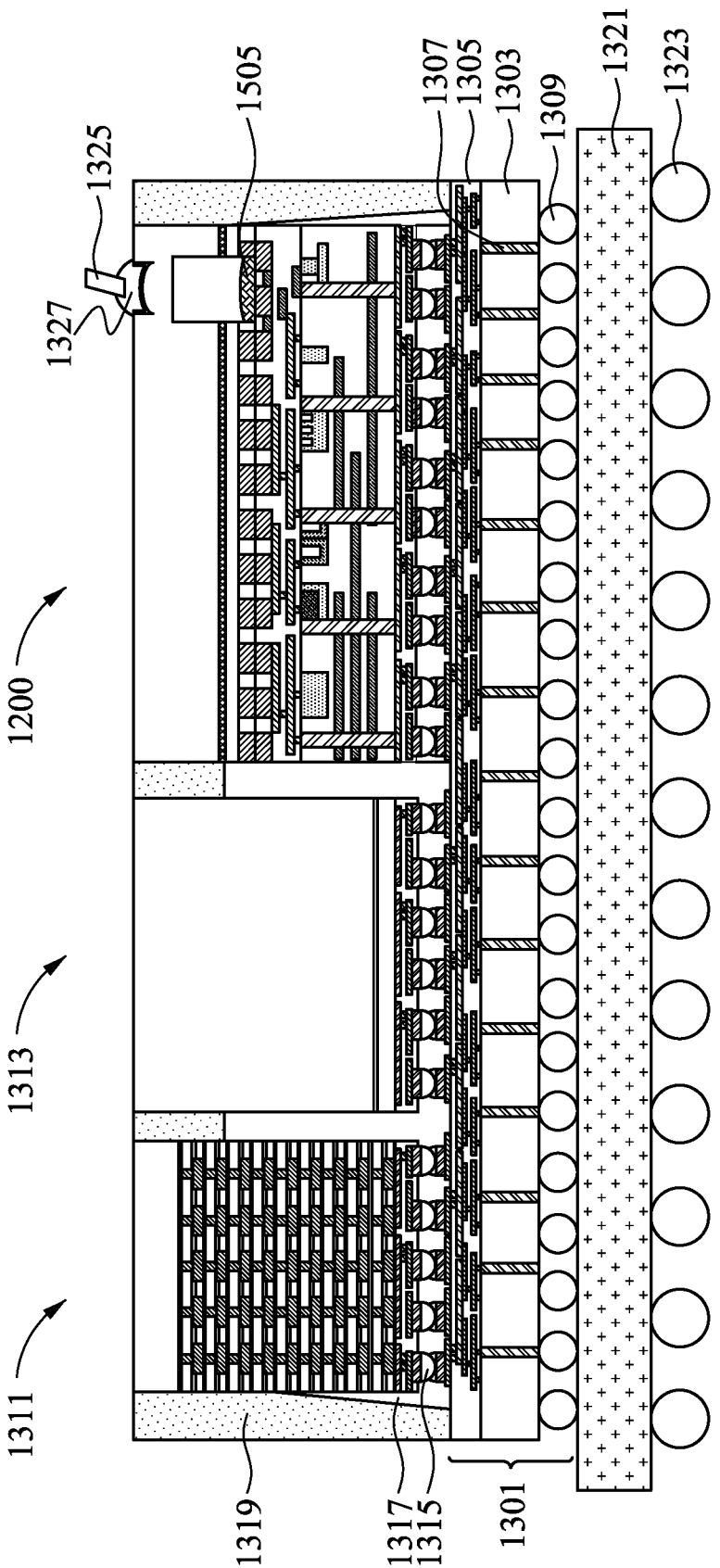
Figure 15G:
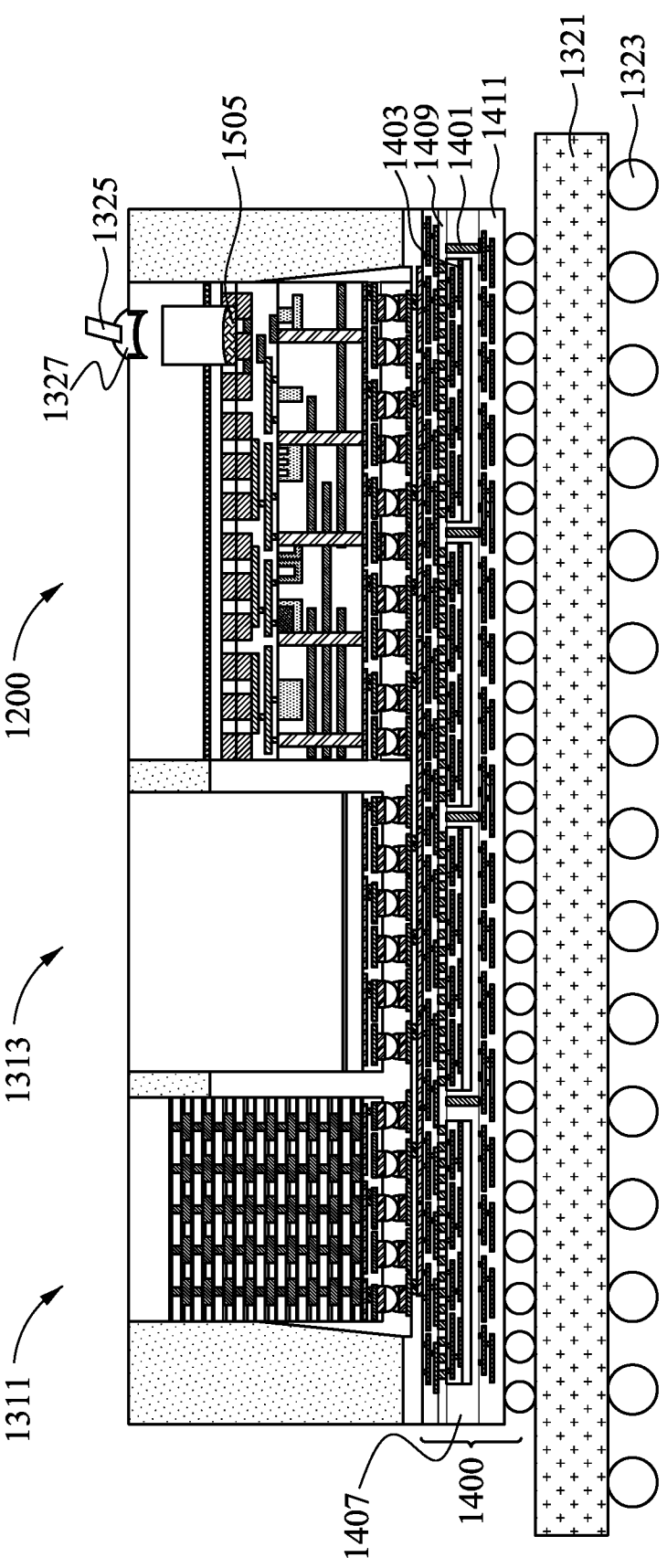

FIGS. 15F-15G illustrate a bonding of the first optical package 1200 to the interposer substrate 1301 (in FIG. 15F) and the InFO package 1400 (in FIG. 15G). In an embodiment the first optical package 1200 may be bonded as described above with respect to FIGS. 13 and 14, respectively. However, any suitable methods or structures may be utilized.

Figure 16A:
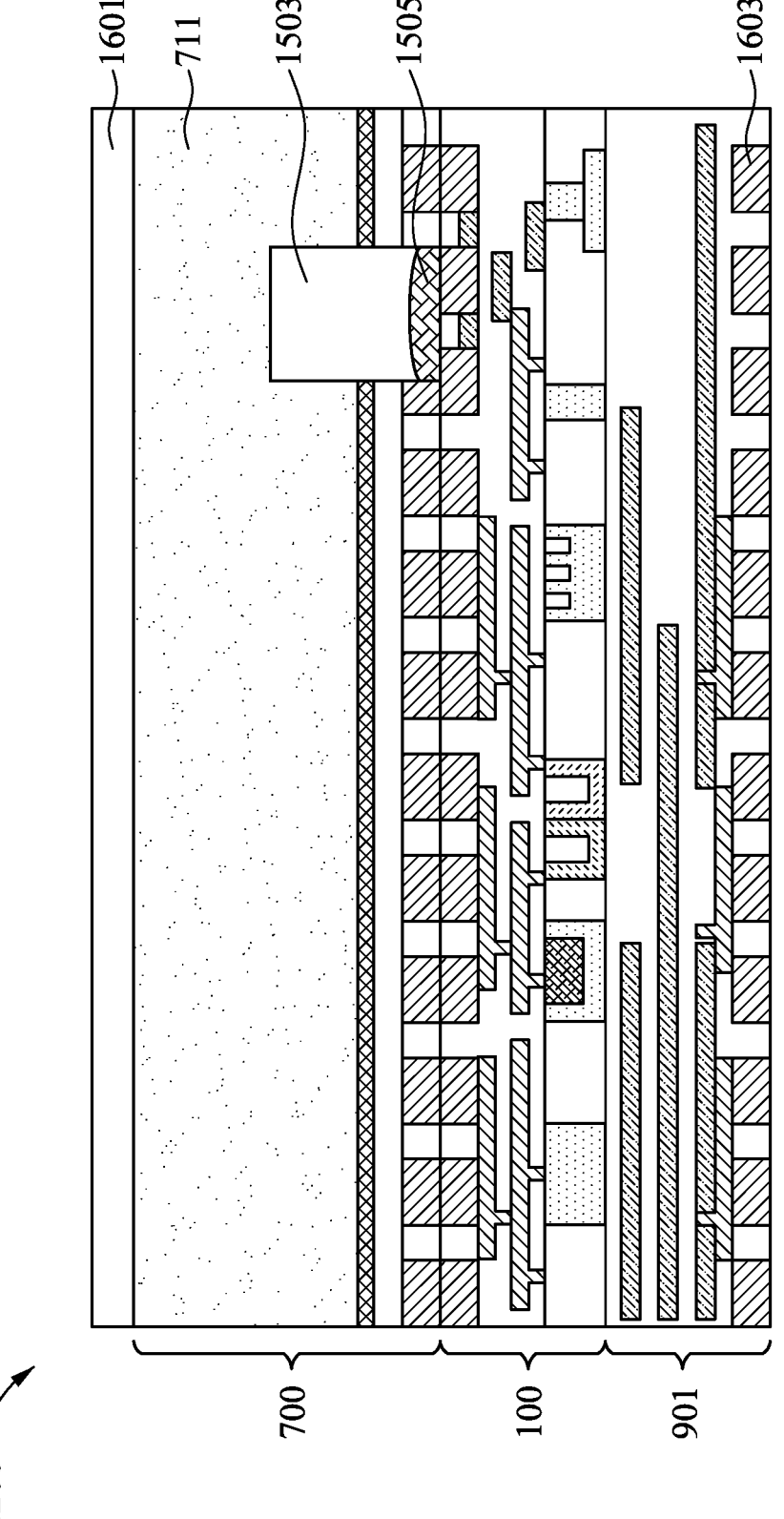
FIGS. 16A-16B illustrate a fusion bonding process with a wire bond, in accordance with some embodiments.

FIG. 16A illustrates yet another embodiment in which the first opening 717 is filled with the first fill material 1503, but in which the first optical package 1200 is bonded to the interposer substrate 1301 (see FIG. 16B) with a fusion bond instead of a dielectric-to-dielectric and metal-to-metal bond. In this embodiment the first optical package 1200 may be mostly manufactured as described above with respect to FIGS. 1-12. In this embodiment, however, the lens 713, the anti-reflective coating 715, the first through device vias 1001 and the external connections 1205 are not formed within or on the support substrate 711.

Rather, at any suitable point in the process, a bonding layer 1601 is formed along a backside of the support substrate 711. In an embodiment the bonding layer 1601 may be a material such as silicon oxide, SiN, SiNC, combinations of these, or the like, formed using a process such as chemical vapor deposition, atomic layer deposition, physical vapor deposition, oxidation, combinations of these, or the like. However, any suitable process and materials may be utilized.

Additionally, because the external connections 1205 as described above with respect to FIG. 12 are not formed in this embodiment, fourth bond pads 1603 are formed in order to provide electrical connections. In such an embodiment the fourth bond pads 1603 may be formed using similar materials and similar processes as the first bond pads 507, described above with respect to FIG. 5. However, any suitable methods and materials may be utilized.

Figure 16B:
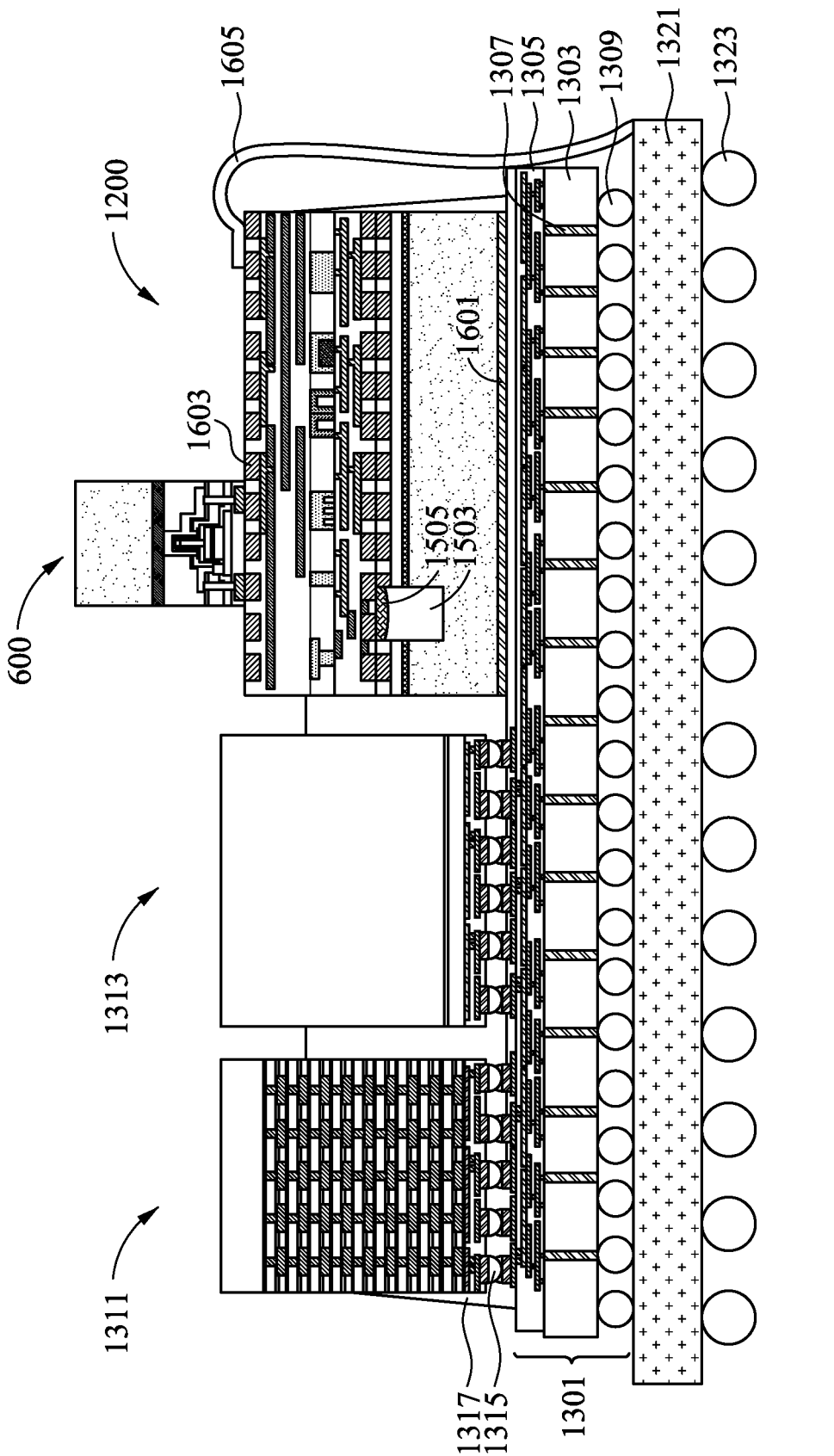

FIG. 16B illustrates that, once the bonding layer 1601 has been formed, the first optical package 1200 may be bonded to the interposer substrate 1301 using the bonding layer 1601 along with a bonding of the second semiconductor device 1311 and the third semiconductor device 1313. For example, in some embodiments the fusion bonding process may activate surfaces of the bonding layer 1601 and dielectric portions of the third metallization layers 1305, and then the bonding layer 1601 and dielectric portions of the third metallization layers 1305 are placed in physical contact to initiate the bonding process, and further strengthening of the bond may be performed. However, any other suitable attachment process, including using an adhesive, may be utilized.

Once the first optical package 1200 has been bonded to the interposer substrate 1301, the second semiconductor device 1311 and the third semiconductor device 1313 may also be bonded to the interposer substrate 1301. In an embodiment the bonding may be performed as described above with respect to FIG. 13, such as by using a dielectric-to-dielectric and metal-to-metal bonding process. However, any suitable bonding process may be utilized.

FIG. 16B additionally illustrates a bonding of the laser die 600 to the fourth bond pads 1603. In an embodiment the laser die 600 may be bonded to some of (but not all of) the fourth bond pads 1603 using, e.g., a dielectric-to-dielectric and metal-to-metal bonding process as described above with respect to FIG. 8. However, any suitable bonding process may be utilized.

FIG. 16B also illustrates a wire bond 1605 that may be utilized in order to electrically connect the first optical package 1200 to the second substrate 1321 through the fourth bond pads 1603. In an embodiment an electronic flame off (EFO) wand may be used to raise the temperature of a gold wire (not individually illustrated in FIG. 16B) within a capillary controlled by a wire clamp (also not individually illustrated in FIG. 16B). Once the temperature of the gold wire is raised to between about 150° C. and about 250° C., the gold wire is contacted to the fourth bond pads 1603 to form a first connection and then the gold wire is moved to the second substrate 1321 to form a second connection. Once connected, the remainder of the gold wire is separated from the connected portions to form the wire bonds 1605. The connection process may be repeated to form as many connections as desired.

Figure 17A:
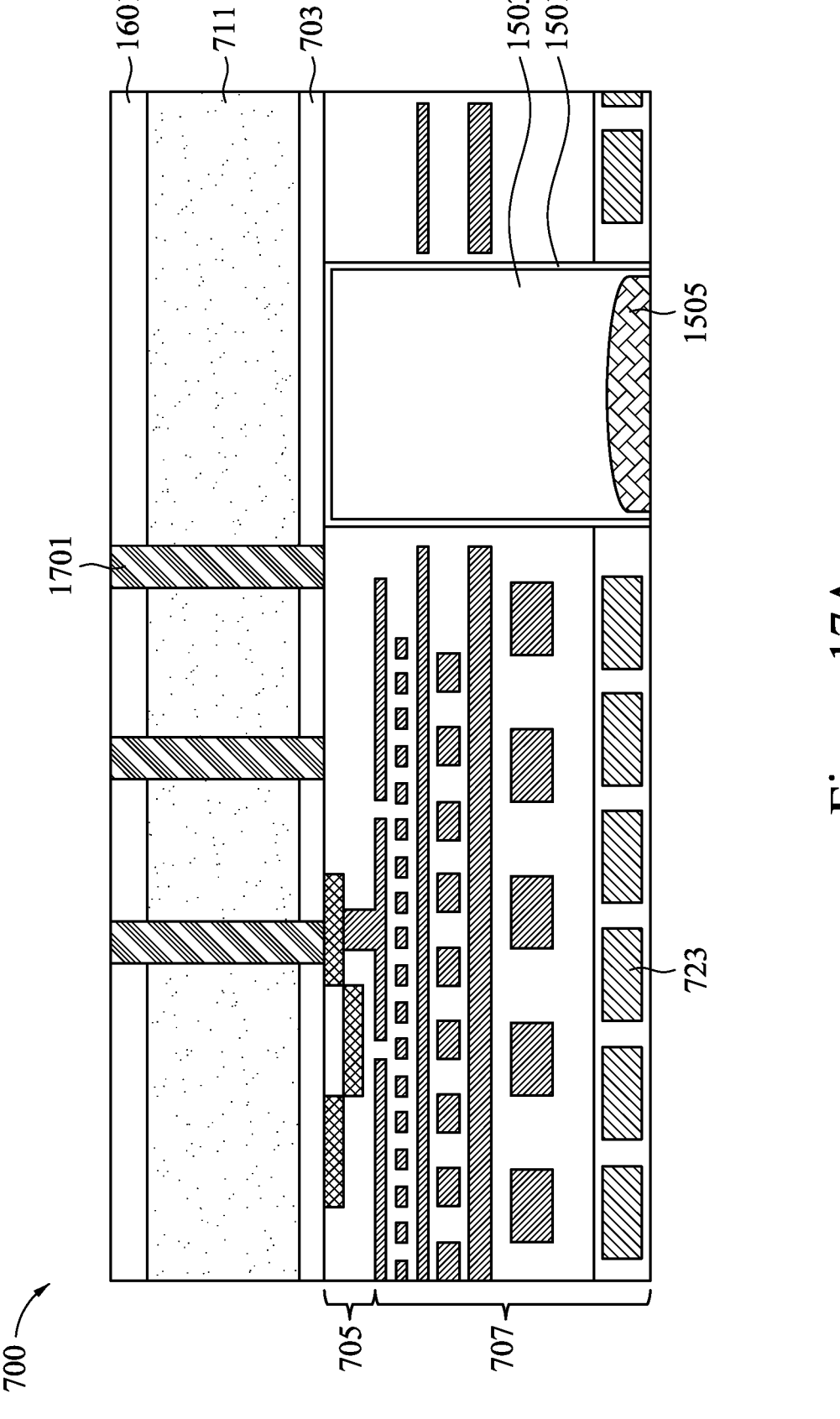
FIGS. 17A-17B illustrate a fusion bonding process with through vias, in accordance with some embodiments.
Figure 17B:
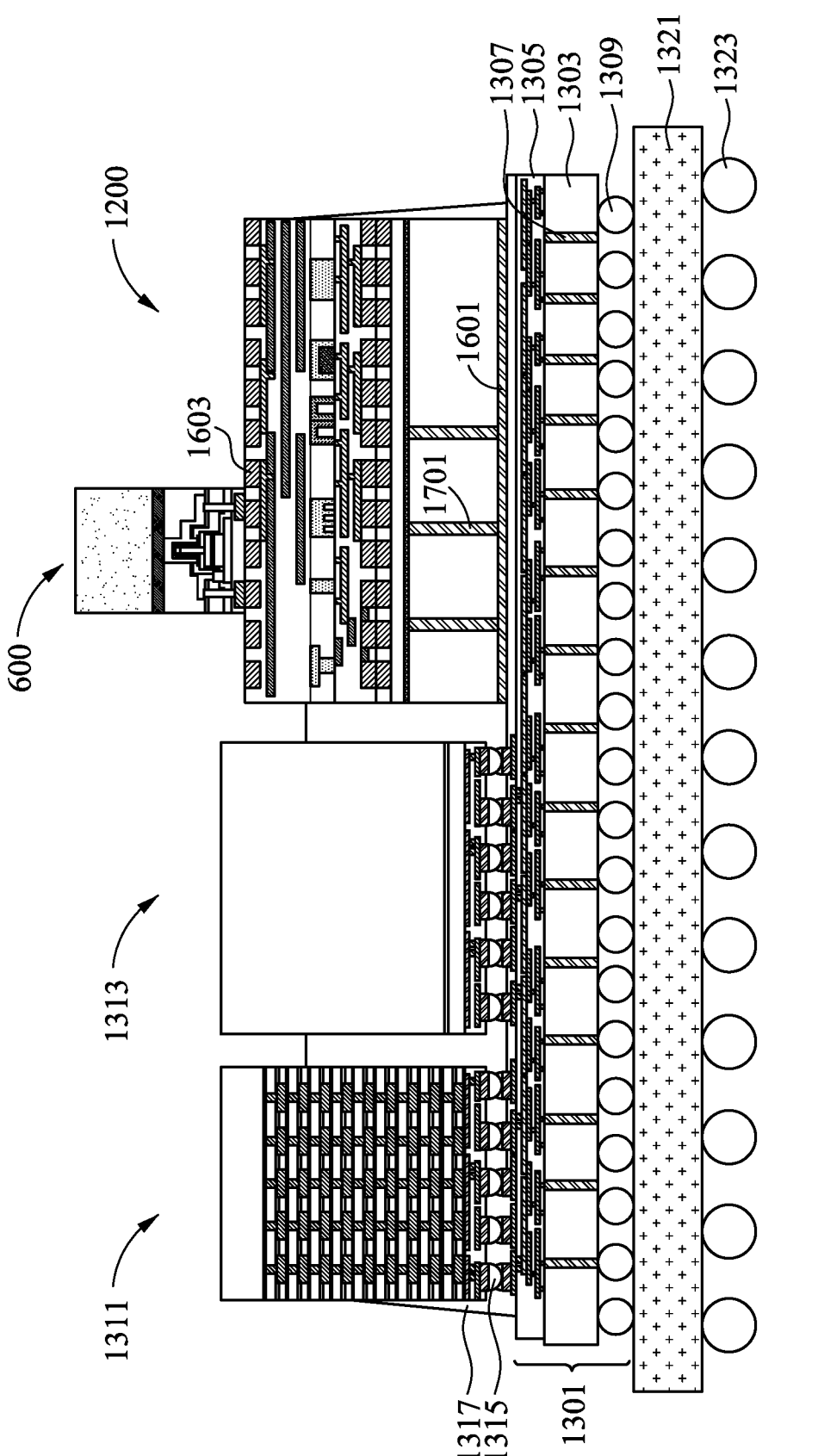

FIGS. 17A-17B illustrates another embodiment in which the laser die 600 is bonded to the fourth bond pads 1603 (not illustrated in FIG. 17A but illustrated in FIG. 17B). In this embodiment, however, instead of providing electrical connections using the wire bond 1605, electrical connections are provided using third through device vias 1701 that extend through the support substrate 711 and the bonding layer 1601. In an embodiment the third through device vias 1701 may be formed as described above with respect to the first through device vias 1001 in FIG. 10. However, any suitable methods and materials may be utilized.

FIG. 17B illustrates that, once the third through device vias 1701 have been formed, the first optical package 1200 may be bonded to the interposer substrate 1301. In this embodiment, however, instead of using a fusion bonding process (as described above with respect to FIG. 16B) the first optical package 1200 is bonded to the interposer substrate 1301 using a dielectric-to-dielectric and metal-to-metal bonding process, whereby the third through device vias 1701 electrically connect the third metallization layers 1305 to the rest of the first optical package 1200.

FIG. 17B additionally illustrates a bonding of the laser die 600 to the fourth bond pads 1603, and a bonding of the second semiconductor device 1311 and the third semiconductor device 1313 to the interposer substrate 1301. In an embodiment the laser die 600 may be bonded as described above with respect to FIG. 16B, while the second semiconductor device 1311 and the third semiconductor device 1313 may be bonded as described above with respect to FIG. 13. However, any suitable bonding processes may be utilized.

Figure 18A:
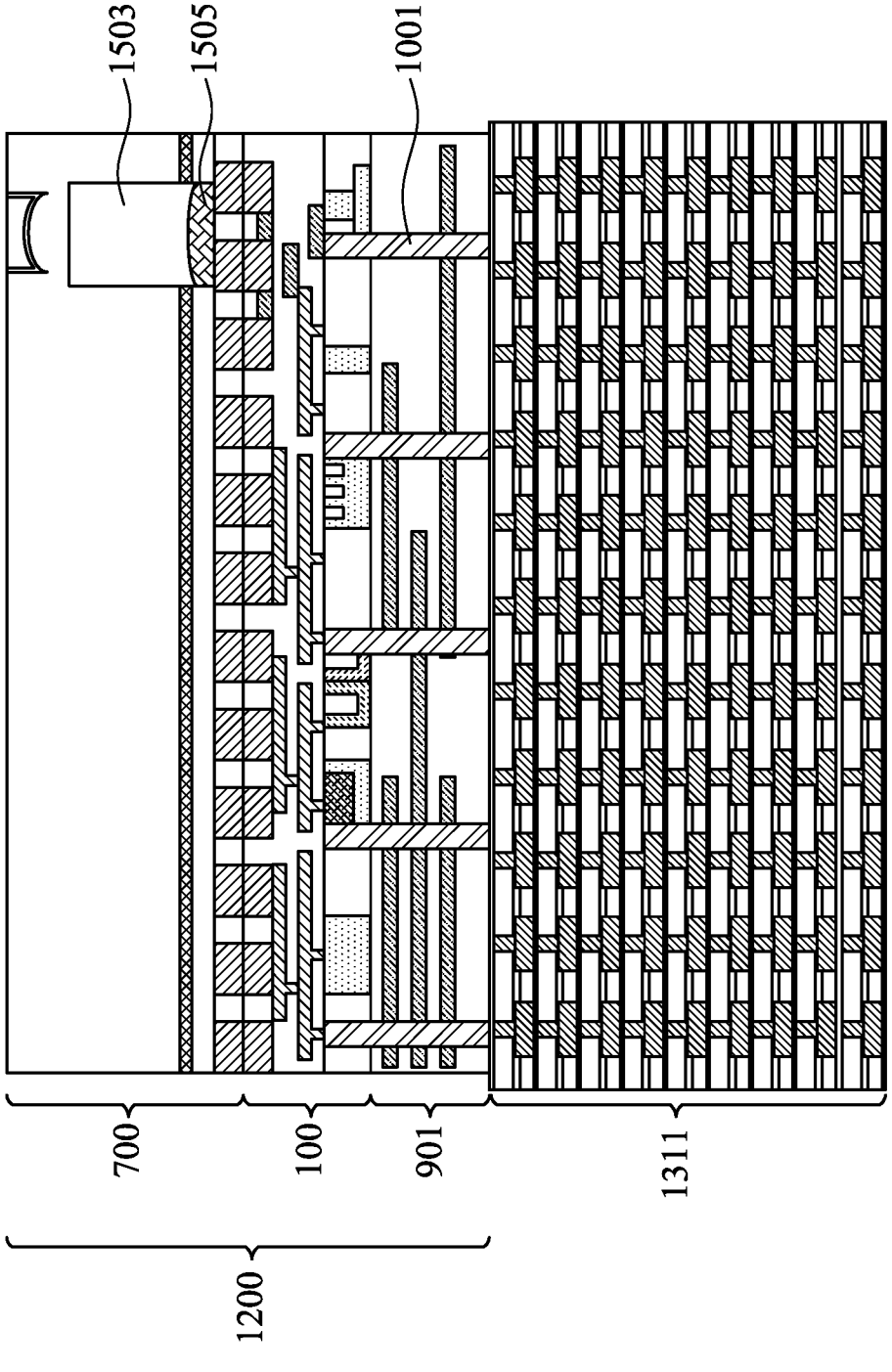
FIGS. 18A-18D illustrate bonding the optical interposer with a memory device, in accordance with some embodiments.
Figure 18B:
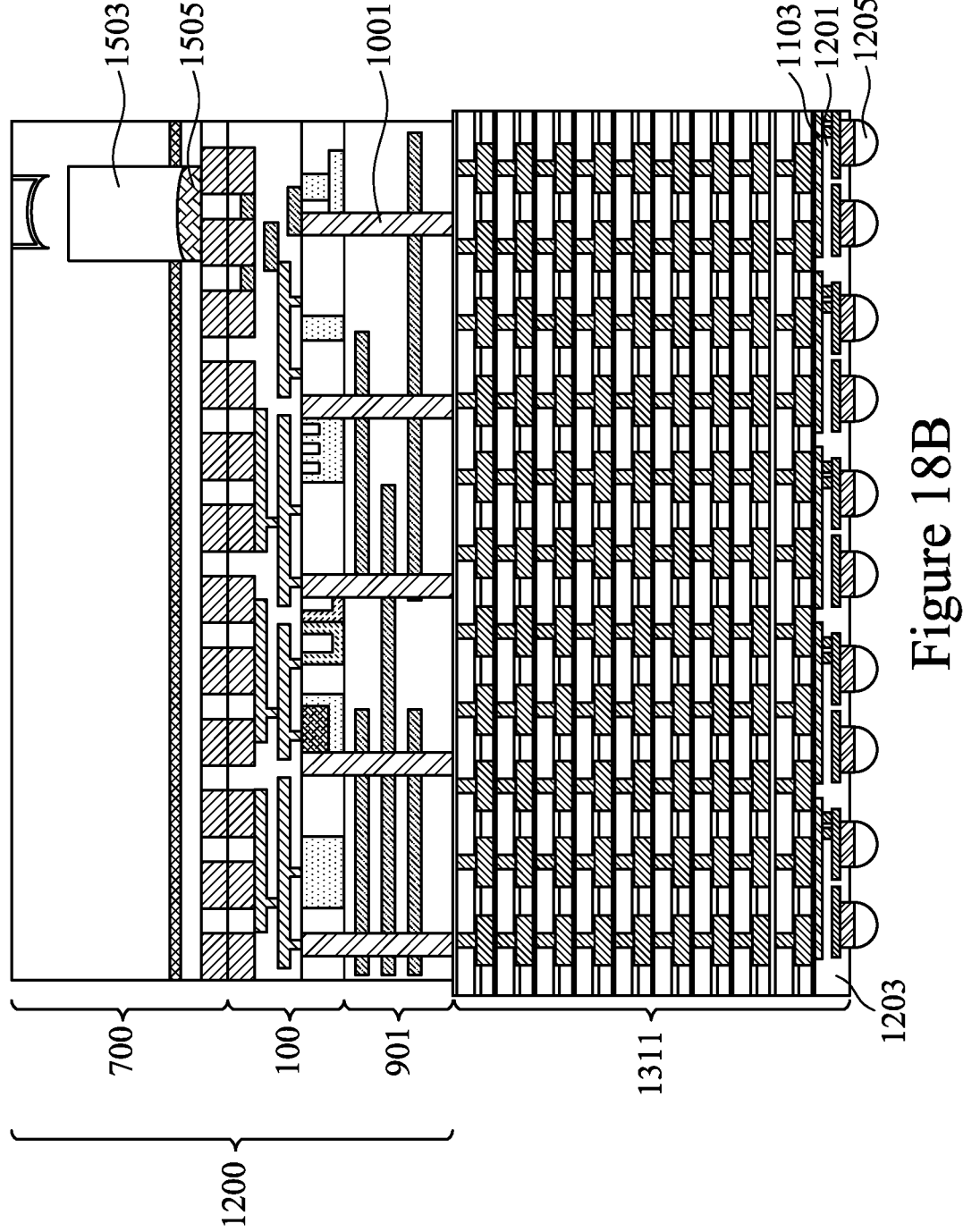

FIGS. 18A-18B illustrate yet another embodiment in which the first optical package 1200, instead of being bonded to the second semiconductor device 1311 through, e.g., the interposer substrate 1301, is instead bonded directly to the second semiconductor device 1311 in an optical stack. In this embodiment the first optical package 1200 is manufactured as described above with respect to FIG. 15E, but without the formation of the third bond pads 1103 through the external connections 1205.

Once the first optical package 1200 has been manufactured, the first optical package 1200 may be physically and electrically connected to the second semiconductor device 1311. In an embodiment the first optical package 1200 may be bonded to the second semiconductor device 1311 using, e.g., a dielectric-to-dielectric and metal-to-metal bond, whereby dielectric material of the second active layer 901 is bonded to dielectric material of the second semiconductor device 1311 and wherein the first through device vias 1001 are bonded to conductive portions of the second semiconductor device 1311. However, any suitable bonding process may be utilized.

FIG. 18B illustrates that, once the first optical package 1200 has been bonded to the second semiconductor device 1311, the third bond pads 1103, the second interconnect structure 1201, the underbump metallization layers 1203, and the external connections 1205 may be formed. In an embodiment the third bond pads 1103, the second interconnect structure 1201, the underbump metallization layers 1203, and the external connections 1205 may be manufactured as described above with respect to FIGS. 11 and 12. However, any suitable manufacturing processes may be utilized.

Figure 18C:
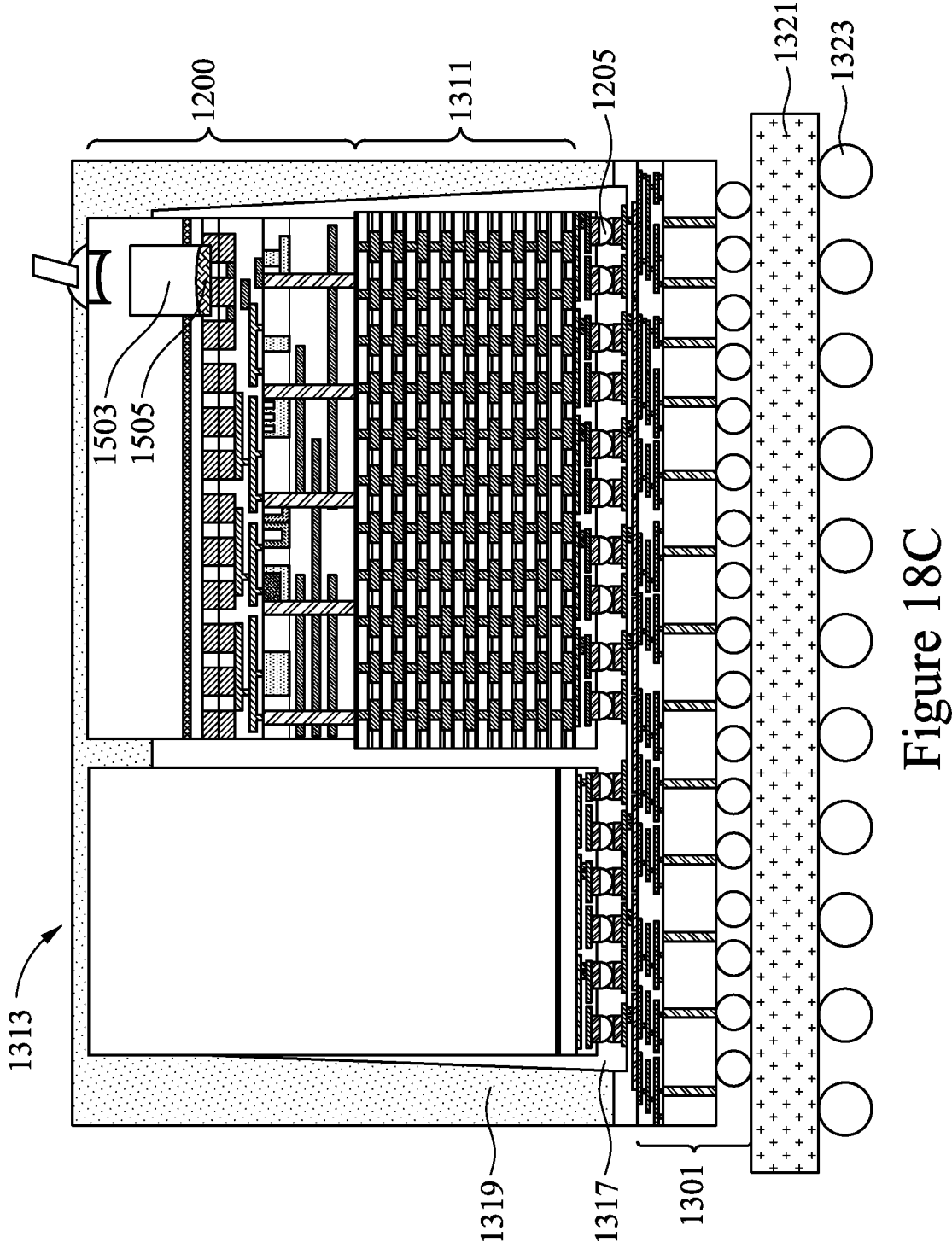
Figure 18D:
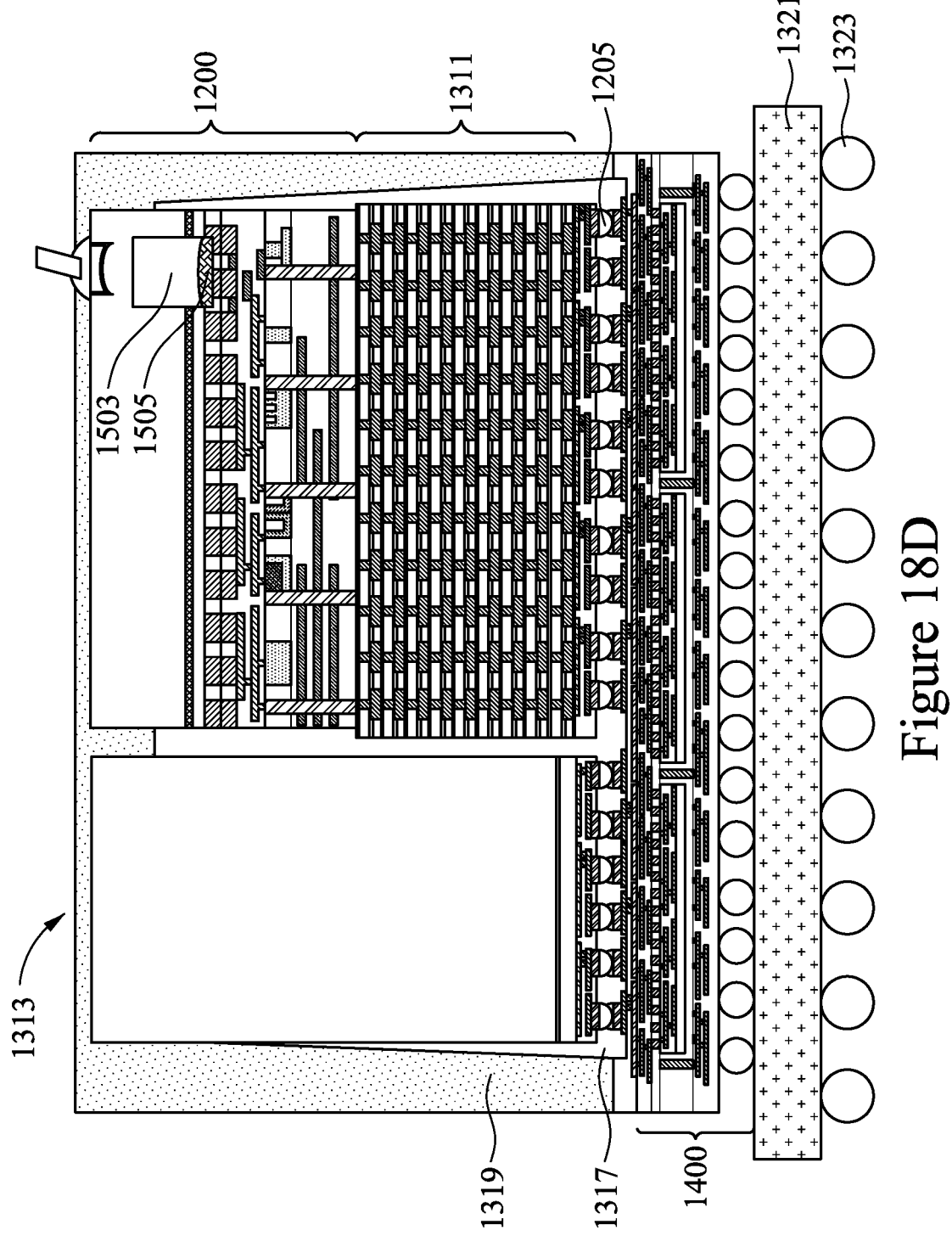

FIG. 18C and FIG. 18D illustrates a bonding of the second semiconductor device 1311 (with the first optical package 1200 bonded to it) and the third semiconductor device 1313 to the interposer substrate 1301 (in FIG. 18C) and the InFO package 1400 (in FIG. 18D). In an embodiment the second semiconductor device 1311 may be bonded as described above with respect to FIGS. 13 and 14, respectively. However, any suitable methods or structures may be utilized.

FIGS. 19A-19D illustrate yet another embodiment which incorporates the optical interposer 100, the first semiconductor device 700, and the second semiconductor device 1311. In this embodiment, however, the second semiconductor device 1311 is located between the optical interposer 100 and the first semiconductor device 700.

Figure 19A:
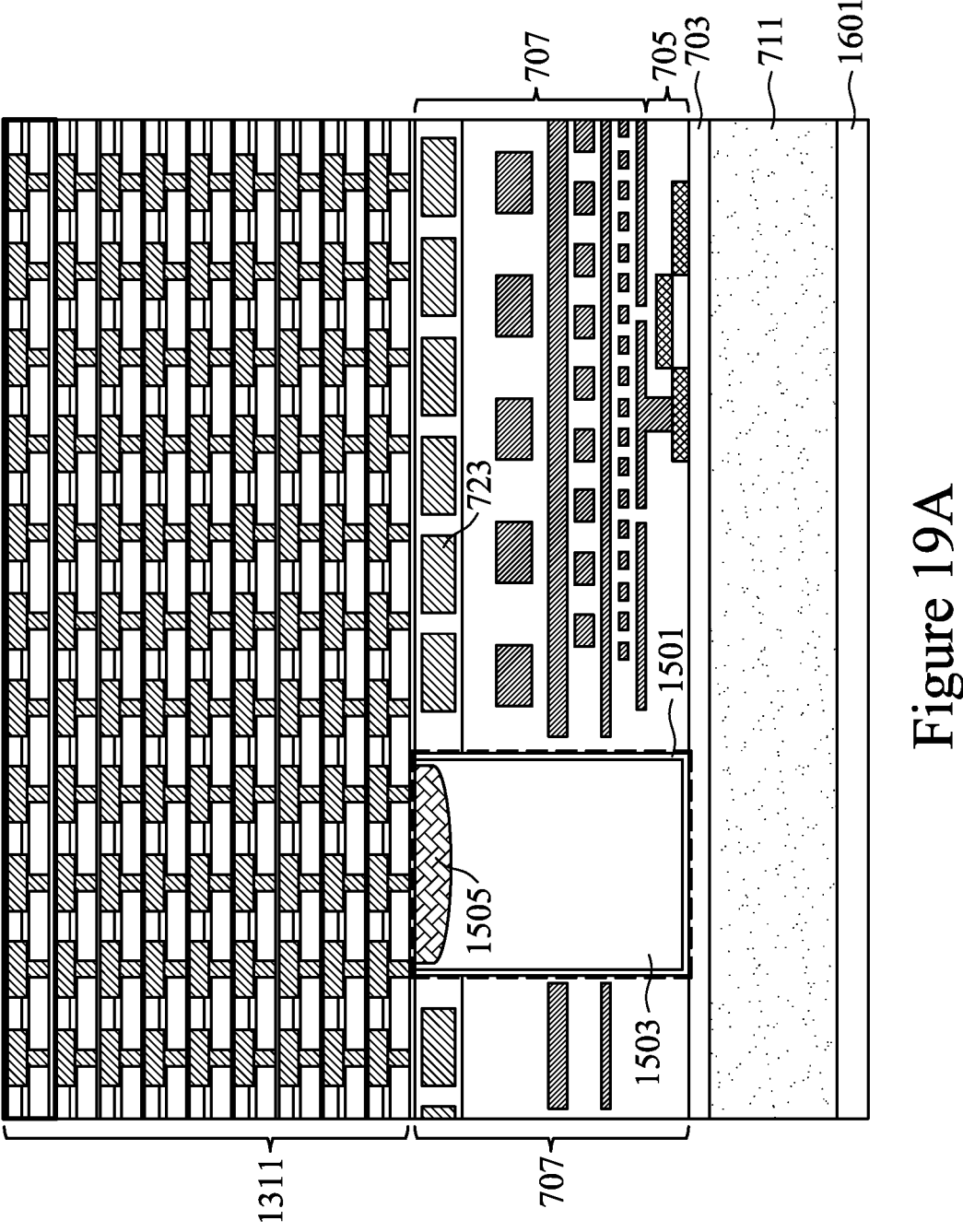
FIGS. 19A-19D illustrate locating the memory device between the optical interposer and the first semiconductor device, in accordance with some embodiments.

Looking first at FIG. 19A, the first semiconductor device 700 may be manufactured as described above with respect to FIG. 15D. In this embodiment, however, instead of being bonded to the optical interposer 100, the first semiconductor device 700 is bonded to the second semiconductor device 1311. For example, the first semiconductor device 700 may be bonded to the second semiconductor device 1311 using a dielectric-to-dielectric and metal-to-metal bonding process. However, any suitable bonding process may be utilized.

Figure 19B:
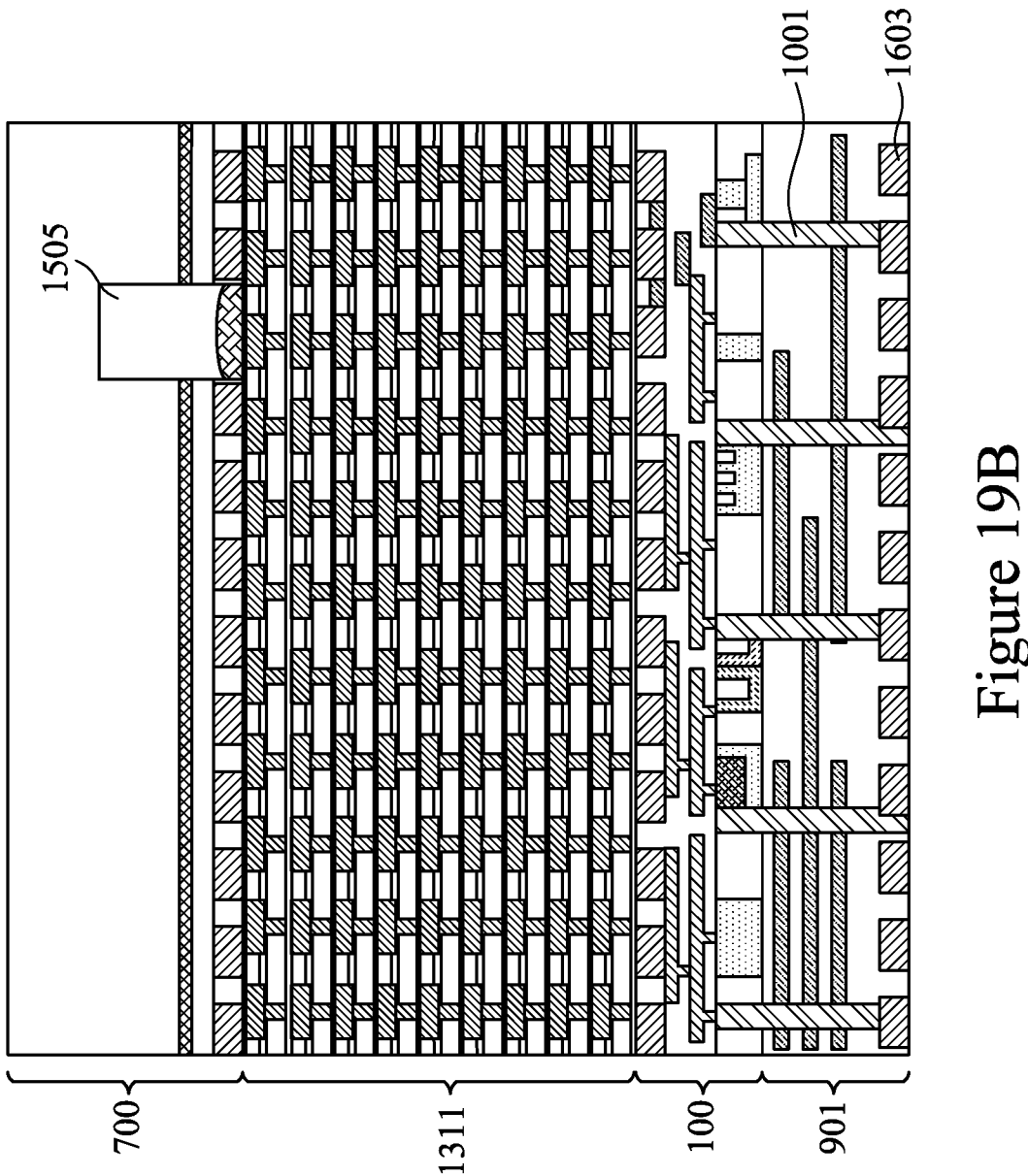

FIG. 19B illustrates that, once the first semiconductor device 700 has been bonded to the second semiconductor device 1311, the second semiconductor device 1311 may be bonded to the optical interposer 100. In an embodiment the second semiconductor device 1311 may be bonded to the optical interposer 100 using a dielectric-to-dielectric and metal-to-metal bonding process. However, any suitable bonding process may be utilized.

FIG. 19B additionally illustrates that, after the second semiconductor device 1311 is bonded to the optical interposer 100, the first substrate 101 may be removed and the second active layer 901, the first through device vias 1001, and the fourth bond pads 1603 may be formed. However, any suitable structures may be utilized.

Figure 19C:
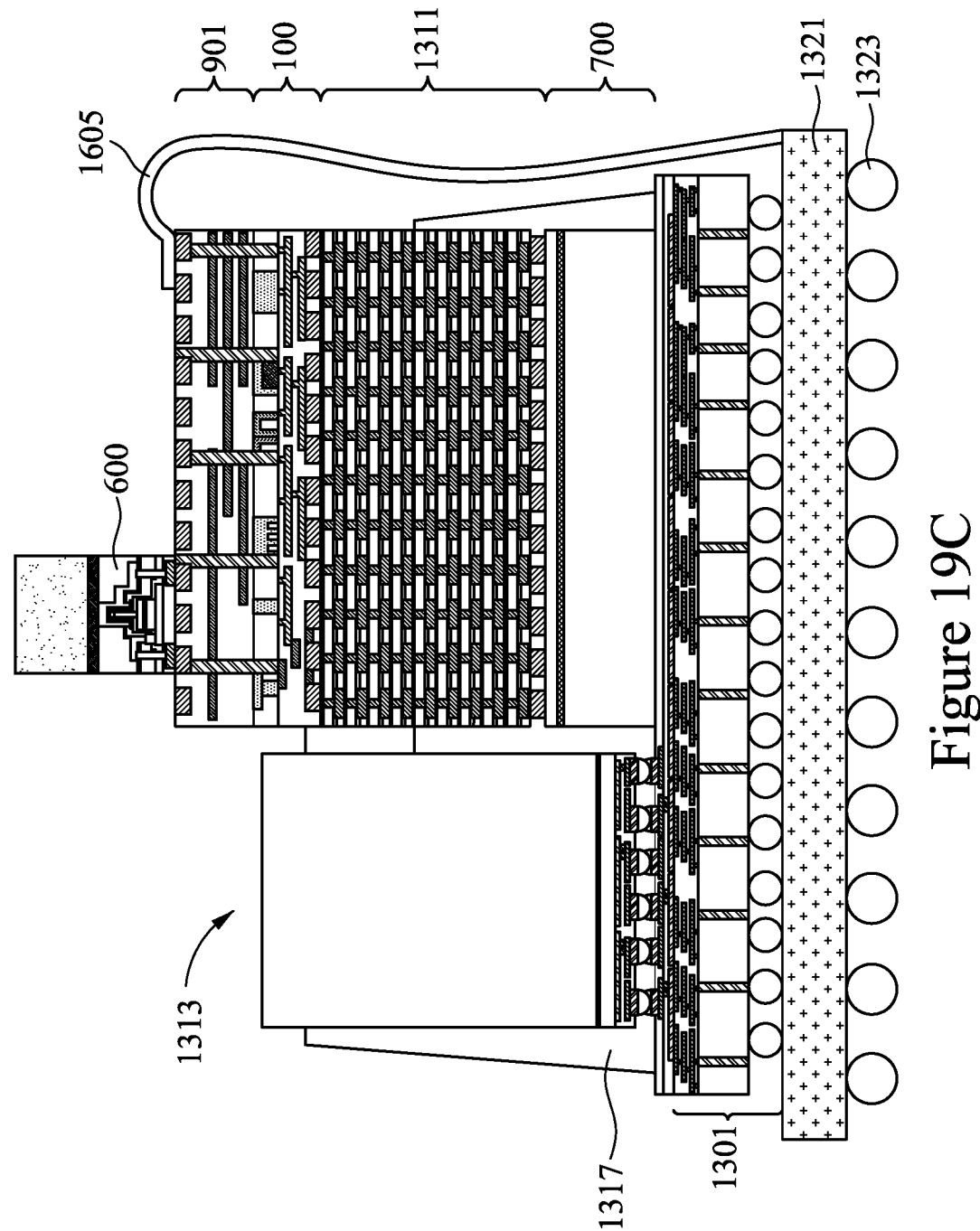

FIG. 19C illustrates that, once the optical interposer 100 has been bonded to the second semiconductor device 1311, the first semiconductor device 700 (and, hence, the second semiconductor device 1311 and the optical interposer 100) may be bonded to the interposer substrate 1301 (using, e.g., a fusion bond as described above with respect to FIG. 16B), the laser die 600 may be bonded to the optical interposer 100 (as described above with respect to FIG. 16B), the third semiconductor device 1313 may be bonded to the interposer substrate 1301 (as described above with respect to FIG. 13), the interposer substrate 1301 may be bonded to the second substrate 1321 (as described above with respect to FIG. 13), and the wire bond 1605 may be used to connect the second substrate 1321 and the first optical package 1200 (as described above with respect to FIG. 16). However, any suitable methods may be used.

Figure 19D:
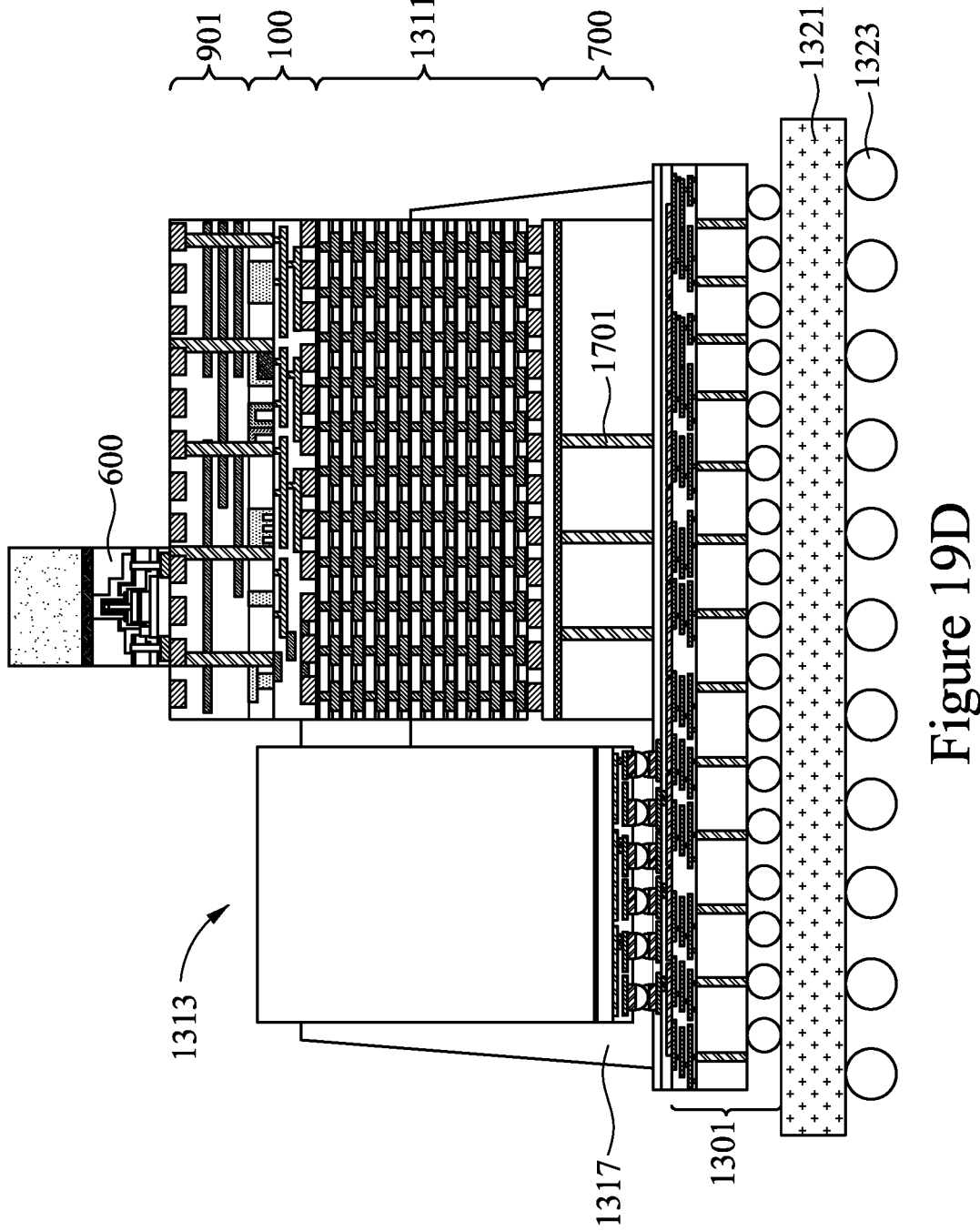

FIG. 19D illustrates yet another embodiment in which the second semiconductor device 1311 is located between the first semiconductor device 700 and the optical interposer 100. In this embodiment, however, the wire bond 1605 is not used to provide electrical connections, but the third through device vias 1701 are formed to extend through the support substrate 711 and the semiconductor substrate 703 (as described above with respect to FIG. 17A). As such, once the first semiconductor device 700 is bonded, the third through device vias 1701 provide the electrical connections between the first semiconductor device 700 and the interposer substrate 1301.

Of course, while a number of configurations have been presented in the above descriptions, these precise configurations are intended to be illustrative only and are not intended to limit the embodiments to these precise configurations. Rather, any suitable configurations, such as a stack of the first semiconductor device 700, the optical interposer 100, and the second semiconductor device 1311 (with the first semiconductor device 700 being bonded to the interposer substrate 1301) or another stack of the optical interposer 100, the first semiconductor device 700, and the second semiconductor device 1311 (with the optical interposer 100 being bonded to the interposer substrate 1301)

may be utilized, and all such configurations are fully intended to be included within the scope of the embodiments.

By incorporating the second semiconductor device 1311 into an optical stack with the optical interposer 100 and the first semiconductor device 700, a more efficient device may be obtained. In particular, signals between the optical interposer 100, the first semiconductor device 700, and the second semiconductor device 1311 have a shorter distance to travel. By reducing the distance required for communication, a faster transmission with less power can be obtained.

In an embodiment, a method of manufacturing an optical device includes: forming a first semiconductor device as a part of a first wafer, the first semiconductor device comprising a layer of active devices and an interconnect structure; forming a first opening at least partially through the interconnect structure and the layer of active devices of the first semiconductor device; filling the first opening; and bonding the first semiconductor device to an optical interposer while the first semiconductor device remains the part of the first wafer. In an embodiment the filling the first opening comprises embedding a laser die within the first opening. In an embodiment the filling the first opening further comprises depositing a seal material around the laser die within the first opening. In an embodiment the filling the first opening further comprises planarizing the laser die with the interconnect structure. In an embodiment the filling the first opening comprises depositing an anti-reflective coating along sidewalls of the first opening. In an embodiment the filling the first opening comprises depositing a fill material, wherein after the depositing the fill material the fill material has a dished surface. In an embodiment the filling the first opening further includes: depositing a dielectric material adjacent to the dished surface; and planarizing the dielectric material with the interconnect structure.

In another embodiment, a method of manufacturing an optical device includes: receiving a first semiconductor device; embedding a laser die within the first semiconductor device; and simultaneously bonding the first semiconductor device and the laser die to a first optical interposer. In an embodiment the method further includes bonding the first optical interposer to a silicon interposer. In an embodiment the method further includes bonding a second semiconductor device and a third semiconductor device to the silicon interposer. In an embodiment the method further includes bonding the first optical interposer to a local silicon interposer. In an embodiment the embedding the laser die includes: placing the laser die within a first opening of the first semiconductor device; depositing a seal material around the laser die; and planarizing the laser die and seal material with the first semiconductor device. In an embodiment the method further includes simultaneously forming contact pads electrically connected to an interconnect of the first semiconductor device and the laser die. In an embodiment the method further includes: forming first optical components on an opposite side of the first optical interposer from the laser die; and forming through vias through the first optical components.

In yet another embodiment, an optical device includes: an optical stack including: a first optical interposer; a memory stack; and a first semiconductor device; and an interposer bonded to the optical stack. In an embodiment the memory stack is located between the first optical interposer and the interposer. In an embodiment the memory stack is located between the first optical interposer and the first semiconductor device. In an embodiment the first semiconductor device is bonded to the interposer. In an embodiment the optical device further includes a wire bond connecting the optical stack to a second substrate, the second substrate on an opposite side of the interposer from the optical stack. In an embodiment the optical device further includes through vias extending through the first semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an optical device, the method comprising:
   forming a first semiconductor device as a part of a first wafer, the first semiconductor device comprising a layer of active devices and an interconnect structure;
   forming a first opening at least partially through the interconnect structure and the layer of active devices of the first semiconductor device;
   embedding a laser die within the first opening such that first conductive contacts of the laser die have surfaces that are coplanar with surfaces of second conductive contacts of the first semiconductor device; and
   bonding the first semiconductor device to an optical interposer while the first semiconductor device remains the part of the first wafer.

2. The method of claim 1, wherein the embedding the laser die comprises bonding the laser die to the first semiconductor device.

3. The method of claim 1, wherein the filling the first opening further comprises depositing a seal material around the laser die within the first opening.

4. The method of claim 3, wherein the filling the first opening further comprises planarizing the laser die with the interconnect structure.

5. The method of claim 1, wherein the filling the first opening comprises depositing an anti-reflective coating along sidewalls of the first opening.

6. The method of claim 5, wherein the filling the first opening comprises depositing a fill material, wherein after the depositing the fill material the fill material has a dished surface.

7. The method of claim 6, wherein the filling the first opening further comprises:
   depositing a dielectric material adjacent to the dished surface; and
   planarizing the dielectric material with the interconnect structure.

8. A method of manufacturing an optical device, the method comprising:
   receiving a first semiconductor device;
   embedding a laser die within the first semiconductor device, wherein the embedding comprises bonding the laser die to an exposed surface of the first semiconductor device; and
   simultaneously bonding the first semiconductor device and the laser die to a first optical interposer.

9. The method of claim 8, further comprising bonding the first optical interposer to a local silicon interposer.

10. The method of claim 8, further comprising:

forming first optical components on an opposite side of the first optical interposer from the laser die; and forming through vias through the first optical components.

11. The method of claim 8, wherein the embedding the laser die bonds the laser die to the first semiconductor device.

12. The method of claim 8, further comprising bonding the first optical interposer to a silicon interposer.

13. The method of claim 12, further comprising bonding a second semiconductor device and a third semiconductor device to the silicon interposer.

14. The method of claim 8, wherein the embedding the laser die comprises:

placing the laser die within a first opening of the first semiconductor device;

depositing a seal material around the laser die; and planarizing the laser die and seal material with the first semiconductor device.

15. The method of claim 14, further comprising simultaneously forming contact pads electrically connected to an interconnect of the first semiconductor device and the laser die.

16. A method of manufacturing an optical device, the method comprising:

embedding a laser die into a first semiconductor device by bonding the laser die to an exposed surface of the first semiconductor device;

bonding a first optical interposer to the first semiconductor device while the first semiconductor device is part of a wafer;

separating the first semiconductor device from a remainder of the wafer to form an optical stack;

bonding the optical stack to an interposer; and bonding a memory device to the interposer.

17. The method of claim 16, wherein the memory device is a memory stack.

18. The method of claim 16, further comprising bonding a second semiconductor die to the interposer.

19. The method of claim 16, wherein the embedding the laser die comprises:

placing the laser die within a first opening of the first semiconductor device;

depositing a seal material around the laser die; and planarizing the laser die and seal material with the first semiconductor device.

20. The method of claim 16, wherein through vias extend through the first optical interposer.

\* \* \* \* \*